US011923029B2

(12) United States Patent
Takada et al.

(10) Patent No.: US 11,923,029 B2
(45) Date of Patent: Mar. 5, 2024

(54) MEMORY SYSTEM

(71) Applicant: Kioxia Corporation, Tokyo (JP)

(72) Inventors: Marie Takada, Yokohama (JP); Masanobu Shirakawa, Chigasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/180,944

(22) Filed: Mar. 9, 2023

(65) Prior Publication Data

US 2023/0223097 A1 Jul. 13, 2023

Related U.S. Application Data

(62) Division of application No. 17/471,539, filed on Sep. 10, 2021, now Pat. No. 11,636,914.

(30) Foreign Application Priority Data

Mar. 22, 2021 (JP) ................................ 2021-047628

(51) Int. Cl.

| | |
|---|---|
| ***G11C 29/42*** | (2006.01) |
| ***G11C 29/12*** | (2006.01) |
| ***G11C 29/18*** | (2006.01) |
| ***G11C 29/44*** | (2006.01) |
| ***G11C 29/50*** | (2006.01) |

(52) U.S. Cl.

CPC .......... *G11C 29/42* (2013.01); *G11C 29/1201* (2013.01); *G11C 29/18* (2013.01); *G11C 29/4401* (2013.01); *G11C 29/50004* (2013.01); *G11C 2029/1202* (2013.01)

(58) Field of Classification Search

CPC ..... G11C 29/42; G11C 29/1201; G11C 29/18; G11C 29/4401; G11C 29/50004

See application file for complete search history.

(56) References Cited

U.S. PATENT DOCUMENTS

| | | | |
|---|---|---|---|
| 10,120,751 B2 | 11/2018 | Khan et al. | |
| 10,133,625 B2 | 11/2018 | Bandic et al. | |
| 2008/0109697 A1 | 5/2008 | Ho | |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2010/0281342 A1 | 11/2010 | Chang | |
| 2011/0284946 A1 | 11/2011 | Kiyotoshi | |
| 2019/0273516 A1 | 9/2019 | Suzuki et al. | |
| 2021/0306003 A1* | 9/2021 | Kim .................. | H03M 13/1134 |

* cited by examiner

*Primary Examiner* — Han Yang

(74) *Attorney, Agent, or Firm* — Oblon, McClelland, Maier & Neustadt, L.L.P.

(57) ABSTRACT

According to one embodiment, a memory system includes: a controller configured to execute an error correction process on first data read from a first area at a first address of a memory device and determine a read level used for reading data at the first address according to a result of the correction process. The controller executes the correction process on first frame data of the first data. When the correction process on the first frame data has failed, the controller executes the correction process on second frame data of the first data. When the correction process on the second frame data has succeeded, the controller determines the read level based on a result of comparison between the second frame data and a result of the correction process on the second frame data.

12 Claims, 36 Drawing Sheets

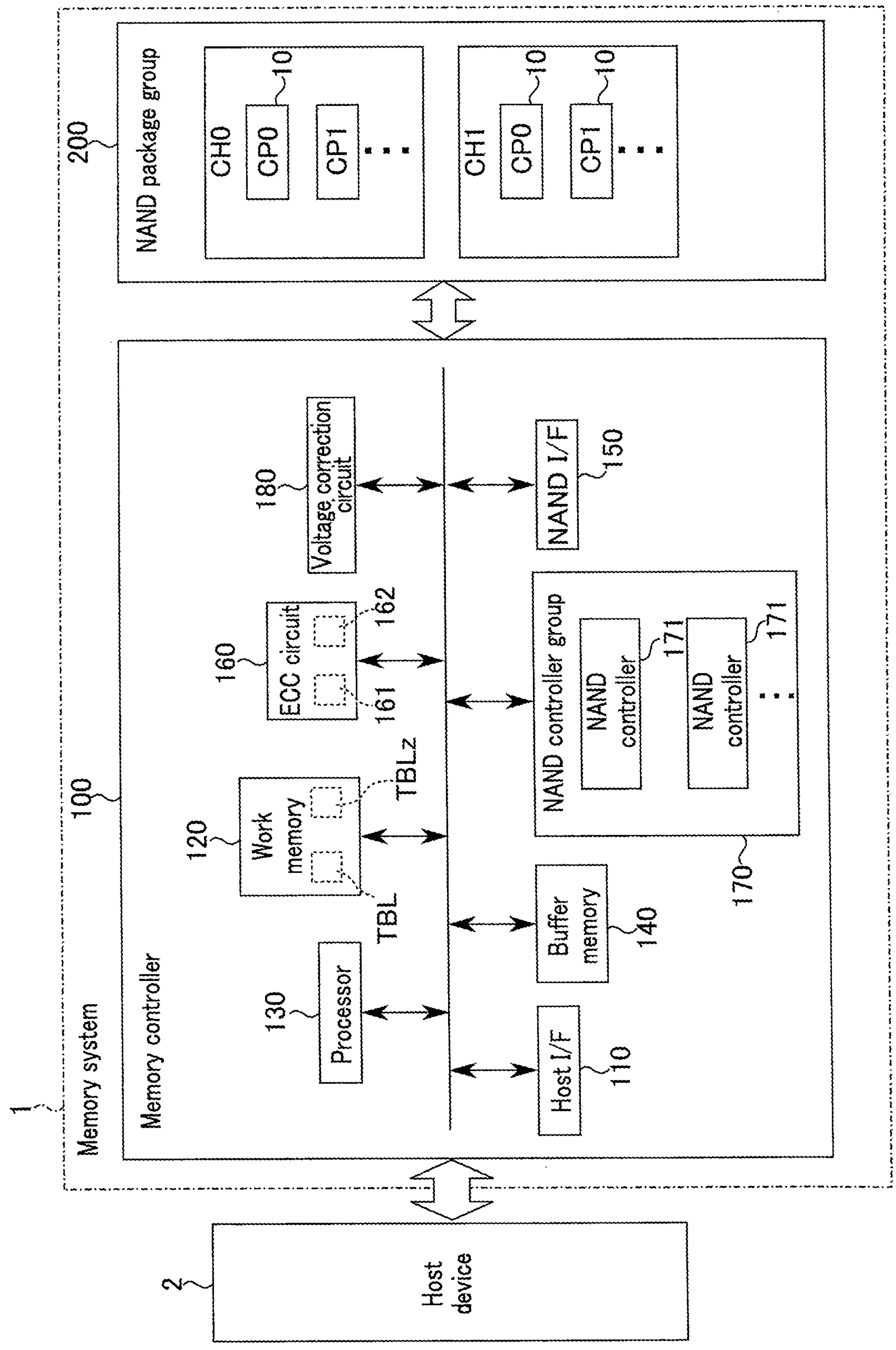
F I G 1

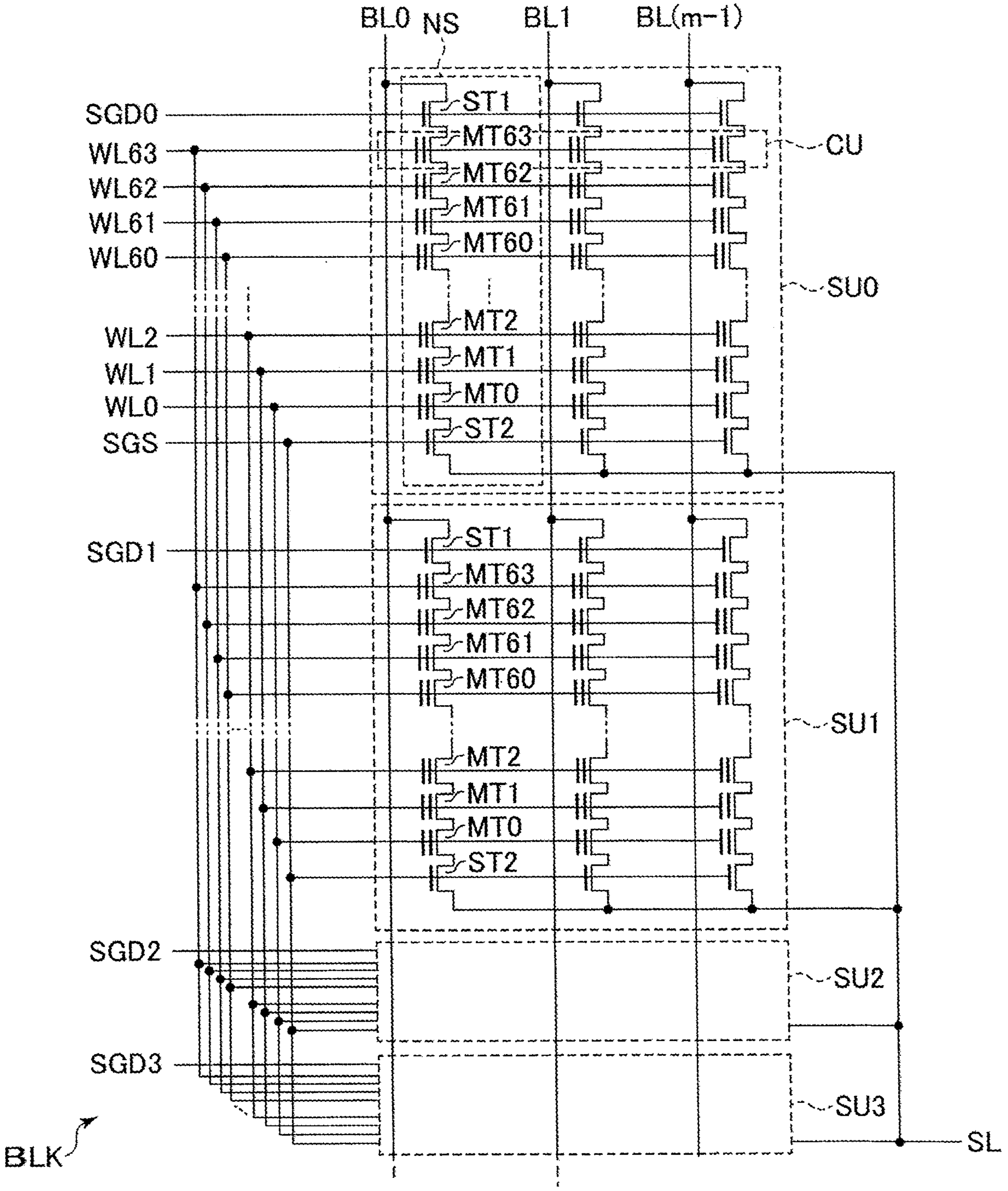
F I G. 4

TBL

| CH | CP | BLK | WL | SU | Shift amount (DAC value) | | | | | |
|---|---|---|---|---|---|---|---|---|---|---|
| | | | | | AR | BR | CR | ⋯ | FR | GR |
| 0 | 0 | 0 | 0 | 0 | +8 | +2 | −7 | ⋯ | +5 | −1 |
| | | | | 1 | +7 | +1 | −6 | ⋯ | +2 | +2 |
| | | | | 2 | +5 | −1 | −8 | ⋯ | +3 | +2 |
| | | | | 3 | +8 | +2 | −5 | ⋯ | +5 | +1 |
| | | | 1 | 0 | +7 | +2 | −6 | ⋯ | +4 | 0 |
| | | | | 1 | +6 | +3 | −3 | ⋯ | +3 | +2 |
| | | | | 2 | +8 | +2 | −5 | ⋯ | +1 | −1 |
| | | | | 3 | +5 | −1 | −4 | ⋯ | +1 | +1 |
| | | | ⋮ | ⋮ | ⋮ | ⋮ | ⋮ | ⋮ | ⋮ | ⋮ |
| | | 1 | 0 | 0 | +6 | +5 | 0 | ⋯ | +2 | +8 |
| | | | | ⋮ | ⋮ | ⋮ | ⋮ | ⋮ | ⋮ | ⋮ |
| | | | ⋮ | ⋮ | ⋮ | ⋮ | ⋮ | ⋮ | ⋮ | ⋮ |
| | | ⋮ | ⋮ | ⋮ | ⋮ | ⋮ | ⋮ | ⋮ | ⋮ | ⋮ |
| | 1 | 0 | 0 | 0 | 00 | 00 | 00 | ⋯ | 00 | 00 |
| | ⋮ | ⋮ | ⋮ | ⋮ | ⋮ | ⋮ | ⋮ | ⋮ | ⋮ | ⋮ |
| 1 | 0 | 0 | 0 | 0 | +1 | −3 | −1 | ⋯ | −5 | +2 |
| | ⋮ | ⋮ | | ⋮ | ⋮ | ⋮ | ⋮ | ⋮ | ⋮ | ⋮ |
| ⋮ | ⋮ | ⋮ | ⋮ | ⋮ | ⋮ | ⋮ | ⋮ | ⋮ | ⋮ | ⋮ |

FIG. 9

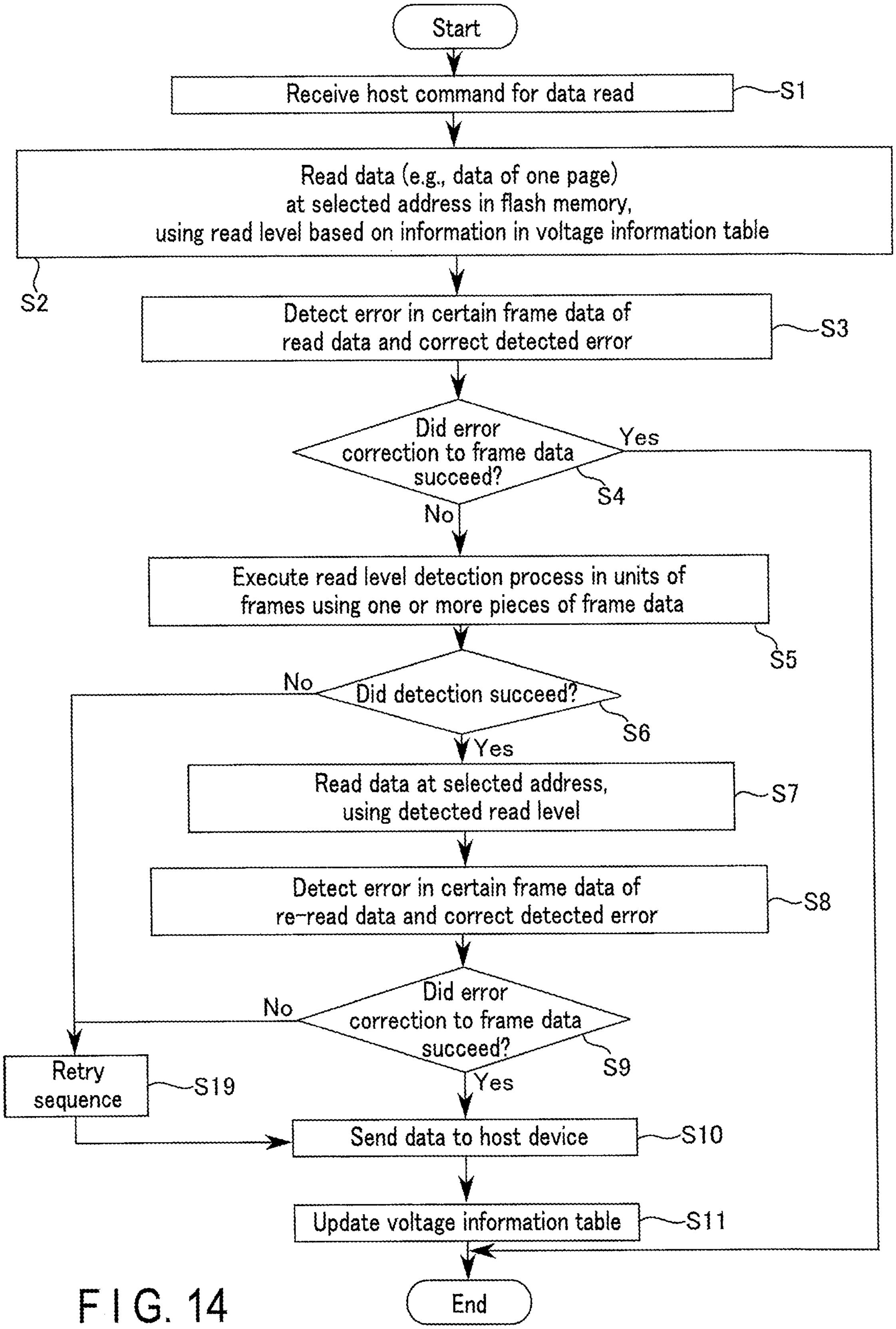
F I G. 14

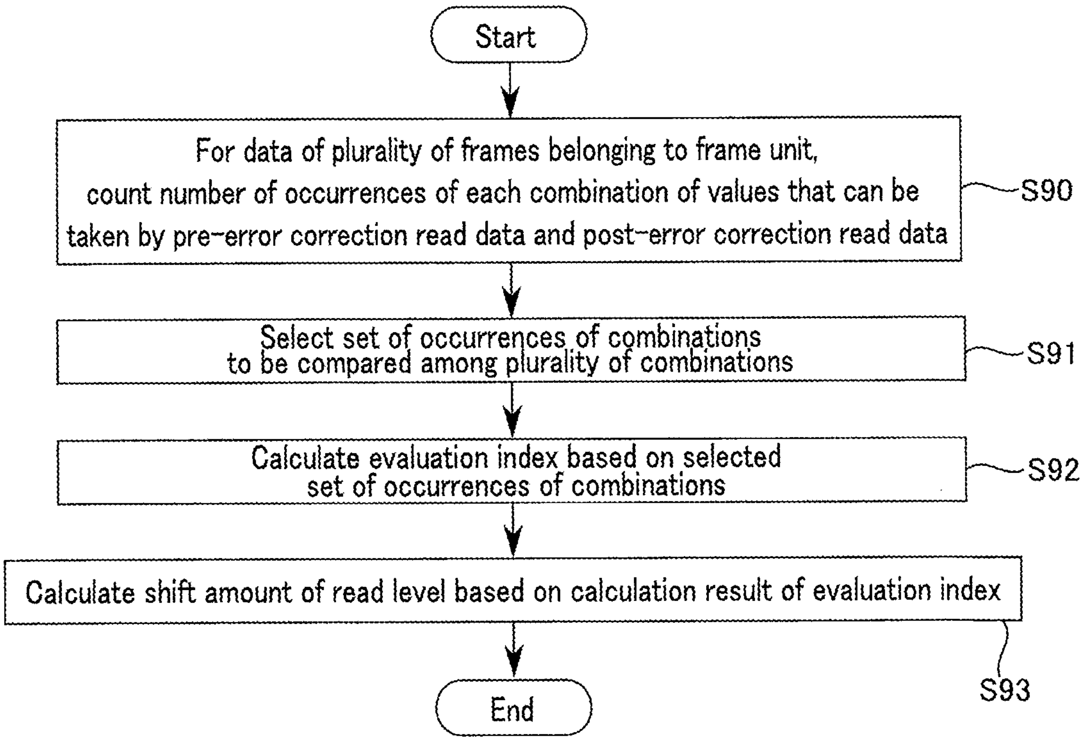
F I G. 23

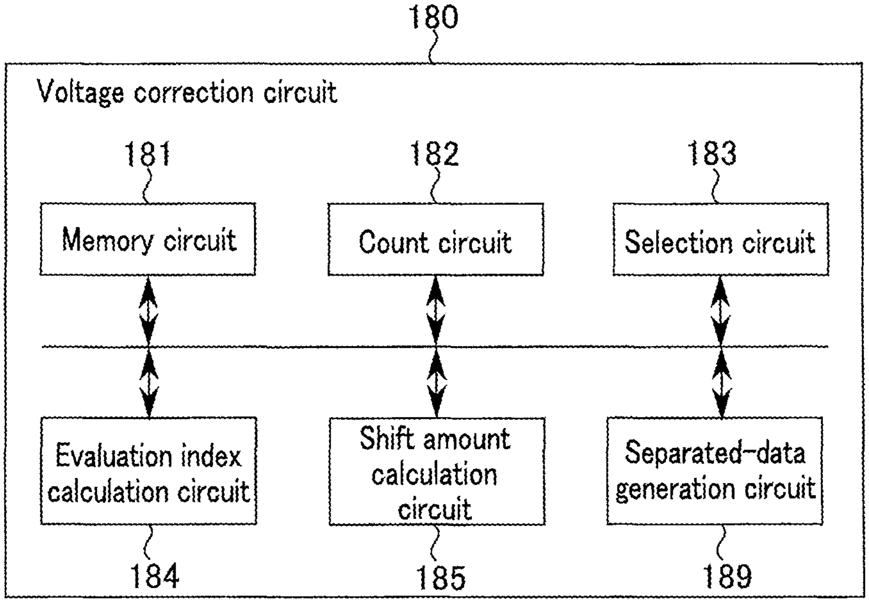
F I G. 25
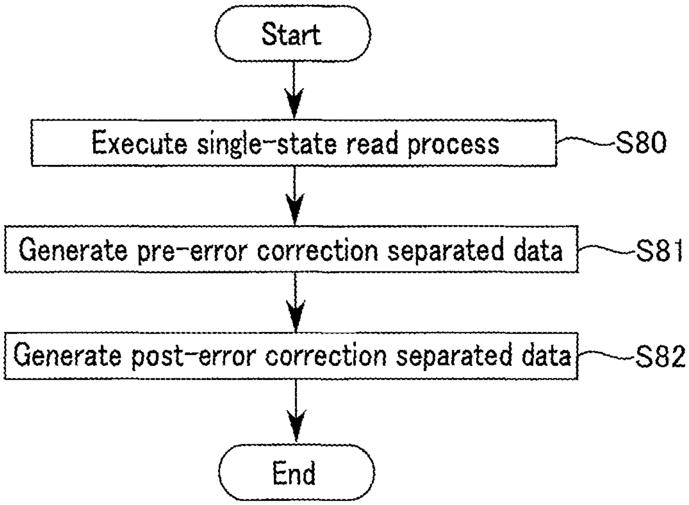
F I G. 26

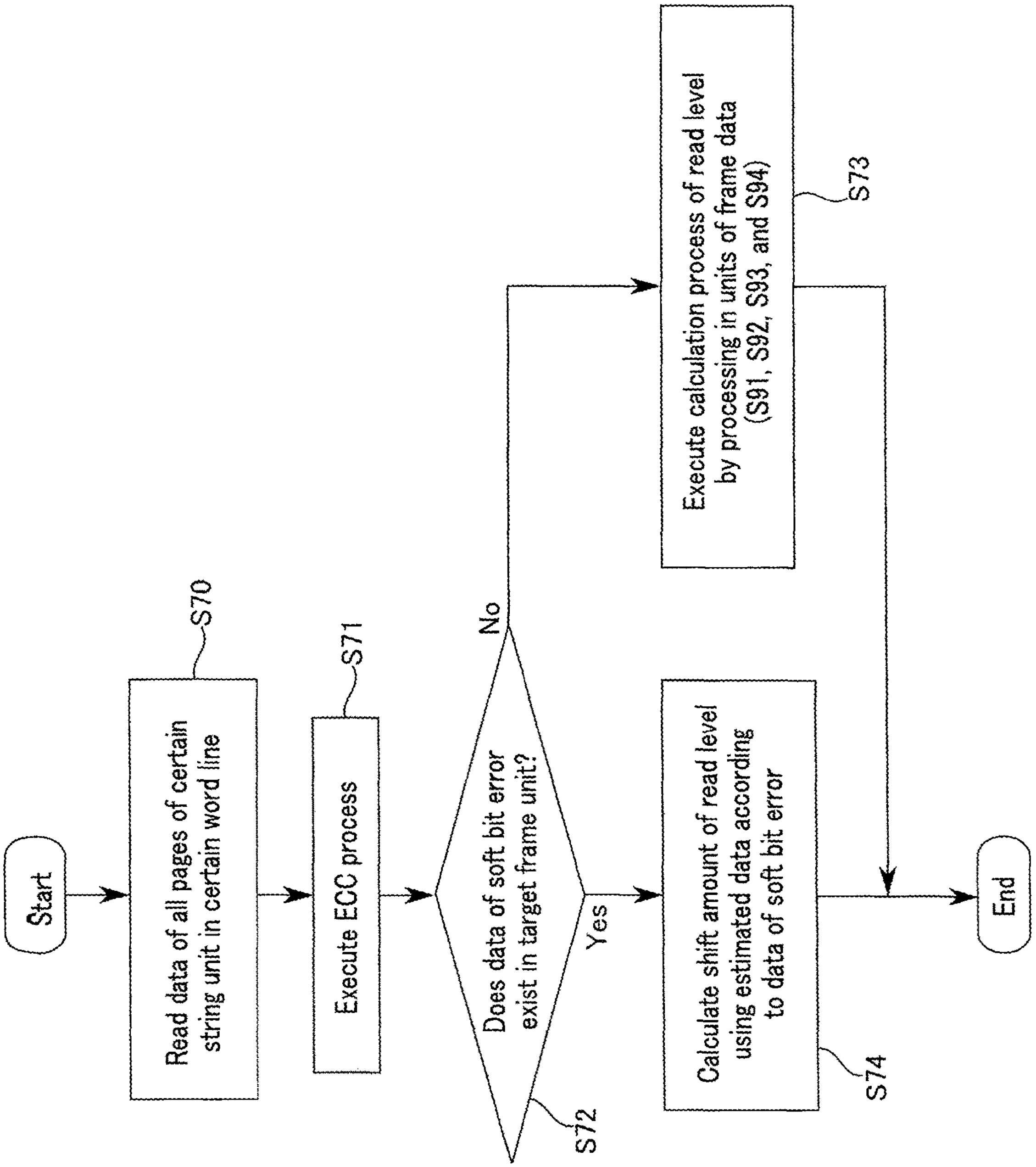
F I G. 35

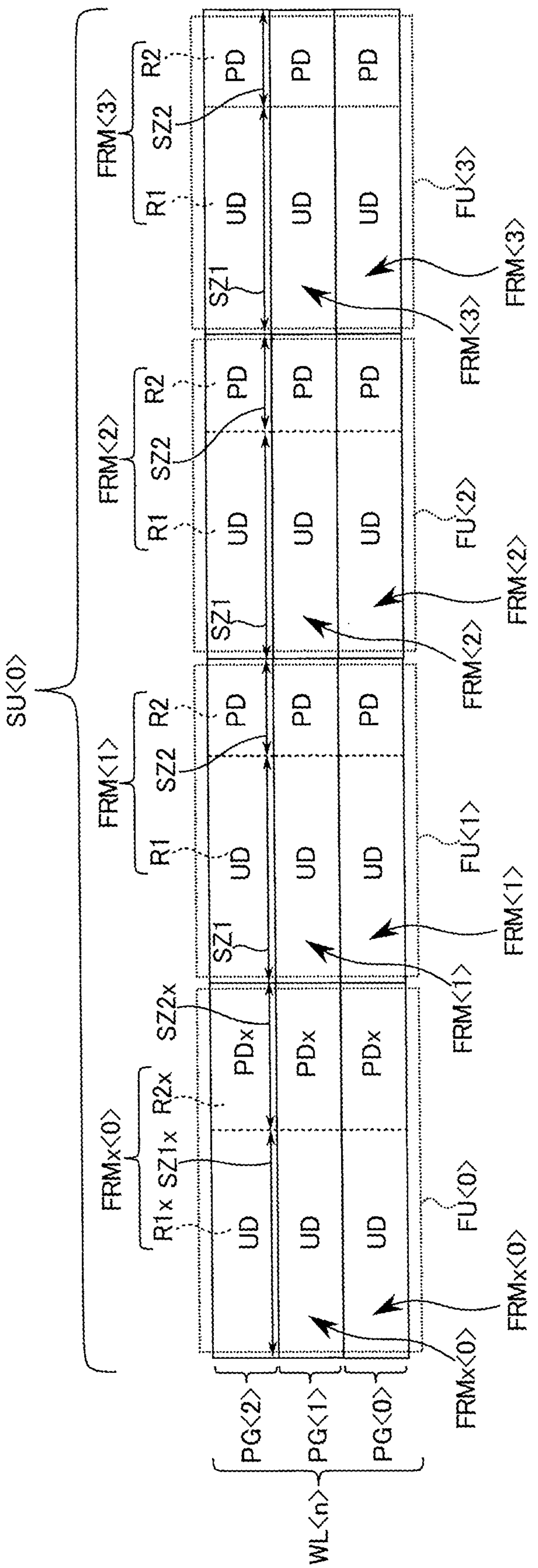
F I G. 37

MEMORY SYSTEM

CROSS-REFERENCE TO RELATED APPLICATIONS

This application is a divisional application of U.S. application Ser. No. 17/471,539, filed Sep. 10, 2021, which is based upon and claims the benefit of priority from Japanese Patent Application No. 2021-047628, filed Mar. 22, 2021, the entire contents of which are incorporated herein by reference.

FIELD

Embodiments described herein relate generally to a memory system.

BACKGROUND

There is a known memory system including a NAND flash memory as a memory device and a memory controller that controls the memory device.

BRIEF DESCRIPTION OF THE DRAWINGS

FIGS. 1 and 2 are schematic diagrams illustrating a configuration example of a memory system according to a first embodiment;

FIGS. 3 and 4 are schematic diagrams illustrating a configuration example of a non-volatile memory device;

FIG. 9 is a schematic diagram illustrating an example of a management table of the memory system according to the first embodiment;

FIGS. 14 and 15 are flowcharts illustrating an operation example of the memory system according to the first embodiment;

FIG. 23 is a flowchart illustrating an operation example of the memory system according to the first embodiment;

FIG. 25 is a schematic diagram illustrating a configuration example of a memory system according to the second embodiment;

FIG. 26 is a flowchart illustrating an operation example of the memory system according to the second embodiment;

FIG. 35 is a flowchart illustrating an operation example of the memory system according to the fifth embodiment;

FIG. 37 is a schematic diagram illustrating a modification of the memory system according to the embodiment.

DETAILED DESCRIPTION

Figure 2:
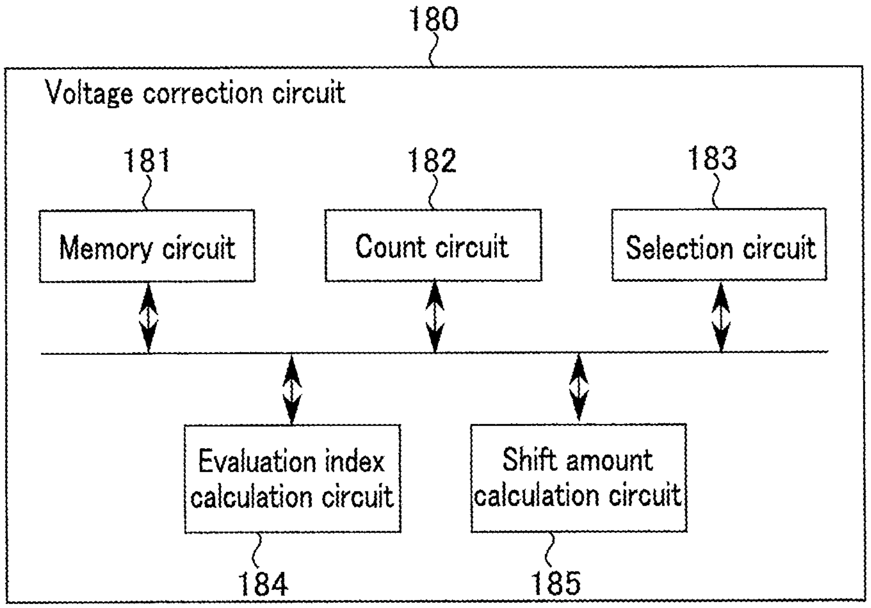

Memory systems according to embodiments will be described with reference to FIGS. 1 to 37.

Hereinafter, the embodiments will be described in detail with reference to the drawings. In the following descriptions, the elements with identical functions and configurations will be given identical reference signs.

Further, in each of the following embodiments, the components (for example, circuits, interconnects, various voltages, and signals) with reference signs ending in numbers/alphabetical letters for distinction may be described with reference signs without the final numbers or alphabetical letters when they are not required to be distinguished from one another.

In general, according to one embodiment, a memory system includes: a non-volatile memory device; and a controller configured to execute an error correction process on first data read from a first area at a first address of the non-volatile memory device and determine a read level used for reading data at the first address according to a result of the correction process, wherein the controller is configured to execute the correction process on first frame data of the first data, when the correction process on the first frame data has failed, execute the correction process on second frame data of the first data, and when the correction process on the second frame data has succeeded, determine the read level based on a result of comparison between the second frame data and a result of the correction process on the second frame data.

EMBODIMENTS

(1) First Embodiment

A memory system and a control method thereof according to a first embodiment will be described with reference to FIGS. 1 to 23.

(a-1) Memory System

A configuration example of the memory system according to the first embodiment will be described with reference to FIG. 1.

As illustrated in FIG. 1, the memory system 1 includes a memory controller 100 and a NAND package group 200. The memory controller 100 and the NAND package group 200 may constitute one storage device by, for example, a combination thereof. For example, a memory card such as an SD (trademark) card, a solid state drive (SSD), or the like can be provided as the storage device.

The memory controller 100 is connected to a host device 2 by a host bus.

The host device 2 is, for example, a digital camera, a personal computer, a smartphone, a feature phone, a game device, an unmanned aerial vehicle, a server, or the like.

The host bus is a bus conforming to, for example, SD (trademark) Interface, Serial attached small computer system interface (Serial attached SCSI (SAS)), Serial advanced technology attachment (Serial ATA (SATA)), Peripheral component interconnect express (PCIe), or Non-volatile memory express (NVMe). The memory controller 100 may be connected to the host device 2 by wireless communication.

The memory controller 100 controls the NAND package group 200. The memory controller 100 accesses the NAND package group 200 in response to a command (hereinafter, referred to as a host command) received from the host device 2.

The memory controller 100 is connected to the NAND package group 200 by a data transfer system bus under a certain standard (or specification).

The NAND package group 200 is a semiconductor memory device (for example, a non-volatile semiconductor memory device). The NAND package group 200 includes a plurality of channels CH (CH0, CH1, . . . ). The plurality of channels CH is individually connected to the memory controller 100 by corresponding buses. Any number of channels in the NAND package group 200 is applicable.

Each of the plurality of channels CH includes a plurality of chips CP (CP0, CP1, . . . ). Each of the plurality of chips CP has the function of NAND flash memory (non-volatile semiconductor memory device) 10, for example. Any number of chips in the channel CH is applicable. This configuration is similar in other channels CH (not illustrated). The configuration of the NAND flash memory 10 (chip CP) will be described later.

In the following description, the NAND flash memory 10 may be referred to as flash memory 10 for simplification.

(a-2) Configuration of Memory Controller

A configuration of the memory controller 100 will be described in detail with reference to FIGS. 1 and 2.

The memory controller (also simply referred to as controller) 100 includes a host interface circuit 110, a work memory 120, a processor (CPU) 130, a buffer memory 140, a NAND interface circuit 150, an error check and correction circuit 160, a NAND controller group 170, a voltage correction circuit 180, and the like.

These components 110 to 180 are connected to an internal bus in the memory controller 100. These components 110 to 180 can mutually send and receive various signals and various data via an internal bus.

The memory controller 100 is, for example, a system on a chip (SoC). The functions of the components 110 to 170 of the memory controller 100 described below can be implemented by hardware or a combination of hardware and firmware (software). The voltage correction circuit 180 can be realized by a hardware configuration that can function independently of firmware unless otherwise described.

The host interface circuit 110 is connected to the host device 2 via a host bus. The host interface circuit 110 transfers a command and data received from the host device 2 to the processor 130 and the buffer memory 140, respectively. The host interface circuit 110 transfers the data in the buffer memory 140 to the host device 2 in response to a command from the processor 130.

The work memory (for example, RAM) 120 is used as a work area of the processor 130. The work memory 120 holds firmware for managing the NAND package group 200 and various tables TBLa and TBLb such as a voltage information table described later. The work memory 120 is, for example, a memory device (for example, a volatile semiconductor memory device) such as a DRAM or an SRAM.

The processor 130 controls the entire operation of the memory controller 100. The processor 130 issues, to the flash memories 10, a command for instructing an operation to be executed (hereinafter, referred to as a controller command).

For example, when receiving a write command from the host device 2, the processor 130 controls the NAND controller group 170 in response to the write command, and causes the NAND controller group 170 to issue the write command. When receiving a read command from the host device 2, the processor 130 controls the NAND controller group 170 in response to the read command, and causes the NAND controller group 170 to issue the read command. Hereinafter, the read processing under the instruction from the host device 2 is also referred to as host read processing. The processor 130 issues an erase command and controls the NAND controller group 170 based on the erase command.

The processor 130 can control the NAND controller group 170 to execute various internal processes for managing the NAND package group 200 without depending on a command from the host device 2. For example, the processor 130 can cause the NAND controller group 170 and the NAND package group 200 to execute internal processes in the memory system 1.

The buffer memory 140 temporarily holds write data, read data, and read data subjected to error correction by the error check and correction circuit 160.

The NAND interface circuit 150 is connected to the NAND package group 200 via a NAND bus. The NAND interface circuit 150 controls communication between the NAND controller group 170 and the NAND package group 200. Based on a command from the processor 130, the NAND interface circuit 150 sends various signals based on a NAND interface described later to the NAND package group 200 and receives various signals from the NAND package group 200 based on the NAND interface.

The error check and correction circuit 160 performs an error detection process and an error correction process for data stored in the NAND package group 200. The error check and correction circuit 160 includes an encoding circuit 161 and a decoding circuit 162.

At the time of data writing, the error check and correction circuit 160 generates an error correction code by the encoding circuit 161 and gives the generated error correction code to the write data. At the time of data reading, the error check and correction circuit 160 decodes the error correction code by the decoding circuit 162 and detects the presence or absence of an error bit. When the error bit is detected from the read data, the error check and correction circuit 160 specifies the position of the error bit and corrects the specified error.

Hereinafter, such detection and correction of an error in data executed by the error check and correction circuit 160 is referred to as ECC process.

The error correction method includes, for example, hard bit decoding and soft bit decoding. As a hard bit decoding code used for hard bit decoding, for example, a Reed-Solomon (RS) code, a Bose-Chaudhuri-Hocquenghem (BCH) code, or the like can be used. As a soft bit decoding code used for soft bit decoding, for example, a Low Density Parity Check (LDPC) code or the like can be used.

For example, the decoding circuit 162 includes a hard bit decoding unit that performs hard bit decoding and a soft bit decoding unit that performs soft bit decoding.

The NAND controller group 170 generates a command, an address, and the like to be transmitted to and received from the NAND package group 200 based on an instruction from the processor 130. In response to a data read command from the host device 2, for example, the NAND controller group 170 issues a read command based on the NAND interface to the NAND package group 200.

Regardless of a command from the host device 2, for example, the NAND controller group 170 can issue a read command based on the NAND interface to the NAND package group 200.

The NAND controller group 170 includes a plurality of NAND controllers 171. The NAND controllers 171 are provided corresponding to the channels (memory packages) CH0 and CH1 in the NAND package group 200.

The NAND controllers 171 are configured to control communication with the corresponding channels CH0 and CH1.

The voltage correction circuit (also referred to as a read level detection circuit) 180 is configured to calculate voltage values of a plurality of voltages and shift amounts (correction amounts) thereof used for the NAND flash memories 10 in the NAND package group 200. In the present embodiment, the voltage correction circuit 180 can calculate voltage values (and voltage shift amounts) of various voltages (for example, read levels to be described later) used for the read operation.

The voltage correction circuit 180 receives, for example, read data (hereinafter, referred to as pre-error correction read data) from the NAND package group 200. The voltage correction circuit 180 receives post-error correction read data from the error check and correction circuit 160. The post-error correction read data is data obtained by the error check and correction circuit 160 performing the error correction processing on the read data (pre-error correction read data).

For example, based on the pre-error correction read data and the post-error correction read data, the voltage correction circuit 180 calculates various voltage values (and shift amounts of the voltage values) used for the read operation.

The voltage correction circuit 180 transfers values indicating the calculation results to the work memory 120. The values indicating the calculation results are held in the work memory 120 as voltage information.

In the present embodiment, the voltage correction circuit 180 can calculate the shift amount of the read level. The read level is a voltage value for determining the magnitude of the threshold voltage of the memory cell MT at the time of data reading.

FIG. 2 is a block diagram for describing an internal configuration of the voltage correction circuit 180 of the memory controller 100 in the memory system of the present embodiment.

As illustrated in FIG. 2, the voltage correction circuit 180 includes a memory circuit 181, a count circuit 182, a selection circuit 183, an evaluation index calculation circuit 184, a shift amount calculation circuit 185, and the like.

The memory circuit 181 temporarily holds the pre-error correction read data and the post-error correction read data.

The count circuit 182 counts the number of bits for each combination of possible values of the pre-error correction read data and the post-error correction read data. For one memory cell, there are four combinations of values that can be taken by the set of (pre-error correction read data and post-error correction read data): (1, 1), (1, 0), (0, 1), and (0, 0). The count circuit 182 counts the number of bits of each combination existing in the read data of a certain data size.

The selection circuit 183 selects one or more combinations (for example, (1, 0) and (0, 1)) to be used for calculation of the shift amount of the read level, from among the four combinations counted by the count circuit 182.

The evaluation index calculation circuit 184 calculates an evaluation index to be used for the calculation of the shift amount of the read level, based on the count value of the combination selected by the selection circuit 183.

The shift amount calculation circuit 185 calculates the shift amount of the read level based on the calculated evaluation index. The shift amount calculation circuit 185 changes the value in the voltage information table TBL to the value indicating the calculated shift amount. Accordingly, the value in the voltage information table TBL is updated.

The configuration in the voltage correction circuit 180 (for example, the selection circuit 183, the evaluation index calculation circuit 184, and the shift amount calculation circuit 185) may be implemented by firmware (programs).

The memory controller 100 uses the voltage correction circuit 180 to execute various processes for correcting various voltages used for the read operation of the flash memories 10. The information in the voltage information table TBL is set by various processes performed by the voltage correction circuit 180. The memory controller 100 refers to the voltage information table TBL and determines the read level used for the address of the target to be read.

With the above configuration, the memory controller 100 instructs the NAND package group 200 (NAND flash memories 10) to perform a write operation, a read operation, an erase operation, a patrol operation, and the like. The patrol operation is an operation executed on the flash memories 10 in a certain cycle without an instruction from the host device 2. The patrol operation includes at least a read operation and an ECC process.

(a-3) Configuration of NAND Flash Memory

Figure 3:
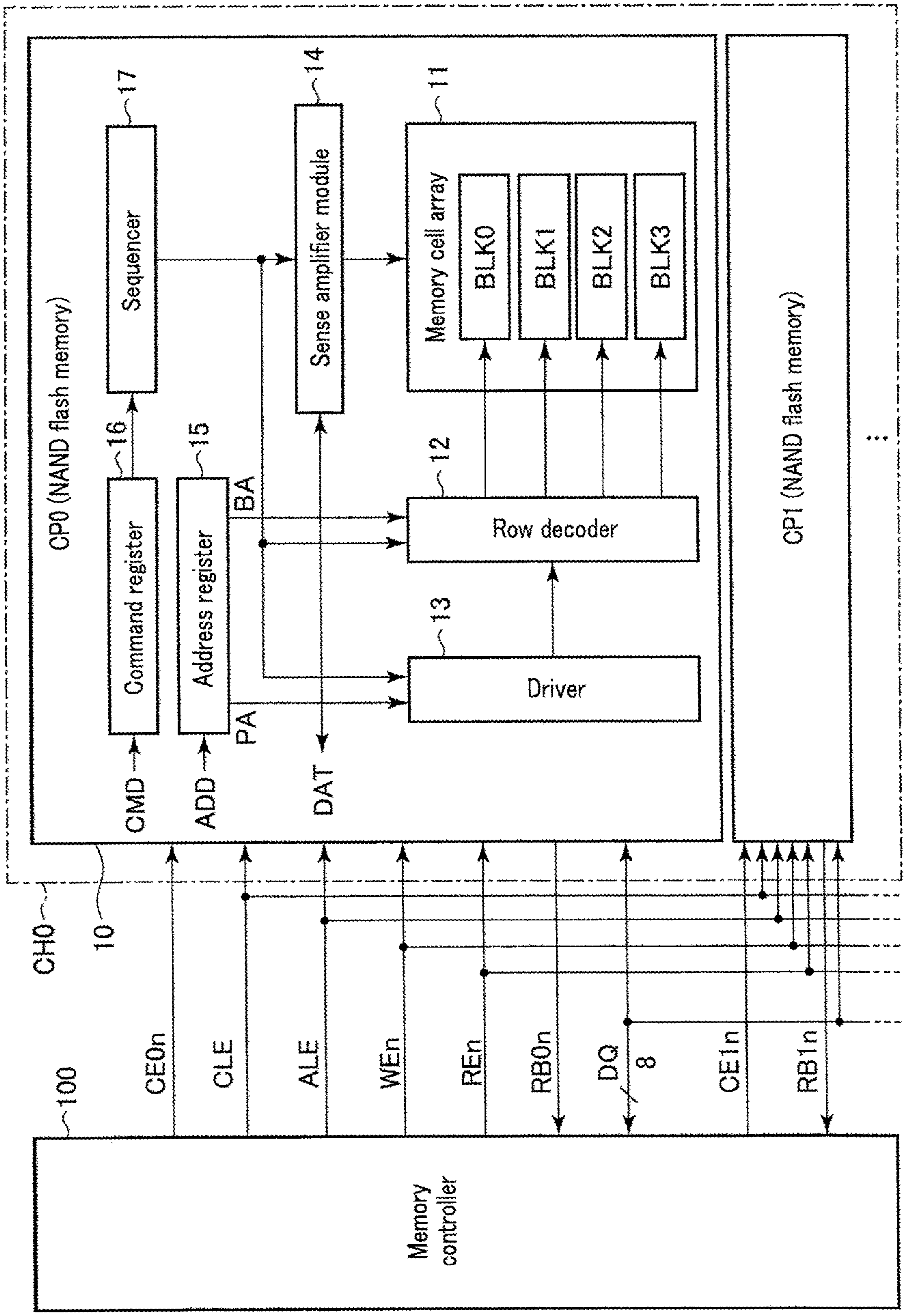

A configuration of the NAND flash memory (hereinafter, also referred to simply as a flash memory) will be described with reference to FIGS. 3 to 5. FIG. 3 illustrates a connection relationship between the memory controller 100 and the channel CH0 and a configuration of one chip CP0 in the channel CH0 as an example.

The connection relationship between the memory controller 100 and the channel CH0 will be described. The connection relationship between the memory controller 100 and the other channel CH1 and the like is substantially the same as the connection relationship between the memory controller 100 and the channel CH0, and thus description thereof is omitted.

As illustrated in FIG. 3, each chip 10 in the channel CH0 is connected to the memory controller 100 via a NAND bus. Each chip CP sends and receives a signal based on the NAND interface.

Specific examples of a signal of the NAND interface are a chip enable signal CEn (CE0*n*, CE1*n*, . . . ), an address latch enable signal ALE, a command latch enable signal CLE, a write enable signal WEn, a read enable signal REn, a ready/busy signal RBn (RB0*n*, RB1*n*, . . . ), and an input/output signal DQ.

The signals CE0*n*, CE1*n*, . . . are individually input to the corresponding chips 10-0, 10-1, . . . . The signals RBn0, RBn1, . . . are individually output from the corresponding chips 10. The signals ALE, CLE, WEn, REn, and DQ are input in common to the chips CP in the same channel CH0.

The signals CE0*n*, CE1*n*, . . . are signals for enabling the corresponding chips 10-0, 10-1, . . . . The signal CLE is a signal for notifying the chips CP that the input signal DQ to the chips CP is a command. The signal ALE is a signal for notifying the chips 10 that the input signal DQ to the chips 10 is an address. The signal WEn is a signal for causing the chips 10 to take in the input signal DQ. The signal REn is a signal for reading the output signal DQ from the chips CP. The ready/busy signals RB0*n*, RB1*n*, . . . are signals indicating whether the corresponding chips 10-0, 10-1, . . . are in a ready state (a state in which a command from the memory controller 100 can be received) or a busy state (a state in which a command from the memory controller 100 cannot be received). When the chips 10 are in the busy state, the signal level of the ready/busy signal RB is set to "L" level.

The input/output signal DQ is, for example, an 8-bit signal set. The input/output signal DQ is data transmitted and received between each chip 10 and the memory controller 100. The input/output signal DQ includes a command CMD, an address ADD, write data, and read data.

Accordingly, the memory controller 100 can communicate with any one chip (NAND flash memory) 10 in each channel CH in parallel with and independently of the other channels CH.

<Internal Configuration of NAND Flash Memory>

An internal configuration of each NAND flash memory 10 will be described. A configuration of each NAND flash memory 10 in the other chip CP1 is substantially the same as the configuration of each NAND flash memory in the chip CP0, and thus the description thereof will be omitted.

As illustrated in FIG. 3, each NAND flash memory 10 includes a memory cell array 11, a row decoder 12, a driver 13, a sense amplifier module 14, an address register 15, a command register 16, a sequencer 17, and the like.

The memory cell array 11 stores data from the memory controller 100. The memory cell array 11 includes a plurality of blocks BLK. Each block BLK includes a plurality of memory cells associated with a row and a column. In the example of FIG. 2, four blocks BLK0 to BLK3 are illustrated.

The row decoder 12 selects any one of the blocks BLK0 to BLK3 based on a block address BA in the address register 15. The row decoder 12 selects one of a plurality of word lines in the selected block BLK.

The driver 13 supplies a voltage to the selected block BLK via the row decoder 12 based on a page address PA in the address register 15.

The sense amplifier module 14 senses a signal corresponding to a threshold voltage of a memory cell in the memory cell array 11 at the time of data reading. Accordingly, the sense amplifier module 14 reads data. The sense amplifier module 14 outputs read data DAT to the memory controller 100. At the time of data writing, the sense amplifier module 14 transfers write data DAT from the memory controller 100 to the memory cell array 11.

The address register 15 holds an address ADD from the memory controller 100. The address ADD includes the block address BA and the page address PA described above.

The command register 16 holds a command CMD received from the memory controller 100.

The sequencer 17 controls the entire operation of the chip CP0 based on the command CMD held in the command register 16.

<Configuration of Block>

A configuration of each block BLK of the memory cell array in the NAND flash memory will be described with reference to FIG. 4. FIG. 4 is a diagram illustrating a circuit configuration of any block BLK among a plurality of blocks in the memory cell array.

As illustrated in FIG. 4, the block BLK includes a plurality of (for example, four) string units SU (SU0 to SU3). Each of the string units SU includes a plurality of NAND strings NS. The number of blocks in the memory cell array 11, the number of string units in each block BLK, and the number of NAND strings in each string unit SU are arbitrary.

Each of the NAND strings NS includes a plurality of (for example, 64) memory cells MT (MT0 to MT63) and select transistors ST1 and ST2. The memory cells MT are connected in series between the source of the select transistor ST1 and the drain of the select transistor ST2.

The memory cells MT hold data in a non-volatile manner. The memory cells (also referred to as memory cell transistors) MT are field effect transistors having a control gate and a charge storage layer.

The gates of the select transistors ST1 in the string units SU0 to SU3 are connected to corresponding select gate lines SGD0 to SGD3, respectively. On the other hand, the gates of the select transistors ST2 in the string units SU0 to SU3 are connected in common to, for example, a select gate line SGS. The gates of the select transistors ST2 in the string units SU0 to SU3 may be connected to different select gate lines.

The control gates of the memory cells MT0 to MT63 belonging to the same block BLK are connected to corresponding word lines WL0 to WL63, respectively.

The drains of the select transistors ST1 in the NAND strings NS belonging to the same column in the memory cell array 11 are connected to bit lines BL (BL0 to BL (m−1), where m is a natural number of 2 or larger). Each bit line BL connects in common the NAND strings NS belonging to the same column among the plurality of blocks BLK. The sources of the plurality of select transistors ST2 are connected in common to a source line SL.

Each string unit SU is an aggregate of NAND strings NS connected to different bit lines BL and connected to the same select gate line SGD. Hereinafter, in each string unit SU, a set of memory cells MT (memory cell group) connected in common to the same word line WL will also be referred to as a cell unit CU (or a memory group). Each block BLK is an aggregate of a plurality of string units SU sharing the word lines WL. Each memory cell array 11 is an aggregate of a plurality of blocks BLK sharing the bit lines BL.

Figure 5:
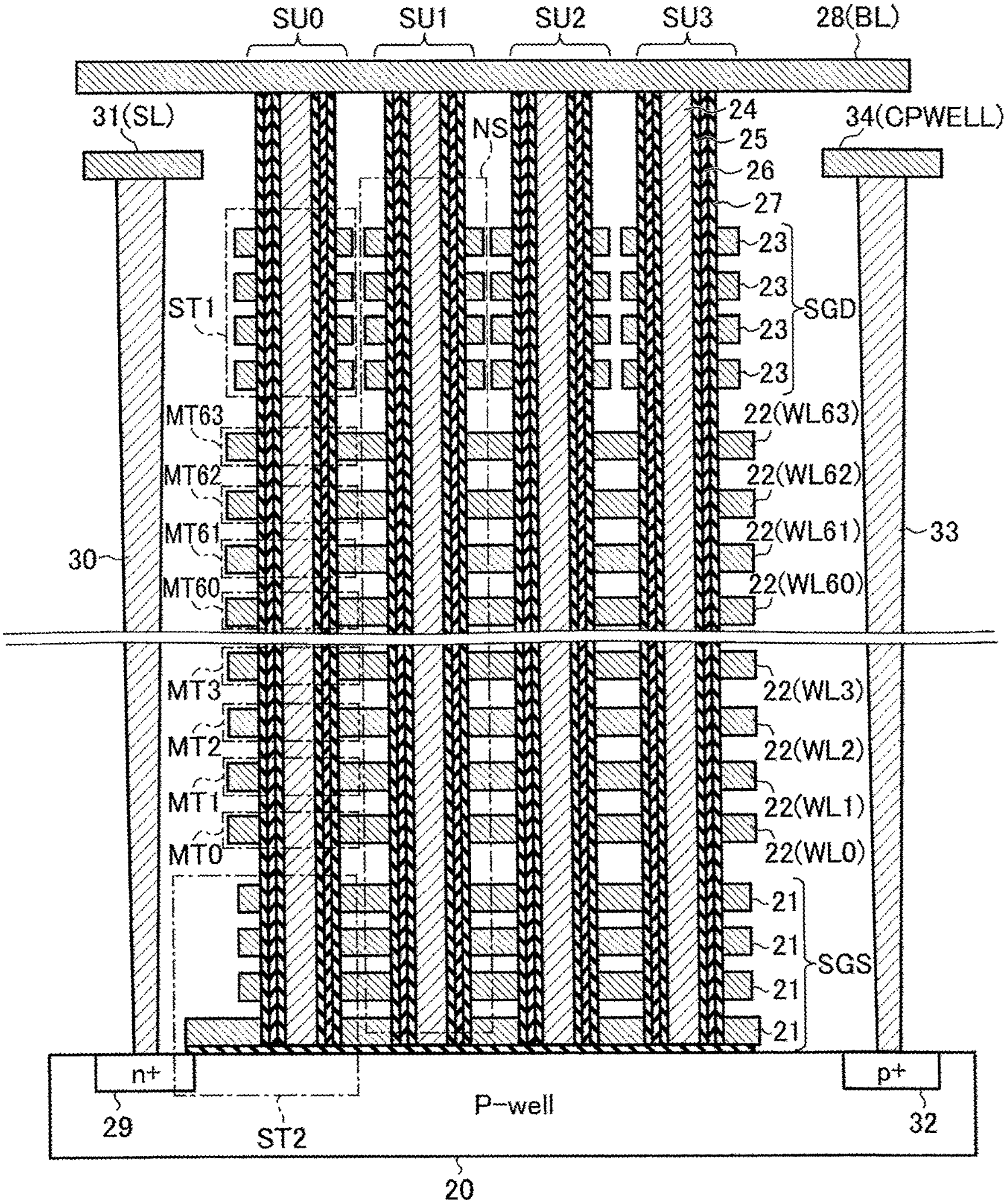
FIG. 5 is a schematic diagram illustrating an exemplary structure of the non-volatile memory device.

FIG. 5 is a cross-sectional view of a partial region of a block BLK. As illustrated in FIG. 5, a plurality of NAND strings NS is formed on a p-type well region 20. Sequentially stacked on the p-type well region 20 are a plurality of (for example, four) conductive layers 21 functioning as select gate lines SGS, a plurality of (for example, 64) conductive layers 22 functioning as word lines WL0 to WL63, and a plurality of (for example, four) conductive layers 23 functioning as select gate lines SGD. An insulating layer (not illustrated) is provided between the stacked conductive layers.

Pillars 24 are provided in a layer stack including the conductive layers 23, 22, 21. The pillars 24 pass through the conductive layers 23, 22, and 21 and reach the p-type well region 20. The pillars 24 include semiconductors (semiconductor layers). Sequentially formed on the side surface of each pillar 24 are a gate insulating film 25, a charge storage layer (insulating film or conductive film) 26, and a block insulating film 27.

Accordingly, the memory cells MT and the select transistors ST1 and T2 are provided at positions where the pillars 24 face the layers 21 to 23.

The pillars 24 function as current paths of the NAND strings NS. The pillars 24 constitute regions in which channels of the transistors are formed. The upper ends of the pillars 24 are connected to a metal interconnect (metal layer) 28 functioning as a bit line BL.

An $n^+$-type impurity diffusion layer 29 is provided in the front surface of the p-type well region 20. A contact plug 30 is provided on the $n^+$-type impurity diffusion layer 29. The contact plug 30 is connected to a metal interconnect (metal layer) 31 functioning as a source line SL. A $p^+$-type impurity diffusion layer 32 is provided in the front surface of the p-type well region 20. A contact plug 33 is provided on the $p^+$-type impurity diffusion layer 32. The contact plug 33 is connected to a metal interconnect (metal layer) 34 functioning as well interconnect CPWELL. The well interconnect CPWELL is an interconnect for applying a potential to the pillars 24 via the p-type well region 20.

A plurality of the above structures is arranged in the depth direction (or the forward direction) of the paper surface on which FIG. 5 is described. A set of NAND strings NS arranged in the depth direction constitutes a string unit SU.

The configuration of the memory cell array 11 may be another configuration. For example, another configuration of the memory cell array 11 is described in U.S. patent application Ser. No. 12/407,403 entitled "THREE DIMENSIONAL STACKED NONVOLATILE SEMICONDUCTOR MEMORY" filed on Mar. 19, 2009. Other configurations of the memory cell array 11 are described in U.S. patent application Ser. No. 12/406,524 entitled "THREE DIMENSIONAL STACKED NONVOLATILE SEMICONDUCTOR MEMORY" filed on Mar. 18, 2009, U.S. patent application Ser. No. 12/679,991 entitled "NONVOLATILE SEMICONDUCTOR STORAGE DEVICE AND METHOD OF MANUFACTURING THE SAME" filed on Mar. 25, 2010, and U.S. patent application Ser. No. 12/532,030 entitled "SEMICONDUCTOR MEMORY AND METHOD FOR MANUFACTURING SAME" filed on Mar. 23, 2009. These patent applications are entirely incorporated herein by reference.

The relationship between the data stored in the memory cells MT and the threshold voltage distribution of the memory cells MT will be described with reference to FIG. 6.

In this example, one memory cell MT can hold, for example, 3-bit data. Hereinafter, the 3-bit data will be referred to as a lower bit, a middle bit, and an upper bit, from the lower level. A set of lower bits held by the memory cells belonging to the same cell unit CU will be referred to as a lower page (or lower data), a set of middle bits will be referred to as a middle page (or middle data), and a set of upper bits will be referred to as an upper page (or upper data). A memory cells capable of holding 3-bit data is referred to as a triple level cell (TLC).

When one memory cell MT can hold 3-bit data, three pages are allocated to one word line WL (one cell unit CU) in one string unit SU. The "page" can also be defined as a part of a memory space formed in the cell unit CU. Data writing and reading may be performed for each page or each cell unit CU.

Figure 6:
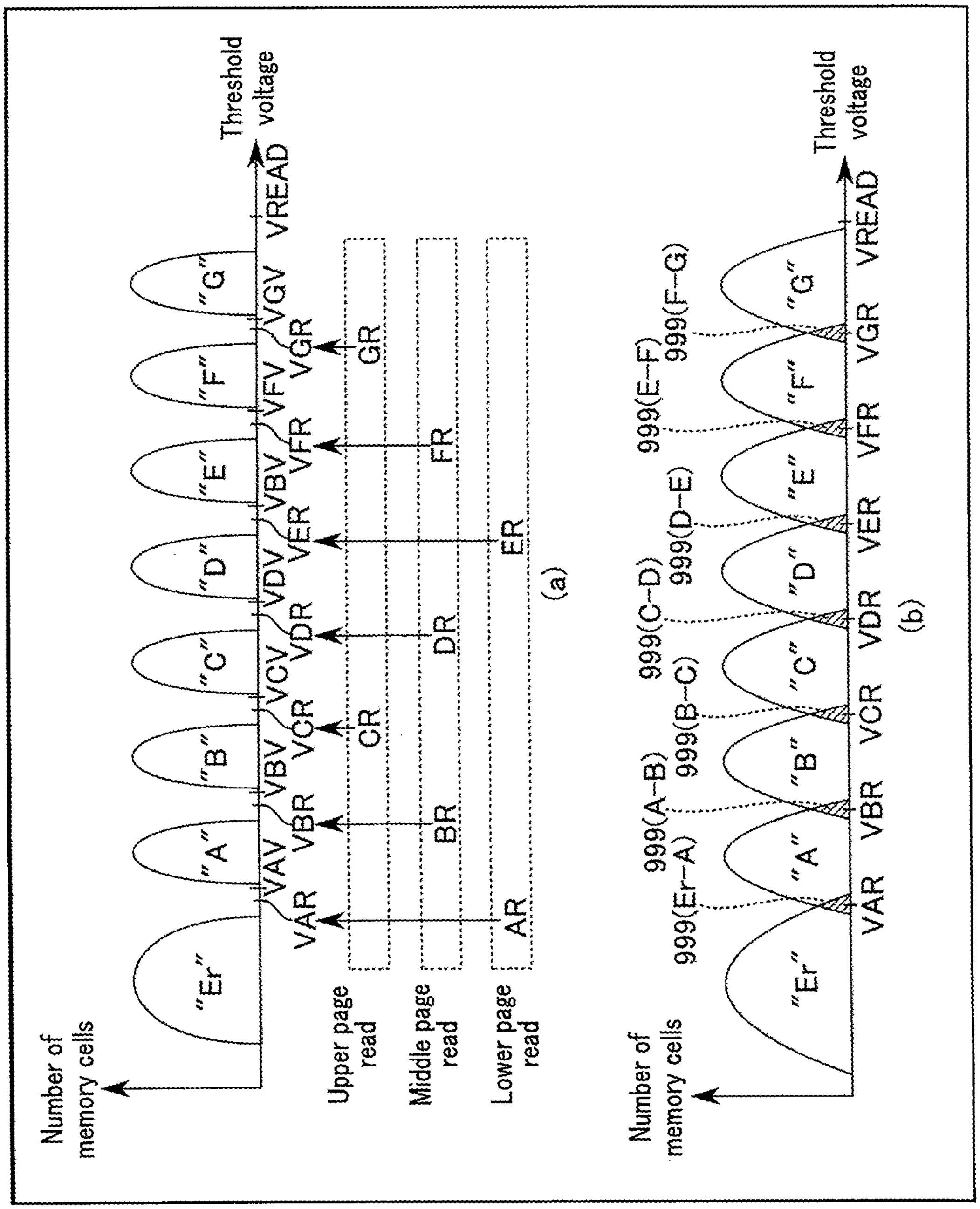
FIG. 6 is a schematic diagram illustrating an example of a relationship between data and a threshold voltage of a memory cell.

(a) of FIG. 6 is a diagram illustrating data that can be taken by each memory cell MT, a threshold voltage distribution, and voltages used for data reading.

As illustrated in (a) of FIG. 6, when the memory cell MT can hold 3-bit data, the memory cell MT can take eight states according to the threshold voltages. These eight states are referred to as "Er" state, "A" state, "B" state, "C" state, "D" state, "E" state, "F" state, and "G" state in ascending order of threshold voltage.

The threshold voltage of the memory cell MT in the "Er" state is lower than a voltage VAR and corresponds to a data erase state. The threshold voltage of the memory cell MT in the "A" state is equal to or higher than the voltage VAR and lower than a voltage VBR (>VAR). The threshold voltage of the memory cell MT in the "B" state is equal to or higher than the voltage VBR and lower than a voltage VCR (>VBR). The threshold voltage of the memory cell MT in the "C" state is equal to or higher than the voltage VCR and lower than a voltage VDR (>VCR). The threshold voltage of the memory cell MT in the "D" state is equal to or higher than the voltage VDR and lower than a voltage VER (>VDR). The threshold voltage of the memory cell MT in the "E" state is equal to or higher than the voltage VER and lower than a voltage VFR (>VER). The threshold voltage of the memory cell MT in the "F" state is equal to or higher than the voltage VFR and lower than a voltage VGR (>VFR). The threshold voltage of the memory cell MT in the "G" state is equal to or higher than the voltage VGR and lower than a voltage VREAD (>VGR).

Among the eight states distributed in this manner, the "G" state is the state with the highest threshold voltage. Each state has a range of voltage values associated with the corresponding data. The "A" to "G" states are called program states.

Hereinafter, each of the voltages VAR to VGR is also referred to as a determination level or a read level. The voltages VAR to VGR are also collectively referred to as voltages VCGR.

The voltage VREAD is, for example, a voltage applied to the word line (unselected word line) WL not to be read during the read operation. When the voltage VREAD is applied to the memory cell MT, the memory cell MT is turned on regardless of the data held by the memory cell MT.

For verification of data writing, voltages VAV to VGR are provided for the corresponding states. The voltage VAV is higher than the read level VAR and is equal to or lower than the lower limit of the desired threshold voltage distribution of the "A" state. The voltage VBV is higher than the read level VBR and is equal to or lower than the lower limit of the desired threshold voltage distribution of the "B" state. The voltage VCV is higher than the read level VCR and is equal to or lower than the lower limit of the desired threshold voltage distribution of the "C" state. The voltage VDV is higher than the read level VDR and is equal to or lower than the lower limit of the desired threshold voltage distribution of the "D" state. The voltage VEV is higher than the read level VER and is equal to or lower than the lower limit of the desired threshold voltage distribution of the "E" state. The voltage VFV is higher than the read level VFR and is equal to or lower than the lower limit of the desired threshold voltage distribution of the "F" state. The voltage VGV is higher than the read level VGR and is equal to or lower than the lower limit of the desired threshold voltage distribution of the "G" state.

Hereinafter, the voltages VAV to VGV are also referred to as verify levels.

The threshold voltage distribution is realized by writing above-described 3-bit (3 pages) data including the lower bit (lower bit), the middle bit (middle bit), and the upper bit (upper bit) to the memory cell MT in the memory cell array

11. An example of the relationships between the states of the threshold voltages and the lower/middle/upper bits are as follows.

"Er" state: "111" (represented in the order of "upper/middle/lower")
"A" state: "110"
"B" state: "100"
"C" state: "000"
"D" state: "010"
"E" state: "011"
"F" state: "001"
"G" state: "101"

As above, only one of the three bits changes between data corresponding to two adjacent states in the threshold voltage distribution.

The lower bit may be read using a voltage corresponding to a boundary at which the value of the lower bit ("0" or "1") changes. The upper bit may be read using a voltage corresponding to a boundary at which the value of the upper bit changes. The middle bit may be read using a voltage corresponding to a boundary at which the value of the middle bit changes.

As illustrated in (a) of FIG. 6, the reading of the lower page is executed using the voltage VAR for distinguishing between the "Er" state and the "A" state and the voltage VER for distinguishing between the "D" state and the "E" state as read voltages.

The reading of the middle page is executed using the voltage VBR for distinguishing between the "A" state and the "B" state, the voltage VDR for distinguishing between the "C" state and the "D" state, and the voltage VFR for distinguishing between the "E" state and the "F" state as read voltages.

The reading of the upper page is executed using the voltage VCR for distinguishing between the "B" state and the "C" state and the voltage VGR for distinguishing between the "F" state and the "G" state as read voltages.

The memory cell MT in the erase state is specified by reading with the voltage VAR.

Hereinafter, the reading (determination) with the voltage VAR is also referred to as AR read. Similarly, the reading using the voltages VBR, VCR, VDR, VER, VFR, and VGR is divided into BR read, CR read, DR read, ER read, FR read, and GR read.

In the memory system of the present embodiment, one memory cell may be capable of holding data of two bits or less or may be capable of holding data of four bits or more. A memory cell capable of holding 1-bit data is referred to as a single level cell (SLC). A memory cell capable of holding 2-bit data is referred to as a multi-level cell (MLC). A memory cell capable of holding 4-bit data is referred to as a quadruple level cell (QLC).

(b) of FIG. 6 is a diagram for describing the state of the threshold voltage distribution of the memory cell.

When time elapses after data writing, there occurs an error of threshold distribution (state) shifting due to interference between memory cells (hereinafter, referred to as a data retention error.). During writing and reading of the flash memory, there may occur an unintended shift of the threshold distribution (hereinafter, referred to as a program disturb and a read disturb, respectively).

The characteristics of the plurality of memory cells MT in the memory cell array 11 tend to vary.

For example, the variation amount (writing speed) of the threshold voltage of the memory cell MT with respect to the program voltage of a certain value varies. Due to this variation, when a program voltage of a certain value is applied, among a plurality of write target memory cells, some memory cells have reached a certain threshold voltage and other memory cells have not reached the certain threshold voltage. Therefore, in the program operation, there may occur an error in which the threshold voltage of the memory cell is shifted to a higher state than the state corresponding to the data to be written (hereinafter, referred to as an over-program).

For example, there may occur a phenomenon that the threshold voltage of the memory cell decreases after data writing. Due to this phenomenon, the threshold voltage of the memory cell after data writing may change from a value corresponding to the data to be stored according to the characteristics of the memory cell (for example, data retention characteristics).

The change amount of the threshold voltage in the phenomenon that the threshold voltage decreases after data writing varies according to the characteristics of the memory cell (hereinafter, also referred to as data retention characteristics).

When the threshold distributions associated with such various fluctuation factors change, adjacent threshold distributions may overlap.

If adjacent threshold distributions overlap, the read operation using the above voltages VAR, VBR, VCR, . . . , VFR, and VGR may not correctly read the data in the memory cell MT from the memory cell having the threshold voltage in a region 999 where the distributions overlap.

For example, when the threshold distribution of "A" state and the threshold distribution of "B" state overlap with each other, a memory cell having a threshold voltage higher than the voltage VBR among memory cells having the threshold distribution of "A" state may be erroneously read as "B" state, and a memory cell having a threshold voltage lower than the voltage VBR among memory cells having the threshold distribution of "B" state may be erroneously read as "A" state. As above, if the number of erroneously read bits (the number of fail bits) exceeds the number of correctable bits for the error check and correction circuit 160, the memory controller 100 fails to read correct data from the flash memory 10.

<Memory Space>

A memory space in the memory system of the present embodiment will be described with reference to FIGS. 7 and 8.

Figure 7:
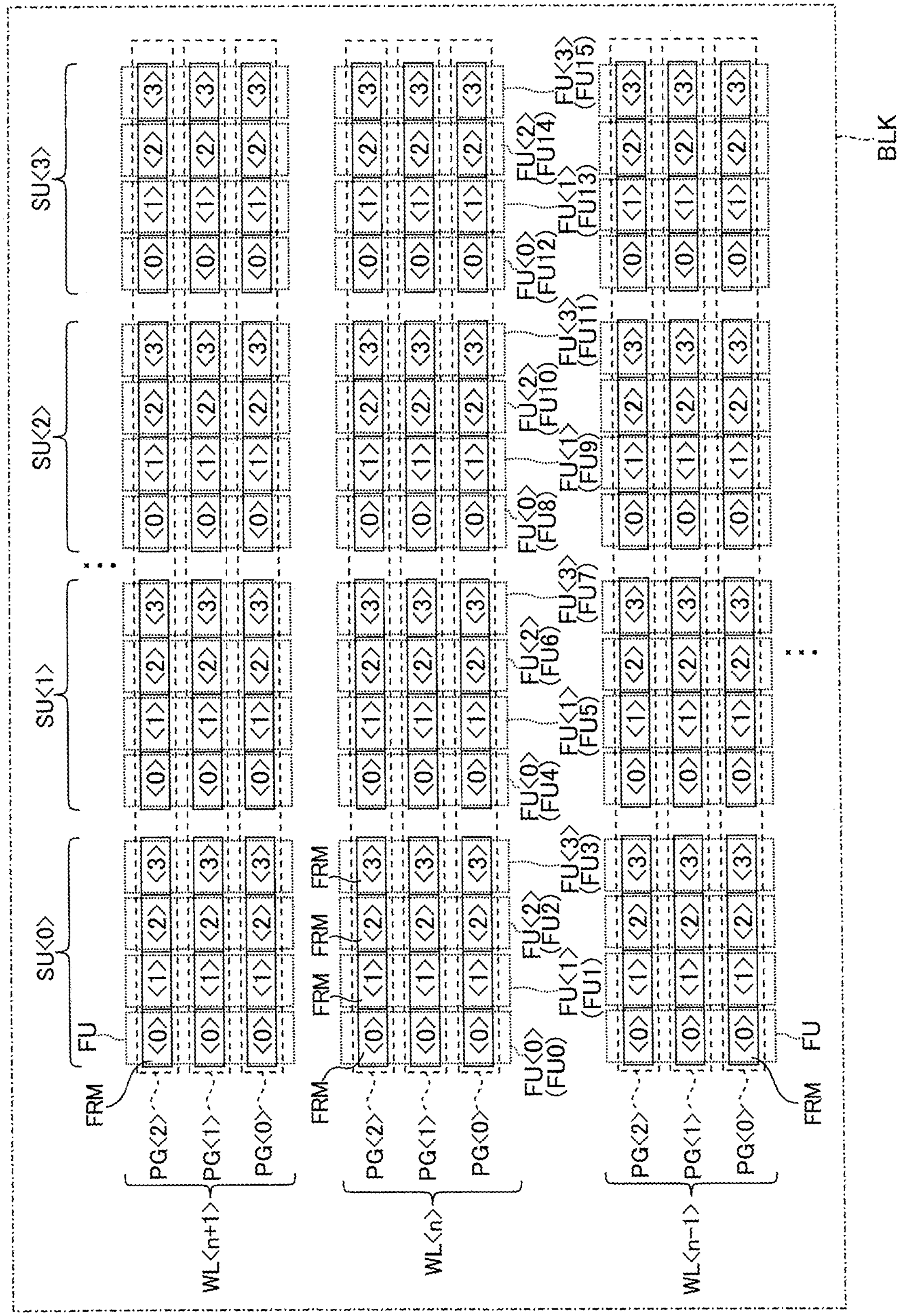
FIGS. 7 and 8 are schematic diagrams illustrating an example of a memory space in the memory system.

FIG. 7 is a diagram schematically illustrating a memory space in a flash memory in the memory system of the present embodiment.

As described above, each block BLK in the memory cell array includes a plurality of string units SU. Each of the string units SU includes a plurality of word lines WL (WL<n−1>, WL<n>, WL<n+1>). n is an integer of 1 or greater.

For example, one block BLK includes four string units SU<0>, SU<1>, SU<2>, and SU<3>. In this case, the memory space of one word line WL (for example, the word line WL<n>) is divided into areas corresponding to the four string units SU, and managed and controlled. Accordingly, the memory space of one word line WL in the block BLK can be accessed in units of string units.

Data is read and written in units of pages.

When one memory cell MT stores data of two bits or more, a plurality of pages PG is allocated to one word line WL.

For example, when the memory cell is capable of storing 3-bit data, one word line WL includes three pages PG (PG-L, PG-M, PG-U).

Each page PG includes a plurality of frames FRM. For example, one page PG in one string unit SU includes four frames FRM.

Each frame FRM is a data area having a predetermined storage capacity (the number of memory cells). Each frame FRM stores data of a data size based on the storage capacity of the frame FRM. For example, each frame FRM has a storage capacity of 1 KB (=1024 kbyte).

For example, the memory controller 100 can execute various types of processing with data in units of frames (hereinafter, also referred to as frame data) on data in units of pages (hereinafter, also referred to as page data.) read from the flash memory 10.

The plurality of frames FRM can be managed and controlled by a certain control unit (hereinafter, referred to as a frame unit) FU.

One string unit SU of one word line WL includes one or more frame units FU. Each frame unit FU includes a plurality of frames FRM belonging to a certain system. A plurality of frames FRM in a certain frame unit FU has a range of common bit line addresses (column addresses) and has page addresses (page identification numbers) different from each other.

For example, when each page PG of one string unit SU of one word line WL includes four frames FRM, one string unit SU of this word line WL includes four frame units FU.

When one word line WL includes three pages, one string unit SU of this word line WL includes 12 frames FRM. In this case, each frame unit FU includes three frames FRM. One cell unit CU includes four frame units SU.

As described above, in the flash memory 10 including the memory cells MT capable of storing 3-bit data, one word line WL<n> in one block BLK includes 16 frame units FU (FU0 to FU15). In this case, one word line WL<n> in one block BLK includes 48 frames FRM.

In the flash memory 10 including the memory cells MT capable of storing 1-bit data, one frame unit FU includes one frame FRM. In the flash memory 10 including the memory cells MT capable of storing 2-bit data, one frame unit FU includes two frames FRM. In the flash memory 10 including the memory cells MT capable of storing 4-bit data, one frame unit FU includes four frames FRM.

Figure 8:
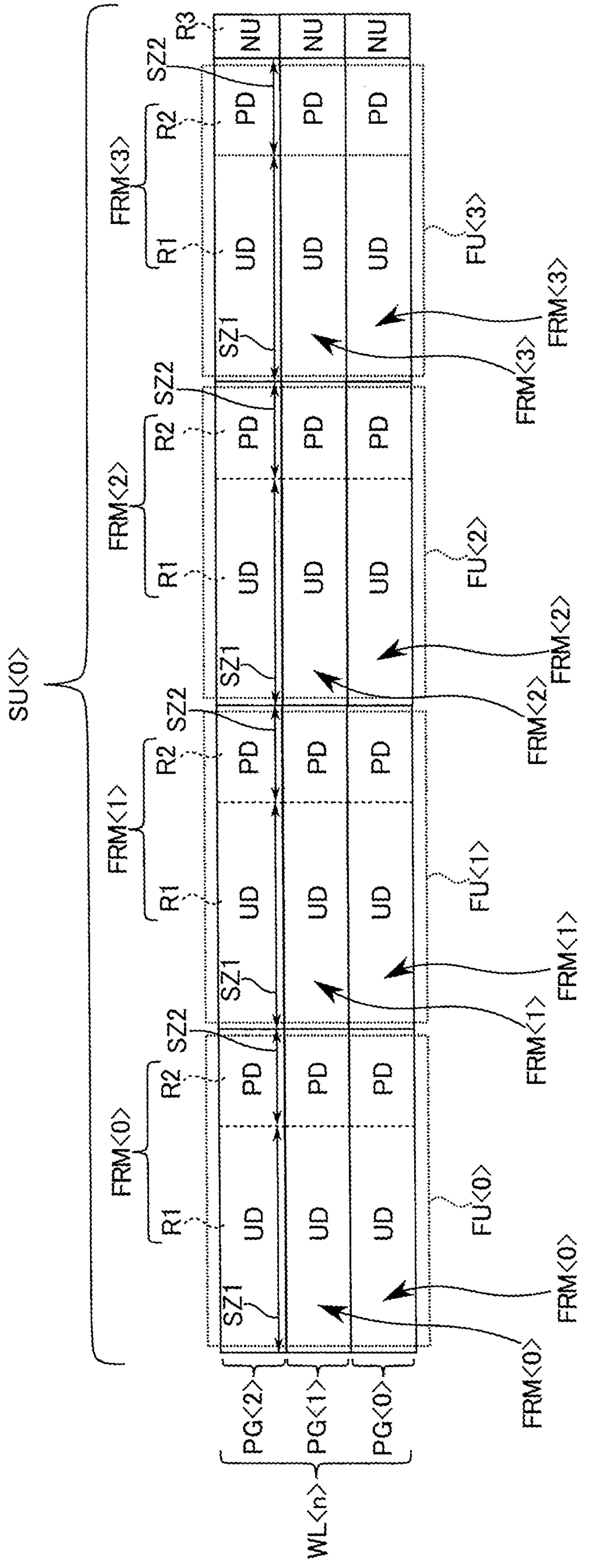

FIG. 8 is a schematic diagram for describing a configuration of a frame in the memory system of the present embodiment.

As illustrated in FIG. 8, each frame FRM includes a plurality of data areas R1 and R2.

The data area R1 stores user data UD. The user data UD is data used by the host device 2. Hereinafter, the data area R1 will be referred to as user data area R1. The control data may be stored in the data area R1. The control data is data including information on control of the memory system 1, control of the flash memory 10, or control of the host device 2. Hereinafter, the user data UD and the control data will also be referred to as stored data.

The data area R2 stores parity data. The parity data PD is data including information for detecting an error in the user data (or the control data) UD and correcting the detected error. Hereinafter, the data area R2 will be referred to as parity data area R2. The parity data PD is generated by an encoding process on the user data UD by the encoding circuit 161 of the error check and correction circuit 160 at the time of writing data to the flash memory 10. The parity data PD is written in one frame FRM together with the corresponding user data UD.

For example, in each frame FRM, the sizes (storage capacities) of the plurality of user data areas R1 are equal. Data sizes SZ1 of the plurality of user data UD are equal. For example, in each frame FRM, the sizes (storage capacities) of the plurality of parity data areas R2 are equal. Data sizes SZ2 of the plurality of parity data PD are equal.

For example, the storage capacity of the user data area R1 is larger than the storage capacity of the parity data area R2. Therefore, the data size SZ1 of the user data UD is larger than the data size SZ2 of the parity data PD.

Each page PG (or the frame FRM) may include a data area R3 in which the user data UD and the parity data PD are not held. Hereinafter, the data area R3 will be referred to as unused area R3. For example, a memory cell MTMC in the unused area R3 is set to the erase state ("Er" state). In this case, the unused area R3 holds erase data. The user data UD is decoded through analysis of the parity data PD by the decoding circuit 162 of the error check and correction circuit 160 at the time of reading data from the flash memory 10.

In the present embodiment, when the ECC process is performed on the read data (page data), the ECC process is performed on data in units of frames.

For each frame FRM of the read data, detection of an error in the data in the ECC process and correction of the detected error are executed on the user data UD in the frame FRM using the parity data PD in the frame FRM.

In the present embodiment, the frame FRM including the parity data PD for the ECC process is also referred to as ECC frame.

The memory system of the present embodiment calculates a read level for data reading based on a result of the ECC process on the frame FRM.

The calculated read level value is managed using the voltage information table TBL.

<Voltage Information Table>

A management table of the memory system of the present embodiment will be described with reference to FIG. 9.

The memory system of the present embodiment includes the voltage information table (also referred to as a history table) TBL.

The voltage information table TBL includes setting information of a plurality of voltages used for various operations executed by the flash memory 10. For example, the voltage information table TBL holds information related to the read level used for the read operation.

As illustrated in FIG. 9, the voltage information table TBL holds, for example, information indicating a shift amount Δ of the read level used for the read operations AR to GR (for example, a digital to analogue converter (DAC) value). The shift amount Δ can be individually set, for example, for each channel CH, for each chip CP, for each block BLK, for each word line WL, and for each string unit SU.

The shift amount Δ may be further set and managed for each frame unit FU.

As described with reference to FIG. 6, the threshold distributions corresponding to the "Er" state, the "A" state, the "B" state, the "C" state, . . . , "G" state are ideally separated from each other. Therefore, these states can be distinguished by voltages (read levels) VAR, VBR, VCR, . . . , and VGR.

Adjacent threshold distributions may overlap due to a data retention error after data writing, a program disturb, and a read disturb.

Due to the overlapping of the adjacent threshold distributions, data may not be correctly read in the read operation (hard bit determination) using the read levels VAR, VBR, VCR, . . . , and VGR. For example, when the threshold distribution in the "A" state and the threshold distribution in the "B" state overlap (999(A-B) in (b) of FIG. 6), a memory cell having a threshold voltage higher than the read level VBR in the threshold distribution in the "A" state may be erroneously read as being in the "B" state, and a memory cell having a threshold voltage lower than the read level VBR in the threshold distribution in the "B" state may be erroneously read as being in the "A" state.

As above, when the number of erroneously read bits (the number of fail bits) exceeds the number of correctable bits using the parity data PD in the error check and correction circuit 160, the memory controller 100 fails to read correct data from the flash memory 10.

In such a case, the memory controller 100 shifts the read levels from the read levels (hereinafter, referred to as default read levels) VAR, VBR, . . . , and VGR in the normal read processing (hereinafter, referred to as normal read processing), and attempts to read data again. Hereinafter, the read operation executed with shifting of the read levels will be referred to as shift read process.

Information indicating the amounts of shift from the default read levels in the shift reading process are held in the voltage information table TBL for each channel CH, each chip CP, each block BLK, each word line WL, and each string unit SU in each read level of the read operations AR, BR, . . . , and GR.

The information on the amounts of shift from the default read levels may be further held in the voltage information table TBL for each frame unit FU.

For example, in the voltage information table TBL, the state in which the DAC value is indicated by "00" corresponds to the default read voltage (that is, shift amount Δ=0).

The shift amount Δ of the read level is calculated at a certain timing (for example, at the time of data reading) by the voltage correction circuit 180 in the memory controller 100, for example. Accordingly, a more suitable value of the read level is obtained.

The value (calculation result) calculated by the voltage correction circuit 180 is held in the voltage information table TBL in the memory 120 as the shift amount Δ.

At the time of the read operation, the memory controller 100 refers to the voltage information table TBL to determine the voltage (read level) to be applied to the word line WL corresponding to the memory cell MT to be read.

In the example of FIG. 9, regarding the read operation on the cell unit CU corresponding to (channel CH, chip CP, block BLK, word line WL, and string unit SU)=(0, 0, 0, 0, 0), the shift amounts Δ of +8, +2, −7, . . . , +5, and −1 are set for the read levels VAR, VBR, VCR, . . . , VFR, and VGR, respectively.

This means that, when the read operations AR, BR, CR, . . . , FR, and GR are executed on the cell unit CU having the address of (0, 0, 0, 0, 0), the values of the read levels (voltage value, potential) are shifted by the voltage values corresponding to the DAC values of +8, +2, −7, . . . , +5, and −1 from the default read levels VAR, VBR, VCR, . . . , VFR, and VGR.

Regarding the read operation on the cell unit CU corresponding to (channel CH, chip CP, block BLK, word line WL, and string unit SU)=(0, 1, 0, 0, 0), the shift amount of "00" is set to all of the read levels VAR, VBR, VCR, . . . , VFR, and VGR. In this case, when the read operations AR, BR, CR, . . . , FR, and GR are executed on the cell unit CU having the address of (0, 1, 0, 0, 0), the default read levels VAR, VBR, VCR, . . . , VFR, and VGR are used.

In the memory cell array 11 having a three-dimensional structure (for example, the structure of FIG. 5), as a tendency between the address (coordinates) in the memory cell array 11 and the shift amount of the read level, the magnitude of the read level at a certain address has a value close to the magnitude of the read level at an address in the vicinity of the certain address.

The memory system of the present embodiment performs the ECC process (error detection and correction of detected error) on the user data UD in the frame FRM using the parity data PD in the frame FRM.

When the correction of an error in the user data UD by the parity data PD in units of frames fails and the user data UD is not normally read, a read error occurs.

In the present embodiment, at the time of execution of a read operation on a certain string unit SU in a certain word line WL, when a read error occurs in a frame FRM belonging to a page to be read, the memory system 1 of the present embodiment calculates various types of information (for example, the read level) for reading data at the selected address including the frame FRM in which the read error has occurred, using information of a frame in the vicinity of the frame FRM in which the read error has occurred (for example, a frame at an adjacent address).

When a read error occurs, the memory system 1 of the present embodiment executes a calculation process of the correction amount of the read level (the shift amount of the read level) for re-reading the data of the frame FRM in which the read error has occurred, by using one or more pieces of frame data included at the selected address.

For example, the selected address includes a row address and a column address. The row address includes a block address, a word line address, a string unit address, and/or a page address. Hereinafter, the selected address mainly indicates a row address.

The memory system 1 of the present embodiment uses the calculated read level to execute reading again on a page including a frame in which a read error has occurred.

Accordingly, the memory system 1 of the present embodiment can read correct data at the selected address by re-reading data using the corrected read level.

The shift amount of the read level is calculated as follows.

(1b) Shift Amount Calculation Process

The concept of the calculation process of shift amount of the read level will be described with reference to FIGS. 10 to 12.

In the present embodiment, the shift amount of the read level is calculated using pre-error correction read data in units of frames (hereinafter, referred to as pre-error correction frame data) and post-error correction read data in units of frames (hereinafter, referred to as post-error correction frame data).

Figure 10:
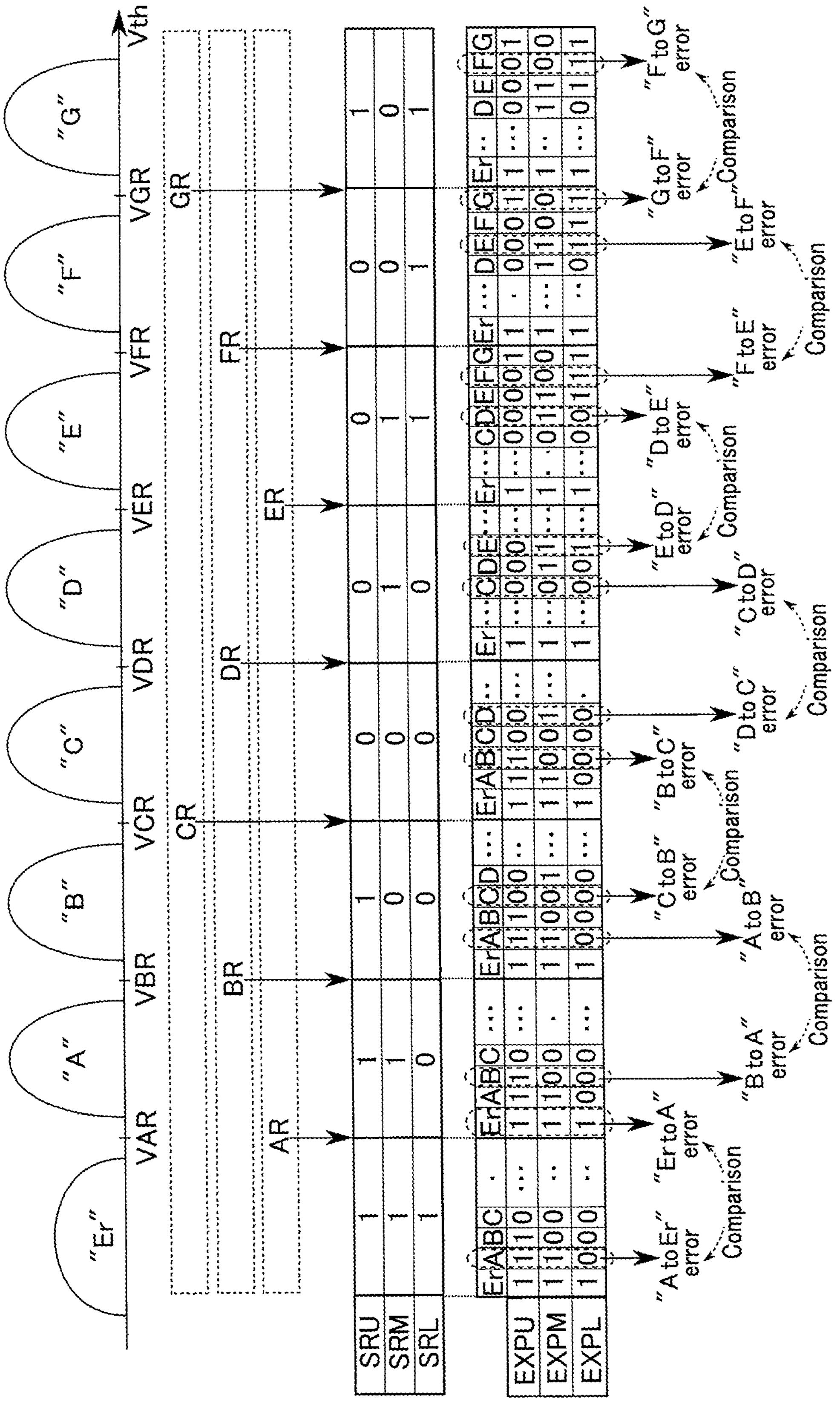
FIG. 10 is a schematic diagram illustrating processing in the memory system according to the first embodiment.

FIG. 10 is a schematic diagram for describing the calculation process of shift amount of the read level in the memory system according to the present embodiment.

As illustrated in FIG. 10, when the memory cell MT stores 3-bit data, the frame unit including upper data, middle data, and lower data has pre-error correction upper frame data SRU, pre-error correction middle frame data SRM, and pre-error correction lower frame data SRL. By the ECC process (decoding process) on the pre-error correction frame data SRU, SRM, and SRL, post-error correction upper frame data EXPU, post-error correction middle frame data EXPM, and post-error correction lower frame data EXPL are generated.

In the voltage correction circuit 180, for example, the memory circuit 181 holds the pre-error correction frame data SR (SRU, SRM, and SRL) and the post-error correction frame data EXP (EXPU, EXPM, and EXPL).

There are $2^6$=64 combinations of values that can be taken by the pre-error correction frame data SR (SRU, SRM, and SRL) and the post-error correction frame data EXP (EXPU, EXPM, and EXPL), C0=(SRU, SRM, SRL, EXPU, EXPM, and EXPL). Among the combinations, eight combinations in which there is a match between a set of pre-error correction frame data SR (SRU, SRM, and SRL) and a set of post-error correction frame data EXP (EXPU, EXPM, and EXPL) indicates that the data has been read without errors.

Specifically, for example, the combination C0=(1, 1, 1, 1, 1, 1) indicates that the data in the "Er" state has been correctly read from the memory cell MT in which the data in the "Er" state has been written. Similarly, the combinations C0=(1, 1, 0, 1, 1, 0), (1, 0, 0, 1, 0, 0), (0, 0, 0, 0, 0, 0), (0, 1, 0, 0, 1, 0), (0, 1, 1, 0, 1, 1), (0, 0, 1, 0, 0, 1), and (1, 0, 1, 1, 0, 1) indicate that the respective data of the "A" state, the "B" state, the "C" state, the "D" state, the "E" state, the "F" state, and the "G" state have been correctly read.

On the other hand, the remaining 56 combinations in which there is no match between a set of the pre-error correction frame data SR (SRU, SRM, and SRL) and a set of the post-error correction frame data (EXPU, EXPM, and EXPL) indicate that the data has been erroneously read.

For example, the combination C0=(1, 1, 1, 1, 1, 0) indicates that the data in the "Er" state has been erroneously read from the memory cell MT in which the data in the "A" state has been written. For example, the combination C0=(1, 1, 0, 1, 1, 1) indicates that the data in the "A" state has been erroneously read from the memory cell MT in which the data in the "Er" state has been written.

The voltage correction circuit 180 classifies the memory cells MT in the cell unit CU that have been undergone the read processing for each of the 64 combinations C0 as described above.

In the voltage correction circuit 180, for example, the count circuit 182 counts the number of classified memory cells MT (as the number of bits) for each of the 64 combinations C0.

In the voltage correction circuit 180, for example, the selection circuit 183 selects two combinations out of the 64 combinations C0 under the following condition, as one set. The voltage correction circuit 180 selects "first state to second state error case" and "second state to first state error case" as one set in order to calculate the shift amount of the read voltage (read level) VCGR for distinguishing the first state and the second state.

The "first state to second state" error case (also referred to as "first state to second state" erroneous read case) indicates a case where data in the second state adjacent to the first state is erroneously read from the memory cell MT in which the data in the first state has been written. The "second state to first state" error case (also referred to as "second state to first state" erroneous read case) indicates a case where data in the first state is erroneously read from the memory cell MT in which the data in the second state has been written.

The selection circuit 183 selects 14 combinations out of the 64 combinations C0. The selection circuit 183 can form 7 sets from the selected 14 combinations.

When calculating the shift amount Δ of the read level VAR (when (first state, second state)=(Er, A)), the selection circuit 183 selects a count value (number of error bits) of the "Er to A" error case corresponding to the combination C0=(1, 1, 0, 1, 1, 1) and a count value of the "A to Er" error case corresponding to the combination C0=(1, 1, 1, 1, 1, 0), as one set.

When calculating the shift amount Δ of the read level VBR (when (first state, second state)=(A, B)), the selection circuit 183 selects a count value of the "A to B" error case corresponding to the combination C0=(1, 0, 0, 1, 1, 0) and a count value of the "B to A" error case corresponding to the combination C0=(1, 1, 0, 1, 0, 0), as one set.

When calculating the shift amount Δ of the read level VCR (when (first state, second state)=(B, C)), the selection circuit 183 selects a count value of the "B to C" error case corresponding to the combination C0=(0, 0, 0, 1, 0, 0) and a count value of the "C to B" error case corresponding to the combination C0=(1, 0, 0, 0, 0, 0), as one set.

When calculating the shift amount Δ of the read level VDR (when (first state, second state)=(C, D)), the selection circuit 183 selects a count value of the "C to D" error case corresponding to the combination C0=(0, 1, 0, 0, 0, 0) and a count value of the "D to C" error case corresponding to the combination C0=(0, 0, 0, 0, 1, 0), as one set.

When calculating the shift amount Δ of the read level VER (when (first state, second state)=(D, E)), the selection circuit 183 selects a count value of the "D to E" error case corresponding to the combination C0=(0, 1, 1, 0, 1, 0) and a count value of the "E to D" error case corresponding to the combination C0=(0, 1, 0, 0, 1, 1), as one set.

When calculating the shift amount Δ of the read level VFR (when (first state, second state)=(E, F)), the selection circuit 183 selects a count value of the "E to F" error case corresponding to the combination C0=(0, 0, 1, 0, 1, 1) and a count value of the "F to E" error case corresponding to the combination C0=(0, 1, 1, 0, 0, 1), as one set.

When calculating the shift amount Δ of the read level VGR (when (first state, second state)=(F, G)), the selection circuit 183 selects a count value of the "F to G" error case corresponding to the combination C0=(1, 0, 1, 0, 0, 1) and a count value of the "G to F" error case corresponding to the combination C0=(0, 0, 1, 1, 0, 1), as one set.

As described above, the selection circuit 183 can select a set including two count values used for the calculation process of shift amount of the read level for each of the read operations AR to GR.

Figure 11:
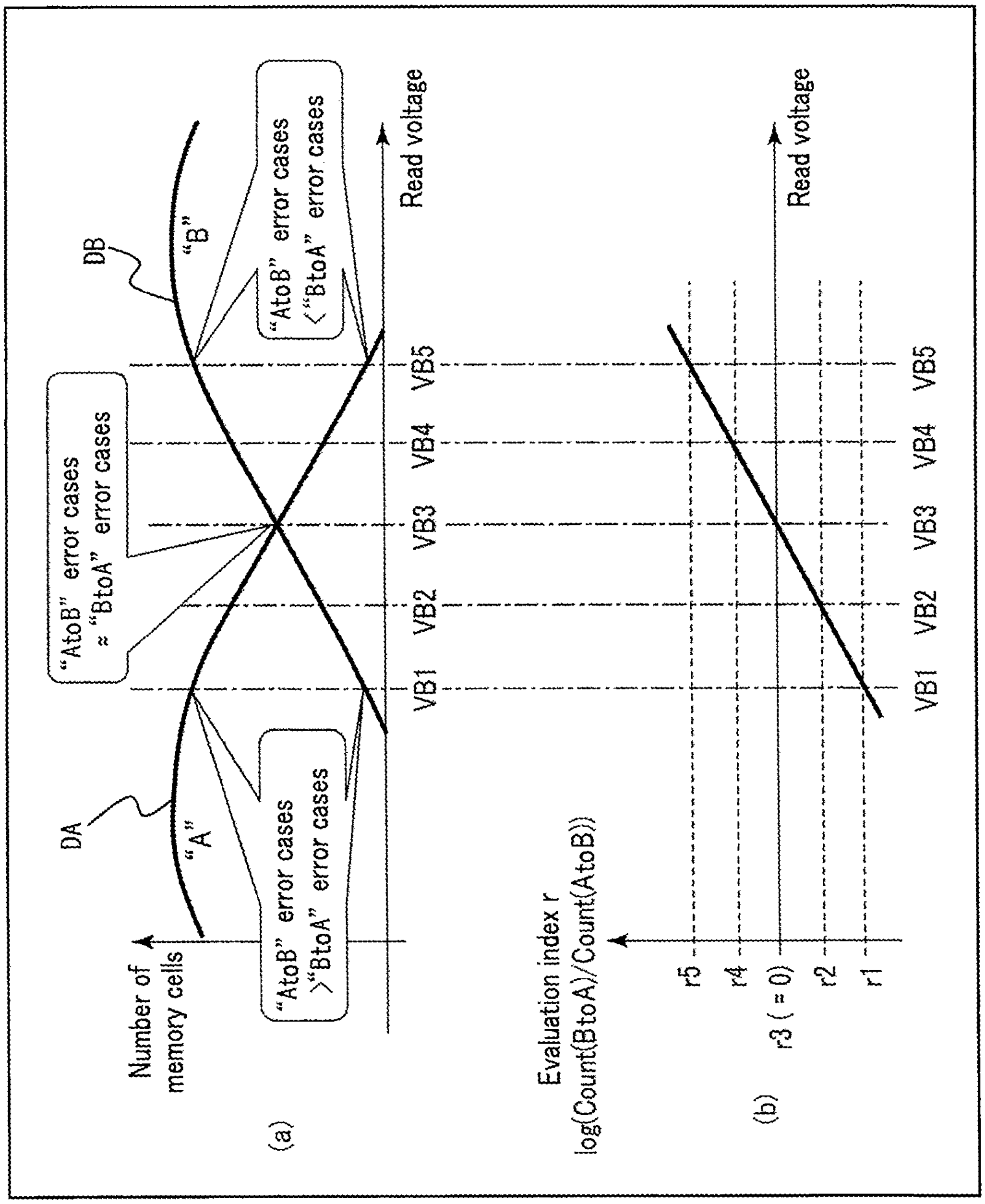
FIGS. 11, 12, and 13 are schematic diagrams illustrating processing in the memory system according to the first embodiment.

FIG. 11 is a schematic diagram for describing the calculation process of shift amount of the read level in the memory system according to the present embodiment.

Referring to FIG. 11, the calculation process of evaluation indexes of the shift amounts of the read levels based on a plurality of combinations selected as illustrated in FIG. 10 will be described.

(a) of FIG. 11 (the upper part of FIG. 11) illustrates, as an example of two adjacent threshold distributions, threshold distributions DA and DB of the memory cells MT in which data corresponding to the "A" state and the "B" state are written.

In (a) of FIG. 11, the two threshold distributions DA and DB change due to various fluctuating factors of the threshold voltages of the memory cells, and overlap each other.

(a) of FIG. 11 illustrates how the "A to B" error case and the "B to A" error case increase and decrease when the read voltages VBR (VB1 to VB5) are applied to the two threshold distributions DA and DB.

(b) of FIG. 11 (the lower part of FIG. 11) illustrates the relationship between the evaluation index ("r") and the read level VBR. In the example of (b) of FIG. 11, the evaluation index "r" is calculated from the count value of the "A to B" error case (denoted as Count (A to B)) and the count value of the "B to A" error case (denoted as Count (B to A)).

As illustrated in (a) of FIG. 11, the position of the read level VBR of the voltage value VB3 corresponds to, for example, a valley position between two threshold distributions DA and DB respectively corresponding to the "A" state and the "B" state, that is, a position where the number of memory cells having the same threshold voltage is equal between two adjacent threshold distributions DA and DB.

When it can be considered that the shapes of the two adjacent threshold distributions DA and DB are substantially equal, the number of memory cells having threshold voltages higher than the voltage value VB3 in the threshold distribution DA in the "A" state can be substantially equal to the number of memory cells having threshold voltages lower than the voltage value VB3 in the threshold distribution DB in the "B" state.

In this case, in the data read using the read level VBR of the voltage value VB3, the count value of the "A to B" error case can be substantially equal to the count value of the "B to A" error case. The ratio of the count value of the "B to A" error case to the count value of the "A to B" error case can be considered as "1".

As the voltage value at the read level increases from the voltage value VB3 to the voltage value VB4 and the voltage value VB5, the count value of the "A to B" error case decreases. On the other hand, the count value of the "B to A" error case increases according to the change from the voltage value VB3 to the voltage value VB5 at the read level VBR.

As a result, the ratio of the count value of "B to A" the error case to the count value of the "A to B" error case can increase to a value larger than "1".

As the value of the read level VBR decreases from the voltage value VB3 to the voltage value VB2 and the voltage value VBR1, the count value of the "A to B" error case increases. In contrast to this, the count value of the "B to A" error case decreases according to the change from the voltage value VB3 to the voltage value VB1 at the read level VBR.

As a result, the ratio of the count value of "B to A" the error case to the count value of the "A to B" error case can decrease to a value smaller than "1".

Based on the above results, when the logarithmic value of the ratio of the count values is set on the vertical axis of the graph as illustrated in (b) of FIG. 11, for example, the logarithmic value of the ratio becomes r3≈0 at the voltage value VB3, and has a positive correlation with the voltage value of the read level in the vicinity of the voltage value VB3.

In the voltage correction circuit 180, the evaluation index calculation circuit 184 calculates, for example, the logarithmic value of this ratio as evaluation index "r". The evaluation index calculation circuit 184 transmits the calculation result to the shift amount calculation circuit 185.

The shift amount calculation circuit 185 can estimate how far the voltage value of the read level used to read data is from the voltage value VB3 according to the value of the evaluation index "r".

Figure 12:
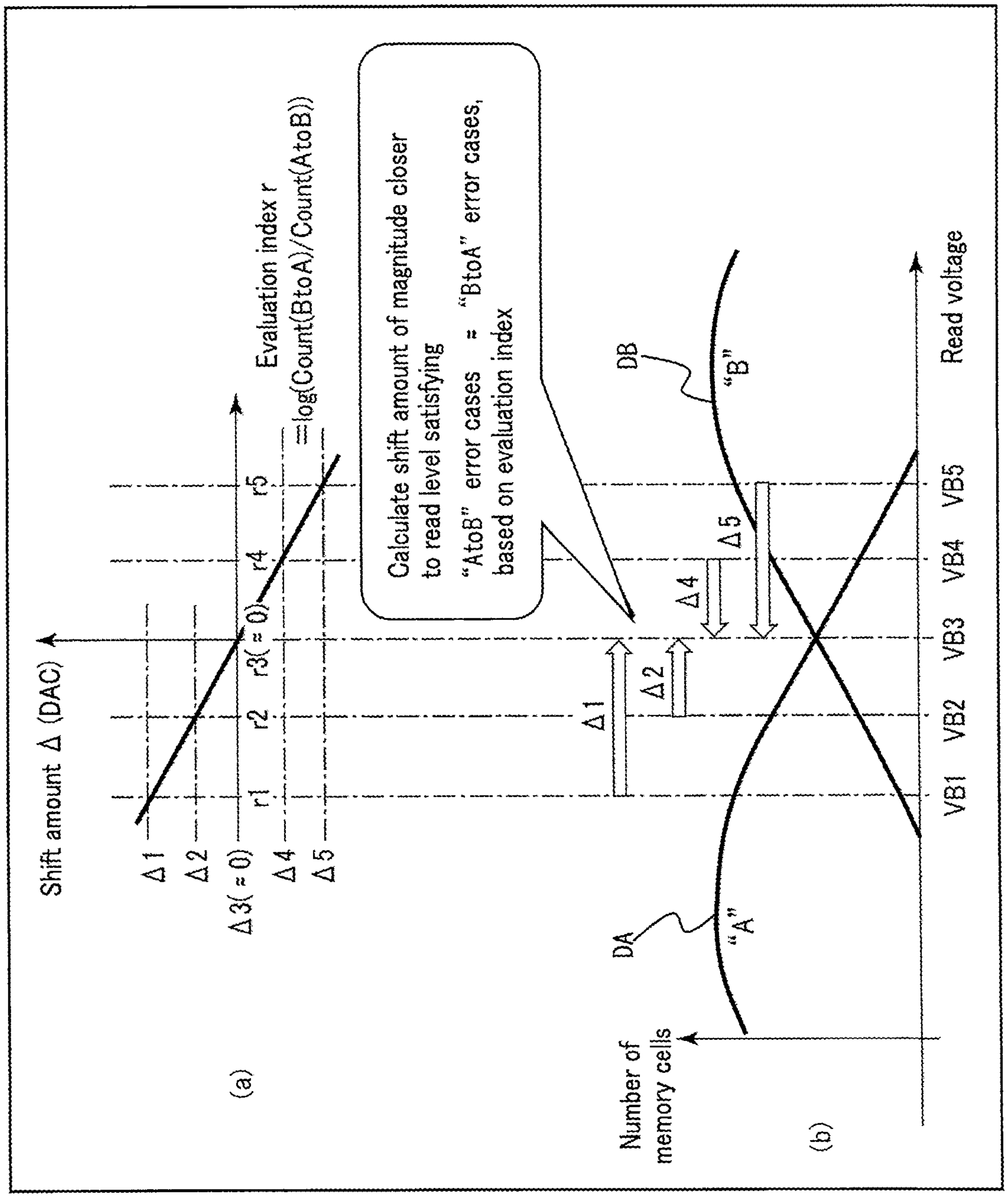

FIG. 12 is a schematic diagram for describing the calculation process of shift amount of the read level in the memory system according to the present embodiment.

FIG. 12 is a schematic diagram for describing the process of calculating the shift amount Δ based on the evaluation index.

(a) of FIG. 12 (the upper part of FIG. 12) illustrates the magnitude of shift amounts Δ (Δ1 to Δ5) set according to the magnitudes of the values of evaluation indexes "r" (r1 to r5). (b) of FIG. 12 (the lower part of FIG. 12) illustrates the relationship between the magnitude of the shift amount Δ and the read level VBR.

As illustrated in (a) of FIG. 12, for example, when the evaluation index "r" is "0", the shift amount "Δ" is set to be "0". The shift amount "Δ" is set to have a negative correlation with the evaluation index "r".

The shift amount "Δ3" corresponding to the evaluation index "r3 (≈0)" is set to a value near "0" (≈0). The shift amount "Δ" is set such that the shift amount has a relationship of "Δ1>Δ2>Δ3 (≈0)>Δ4>Δ5" with respect to the relationship of "r1<r2<r3 (≈0)<r4<r5" in the evaluation index.

By setting such shift amount "Δ", as illustrated in (b) of FIG. 12, when the value of the read level VBR is set to a value larger than the voltage value VBR3 (when the evaluation index "r" is positive), a negative shift amount "Δ" (<Δ3) can be set such that the value of the read level VBR approaches the voltage value VB3.

When the value of the read level VBR is set to a value smaller than the voltage value VBR3 (when the evaluation value "r" is negative), it is possible to set the positive shift amount Δ (>Δ3) such that the value of the read level VBR approaches the voltage value VB3.

The absolute value of the shift amount "Δ" is set to decrease as the difference (absolute value of the evaluation index "r") from the voltage value VB3 to a certain voltage value at the read level VBR decreases. The absolute value of the shift amount "Δ" is set to increase as the difference (absolute value of the evaluation index "r") from the voltage value VB3 at the read level VBR increases.

Accordingly, the memory system of the present embodiment can change the magnitude of the shift amount Δ of the read level according to the magnitude of the deviation from the voltage value (voltage value corresponding to the position of a valley between two threshold distributions) VB3 in the read level VBR.

As a result, the memory system of the present embodiment can accelerate the convergence from the current set value of the read level VBR to the voltage value VB3.

In general, when it can be considered that the shapes of two adjacent threshold distributions are substantially equal, there is a high possibility that the number of fail bits can be minimized by setting the read level VBR at a valley position of the two threshold distributions.

Therefore, by using the method of calculating the shift amount Δ that brings the value of the read level VBR close to the voltage value VB3 as described above, the value of the read level VBR can be brought close to a value more suitable for determining data.

Also for the other read levels VAR, VCR, VDR, VER, VFR, and VGR, the memory system of the present embodiment can calculate the shift amount of each read level based on the ratio of the number of errors at the read level, as with the calculation of the shift amount of the read level VBR described with reference to FIGS. 11 and 12.

For example, the correspondence relationship between the evaluation index "r" and the shift amount "Δ" at each of the read levels VAR, VBR, . . . , and VGR is held in the work memory 120 and the NAND package group 200 (the flash memory 10), in the form of a table (hereinafter, referred to as shift amount conversion table) TBLz.

In the voltage correction circuit 180, the shift amount calculation circuit 185 refers to the shift amount conversion table TBLz and obtains the shift amount of the read level to be calculated.

A value corresponding to the shift amount of the read level calculated in this manner is written to the voltage information table TBL.

Figure 13:
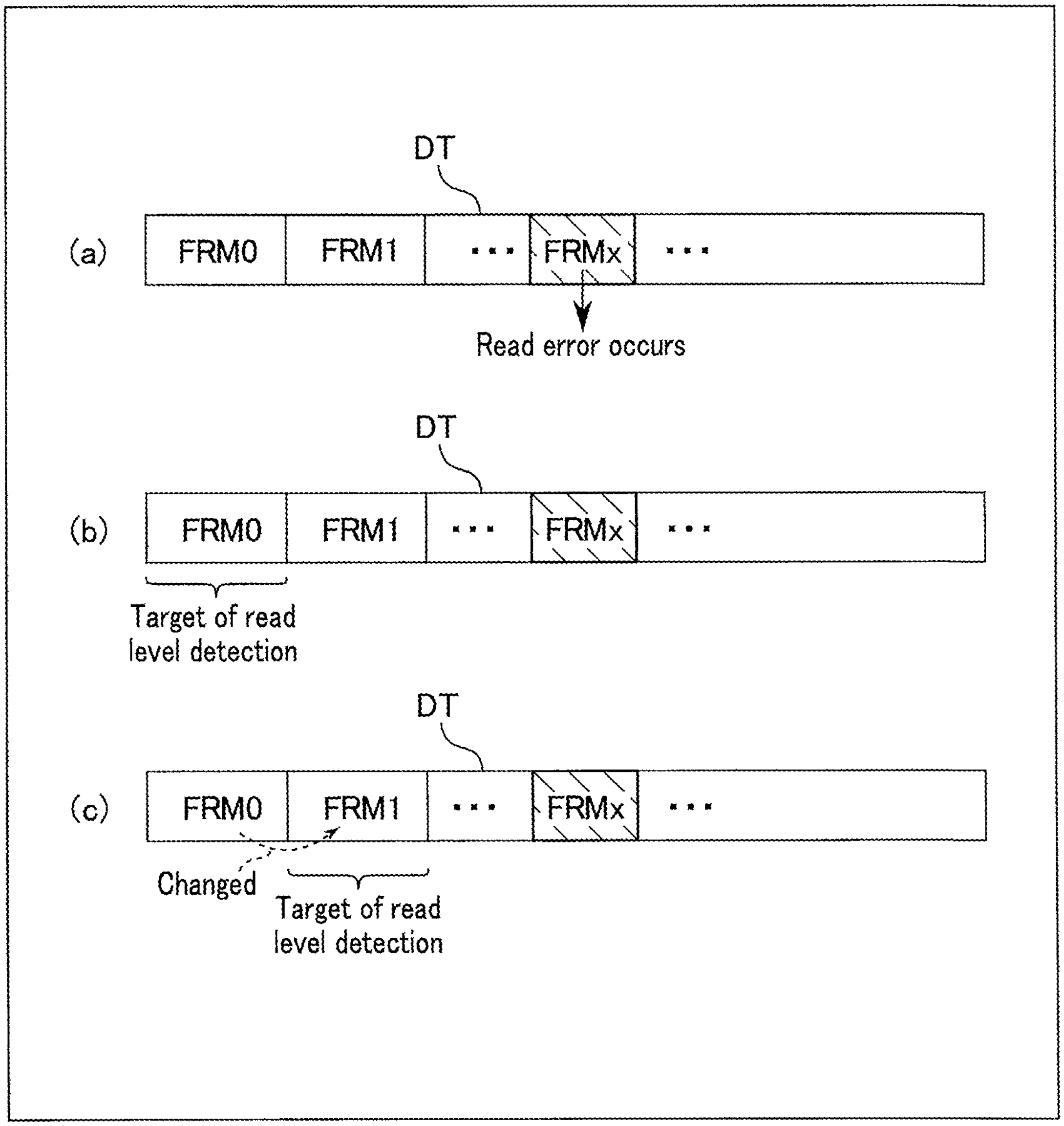

FIG. 13 is schematic diagram illustrating a concept of a read level detection process (a read level determination process) in the memory system of the present embodiment.

As illustrated in FIG. 13, in the present embodiment, counting of the number of error bits in erroneous reading at each read level, calculation of the evaluation index, and calculation of the shift amount are executed on data (frame data) in units of frames.

For example, as illustrated in (a) of FIG. 13, a read error occurs in a certain frame FRMx of read data DT read at a selected address.

As shown in (b) of FIG. 13, in the memory system of the present embodiment, when a read error occurs, the memory controller 100 sets another frame (for example, frame FRM0) at the same selected address as the frame FRMx in which the read error has occurred, as a processing target of detection of the read level. The memory controller 100 executes various processes (for example, ECC process and calculation process) for detecting the read level on the data of the frame FRM0 set as the processing target.

Note that, as illustrated in (c) of FIG. 13, in the present embodiment, when the process using the processing target frame fails, the memory controller 100 further changes the processing target to another frame (for example, frame FRM1) and continues the process of detecting the read level.

As described above, in the present embodiment, the memory controller 100 calculates and determines a read level more suitable for reading data at the selected address by processing in units of frames (units of frame data).

Accordingly, in the present embodiment, the memory controller 100 executes reading of correct data at the selected address including the frame in which the read error has occurred.

As described above, in the memory cell array having a three-dimensional structure, characteristics of a plurality of memory cells connected to a certain word line of a certain block are similar.

Therefore, the results of detection of the calculated read level in units of frame units is set and managed as the information on the read levels of the string units.

(1c) Operation Example

An operation example (control method) of the memory system of the present embodiment will be described with reference to FIGS. 14 to 23.

FIG. 14 is a flowchart for describing the operation example of the memory system of the present embodiment. In the present embodiment, at the time of execution of a read operation instructed by the host device (hereinafter, referred to as host read), the calculation process of shift amount of the read level in units of frame units at the address to be read is executed.

In the present embodiment, after the start of use of the memory system (NAND flash memory 10) (for example, after power-on of the memory system), the memory system 1 of the present embodiment executes a write operation and a read operation in response to a command from the host device 2.

At the time of data writing, the memory controller 100 encodes the write data from the host device 2, for example, by the encoding circuit 161 of the error check and correction circuit 160.

The write data is divided into a plurality of pieces of data (user data) UD of a predetermined data size in a unit (frame FRM) for the ECC process, managed, and controlled.

An encoding process is performed on each of the plurality of user data UD. The parity data PD is attached to each user data UD. Accordingly, a plurality of pieces of frame data is formed.

The memory controller 100 instructs the selected flash memory 10 in the NAND package group 200 to write data (for example, page data) including the plurality of frame data FDs as write data at a certain address of the selected flash memory 10 in the NAND package group 200. The selected flash memory 10 executes the write operation based on a known technique.

At the time of read reading, the memory system 1 of the present embodiment executes the process flow illustrated in FIG. 14.

[S1]

The host device 2 instructs (requests) the memory system 1 to read data.

The host device 2 sends a command (host command) for reading data to the memory controller 100.

The memory controller 100 receives the host command.

[S2]

The memory controller 100 issues a command (controller command) based on the host command. The memory controller 100 sends the controller command and an address related to data reading to the flash memory 10. For example, when the data requested based on the host command is data of a certain frame FRM, the memory controller 100 sends the address of the page PG including the frame FRM to the flash memory 10.

The flash memory 10 executes a read operation at the address ADD based on the controller command and the address.

In the flash memory 10, the sequencer 17 decodes the controller command and the address. The sequencer 17 determines that the operation to be executed is a read operation based on the decoding result of the command. The sequencer 17 controls the operations of the plurality of circuits so as to execute the read operation on the decoding result of the address (selected address). Accordingly, the sequencer 17 accesses the memory cell array 11.

In the flash memory 10, the sequencer 17 reads data (read data) SR of one page from the selected page of the selected string unit in the selected word line of the selected block.

The sequencer 17 sends read data for one page to the memory controller 100 via an input/output circuit (not illustrated) in the flash memory 10.

The memory controller 100 receives the read data from the flash memory 10. In the memory controller 100, the processor 130 stores the read data in the work memory 120, the error check and correction circuit 160, and/or the voltage correction circuit 180.

[S3]

The memory controller 100 executes the ECC process on the read data. In the memory controller 100, the processor 130 causes the error check and correction circuit 160 to execute the ECC process on the received read data. The processor 130 transmits the read data SR from the work memory 120 to the error check and correction circuit 160.

The error check and correction circuit 160 executes the ECC process on the read data. For example, the error check and correction circuit 160 executes the ECC process on read data (pre-error correction read data) of one page in units of frames.

The error check and correction circuit 160 executes the ECC process (decoding process) on the user data UD in units of frames FRM, using the parity data PD in each frame FRM for a plurality of pieces of frame data (pre-error correction frame data) in the read data.

The error check and correction circuit 160 may execute the ECC process only on a specific frame (for example, a frame to be read) FRM, by using the parity data PD of the frame FRM, without performing the ECC process on the plurality of frames FRM in the read data.

The error check and correction circuit 160 determines whether there is an error in the user data UD of the frame FRM to be subjected to the ECC process (hereinafter, also referred to as target frame), based on the information obtained from the parity data PD.

When an error is detected in the user data UD, the error check and correction circuit 160 corrects the detected error.

[S4]

In the memory controller 100, the processor 130 determines whether the correction of the error in the data by the ECC process for the target frame FRM has succeeded.

When the correction of the error in the data by the ECC process has succeeded (Yes in S4), the processor 130 ends the ECC process on the frame data in the target frame.

When the correction of the error in the data by the ECC process has failed (No in S4), the processor 130 determines that the executed read operation has ended up with a read error.

[S5]

When the executed read operation has ended up with a read error, the memory controller 100 executes a read level detection process (referred also to as read level calculation process) using one or more pieces of data in units of frames in order to read correct data of the target frame FRM.

For example, the processor 130 causes the voltage correction circuit 180 to calculate a read level used for reading a frame in which a read error has occurred (and a selected page including the frame).

The voltage correction circuit 180 executes the calculation process of shift amount of the read level, based on the result of reading the data of the target frame, the result of the ECC process on the data of the target frame, the result of reading the data of the frames in the vicinity of the target frame (hereinafter, referred to as neighboring frames), and the result of the ECC process on the data of the neighboring frames, using the plurality of processes of FIGS. 10 to 12 described above.

A specific example of the calculation process of shift amount of the read level (read level detection process) by processing in units of frame data will be described later.

[S6]

In the memory controller 100, the processor 130 determines whether the calculation of shift amount of the read level (detection of the read level) by the calculation process of the voltage correction circuit 180 has succeeded.

[S7]

When the calculation of shift amount of the read level has succeeded (Yes in S6), the memory controller 100 causes the flash memory 10 to execute the read operation using the read level including the calculated shift amount (hereinafter, referred also to as corrected read level). The memory controller 100 determines the read level including the calculated shift amount used for the read operation.

The processor 130 sends the read level parameter corresponding to the result of calculation by the voltage correction circuit 180 together with the command and the address ADD to the flash memory 10.

In the flash memory 10, the sequencer 17 executes the read operation again on the selected address using the read level corresponding to the calculation result (shift amount).

The flash memory 10 sends the data read at the corrected read level (hereinafter, referred to as re-read data) to the memory controller.

[S8]

The memory controller 100 executes the ECC process on the re-read data. In the memory controller 100, the processor 130 causes the error check and correction circuit 160 to execute the ECC process on the received re-read data, as in the process S3.

In the memory controller 100, the processor 130 determines whether the ECC process on the re-read data has succeeded.

[S10]

When the correction of the error in the data by the ECC process has succeeded (Yes in S9), the processor 130 determines that the read operation has succeeded.

The processor 130 sends the data obtained by the re-read operation to the host device 2.

[S11]

The memory controller 100 updates the information in the voltage information table TBL.

In the memory controller 100, the processor 130 rewrites the value (DAC value) of the shift amount at the address (for example, the frame unit FU) where to read data in the voltage information table TBL as the value indicating the shift amount obtained by the read level calculation process in S5.

As described above, the read operation of the memory system of the present embodiment is completed by the read operation based on the calculation result of the read level calculation process.

[S19]

When the calculation of shift amount of the read level has failed (No in S6) or when the correction of the error in the re-read data by the ECC process has failed (No in S9), the processor 130 executes a retry sequence (S19).

For example, the memory controller 100 performs soft bit decoding according to a predetermined algorithm. The memory controller 100 sends the data corrected by the soft bit decoding to the host device 2.

The memory controller 100 determines whether the variation in the threshold distribution or the number of error bits is within the allowable range, based on the result of the soft bit decoding. When determining that the variation in the threshold distribution or the number of error bits is within the allowable range, the memory controller 100 ends the read operation without executing a refresh process.

When determining that the variation in the threshold distribution or the number of error bits is out of the allowable range, the memory controller 100 determines to execute the refresh process. The memory controller 100 executes refresh process on the flash memory 10. The refresh process is, for example, a process for bringing the varied threshold distribution close to the state of the ideal threshold distribution or a process for keeping the number of error bits within a predetermined allowable range, by rewriting data having undergone error correction based on soft bit decoding in the memory cell array 11. When the read level calculation process has failed and when the error correction of the re-read data has failed by the processing in step S19, the read operation in the memory system of the present embodiment is ended.

As described above, the memory system of the present embodiment can set the read level to be used for reading the data of the frame FRM to be read (and the page including the frame), to a more suitable value.

(1c-1) Read Level Calculation Process

A specific example of the memory system of the present embodiment will be described with reference to FIGS. 15 to 23.

Figure 15:
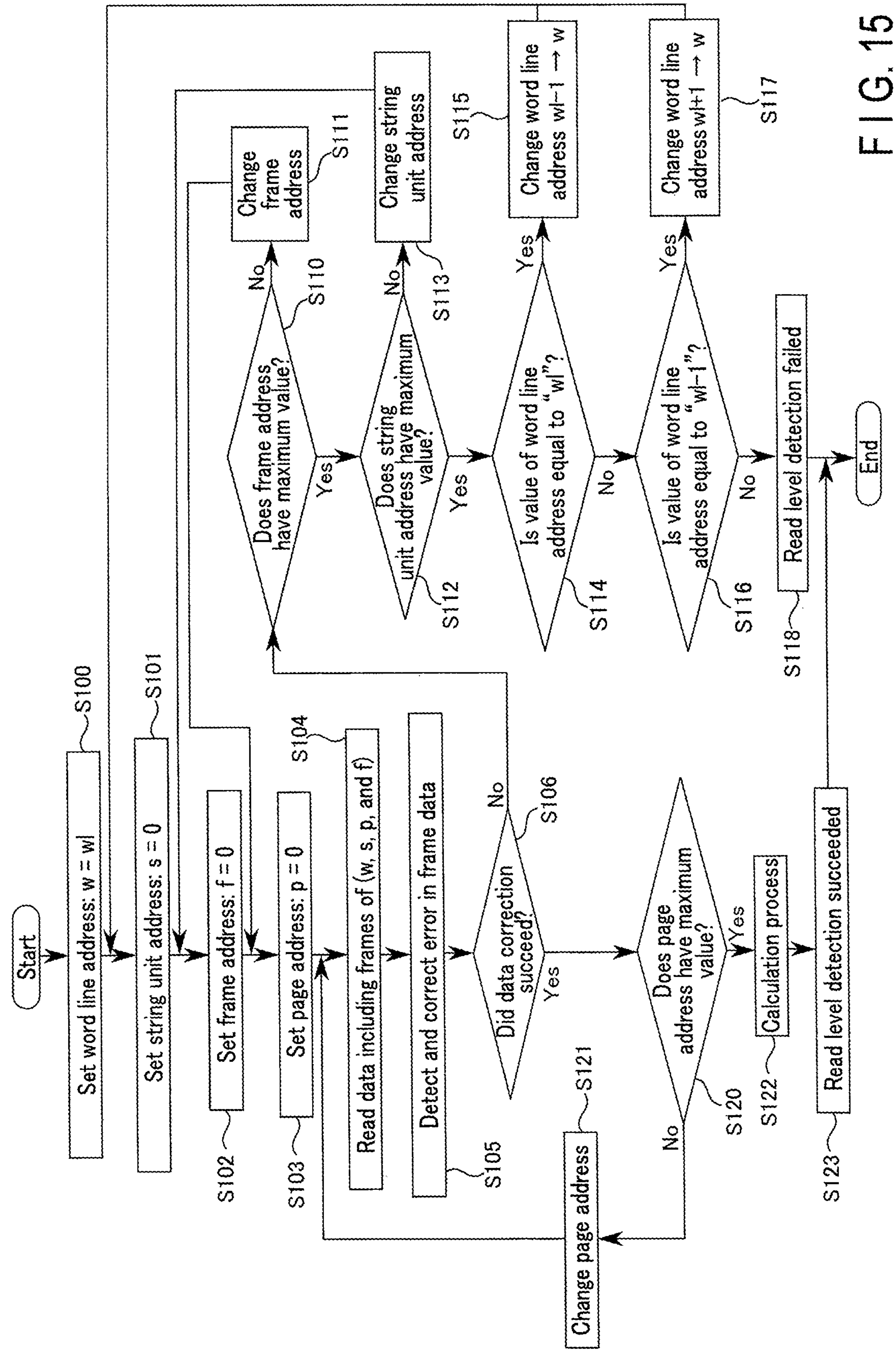

FIG. 15 is a flowchart illustrating an example of a read level detection process in the memory system of the present embodiment. FIGS. 16 to 22 are schematic diagrams for describing the read level calculation process in the memory system of the present embodiment.

In this example, the read level calculation process in the memory system of the present embodiment is executed using the read result of one or more frames (for example, a frame unit).

In this example, the identification number of the word line (word line address) at the selected address is denoted as “w”, the identification number of the string unit (string unit address) is denoted as “s”, the identification number of the page (page address) is denoted as “p”, and the identification number of the frame (frame address) is denoted as “f”.

In the present embodiment, the read level calculation process is executed on the frame in which a read error has occurred (the frame as a target of read level calculation), using the data of all the pages (in the present embodiment, data of three pages) belonging to a certain word line.

[S100 to S103]

As illustrated in FIG. 15, during the read level calculation process, the memory controller 100 sets various values at the selected address including the calculation target frame according to the calculation target frame of the read level.

Figure 16:
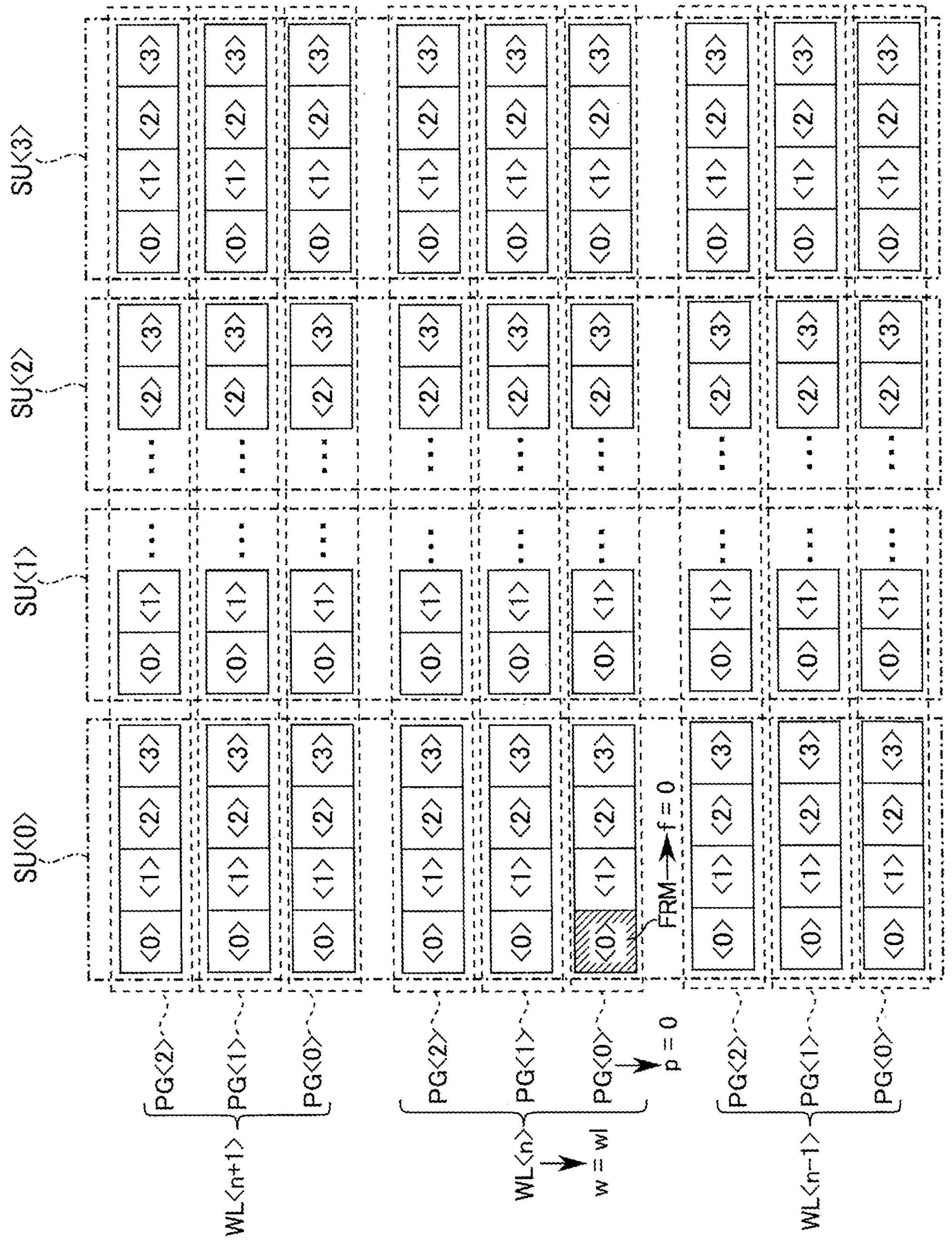
FIGS. 16, 17, 18, 19, 20, 21, and 22 are schematic diagrams illustrating an operation example of the memory system according to the first embodiment.

For example, as illustrated in FIG. 16, the memory controller 100 sets the word line address value (“w”) to the value “wl” of the word line (selected word line at the selected address) WL including the frame as a calculation target (frame unit FU) (S100).

The memory controller 100 sets the string unit address value (“s”) to “0”, for example (S101).

The memory controller 100 sets the frame address value “f” to “0”, for example (S102).

The memory controller 100 sets the page address value (“p”) to “0”, for example (S103).

When the page address value at the selected address at the time of host read is “0”, data (read data) in the work memory 120 or the error check and correction circuit 160 may be used without reading from the flash memory 10 again.

In a flash memory having a memory cell array with a three-dimensional structure, characteristics of a plurality of memory cells are similar as long as the memory cells belong to the same word line of the same block.

Therefore, as in this example, various processes (for example, data reading and frame calculation process) for calculation of the read level may be executed in order from the frame belonging to the first frame address unit among the plurality of frames in the selected word line, without depending on the address value of the frame in which the read error has occurred.

Here, the value of the selected string unit address, the value of the selected frame address, and the value of the selected page address are all set to “0” as an example, but may be set to a value (integer) of 1 or greater, according to the address of the frame in which the error has occurred.

After setting the address values, the memory controller 100 orders the flash memory 10 to execute a read operation at the set address. In the memory controller 100, the processor 130 sends the command and the addresses including the set values to the flash memory 10.

[S104]

In the flash memory 10, the sequencer 17 controls operations of a plurality of circuits for a read operation. Accordingly, the sequencer 17 reads the data of the frame FRM (frame data) at the address (for example, (w, s, p, f)=(wl, 0, 0, 0)), from the memory cell array 11.

The flash memory 10 sends the read data to the memory controller 100. The memory controller 100 receives read data (pre-error correction read data).

[S105]

In the memory controller 100, the processor 130 causes the error check and correction circuit 160 to execute the ECC process on the frame data in the read data.

For example, referring to FIG. 16, the error check and correction circuit 160 acquires data (pre-error correction frame data) of the frame FRM having the address of (wl, 0, 0, 0) from the pre-error correction read data of one page at the selected address, and executes the ECC process (error correction) on the acquired data of the frame FRM.

[S106]

The processor 130 determines whether the correction of the error in the frame data by the ECC process has succeeded.

[S110]

When the error correction of the frame data has failed (No in S106), the processor 130 determines in step S110 whether the frame address value “f” has reached the maximum value (“fMAX”) of the number of frame units included in one string unit (the number of frames of one page in one string unit). For example, when one string unit includes four frame units FU, the value “f” may take values of “0”, “1”, “2”, and “3”. In this case, the value of “fMAX” is “3”.

[S111]

When the frame address value “f” has not reached the maximum value “fMAX”, the processor 130 changes the frame address value in step S111. For example, the processor 130 increments the frame address value “f”.

Figure 17:
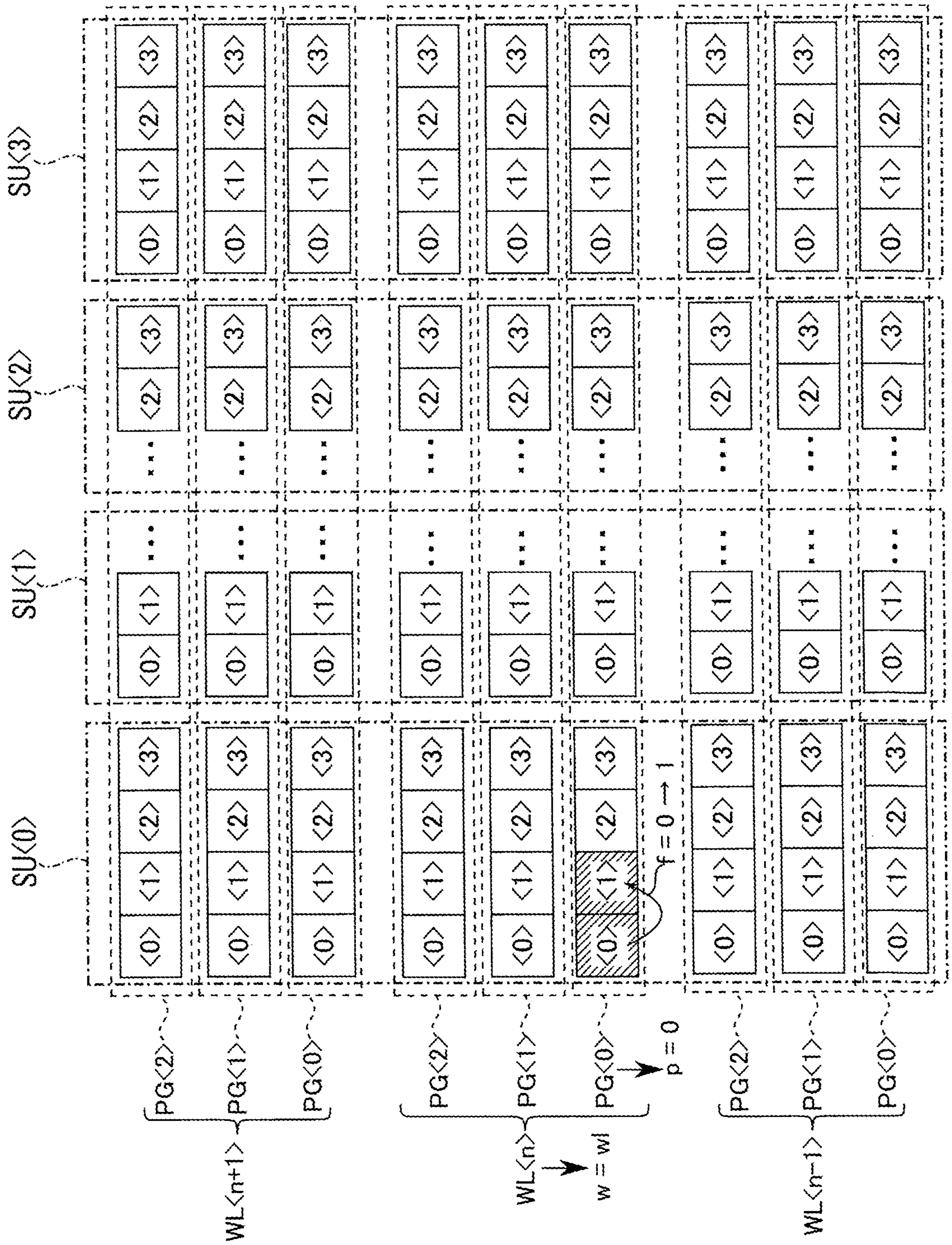

In the example of FIG. 17, the frame address value “f” changes from “0” to “1”. As a result, the frame used for calculating the read level (the frame unit to which the frame belongs) is changed from a certain frame to one adjacent frame.

When the frame address value “f” has not reached the maximum value “fMAX”, the processor 130 sets the page address value “p” to “0”. Accordingly, when the frame address value is updated, the page address value is reset to the initial value.

Thereafter, the processor 130 executes the processing of steps S104 to S106. At this time, the processor 130 orders the flash memory 10 to execute the read operation at the address (here, (w, s, p, f)=(wl, 0, 0, 1)) including the incremented frame address value “f=1”.

[S112]

When the frame address value “f” has reached the maximum value “fMAX” (Yes in S110), the processor 130 determines whether the string unit address value “s” has reached the maximum value (“sMAX”) of the number of string units included in one word line WL.

For example, when one word line WL (block BLK) includes four string units SU, the value “s” can take values of “0”, “1”, “2”, and “3”. In this case, the value of “sMAX” is “3”.

[S113]

When the string unit address value “s” has not reached the maximum value “sMAX”, the processor 130 changes the string unit address value “s”. For example, the processor 130 increments the string unit value “s”.

Figure 18:
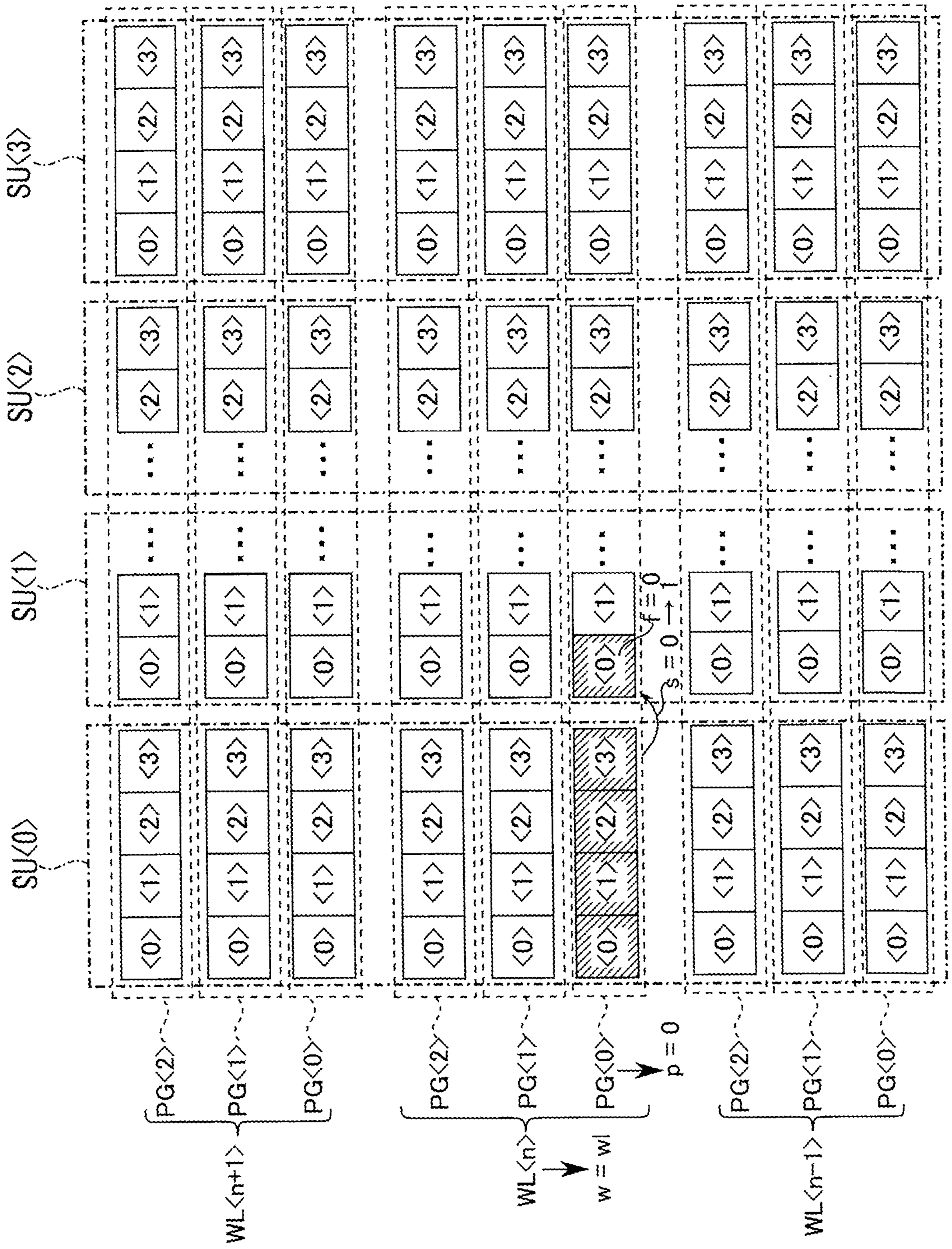

As shown in FIG. 18, when the string unit value “s” is “0”, the string unit value is set to “1”. Accordingly, the calculation target of the read level is changed from the frame unit in the string unit SU<0> to the frame unit in the string unit SU<1>.

The processor 130 sets the frame address value “f” to “0” (S102), and sets the page address value “p” to “0” (S103).

Thereafter, the processor 130 executes the operations of steps S104 to S106. In this manner, the calculation process of the read level is executed based on the read results of the plurality of frame units in the changed string unit.

[S114]

When the string unit address value “s” has reached the maximum value “sMAX” (Yes in S112), the processor 130 determines in S114 whether the word line address value “w” is equal to the value “wl”.

[S115]

When the word line address value “w” is equal to the value “wl” (No in S114), the processor 130 sets the word line address value “w” to “wl−1”.

Figure 19:
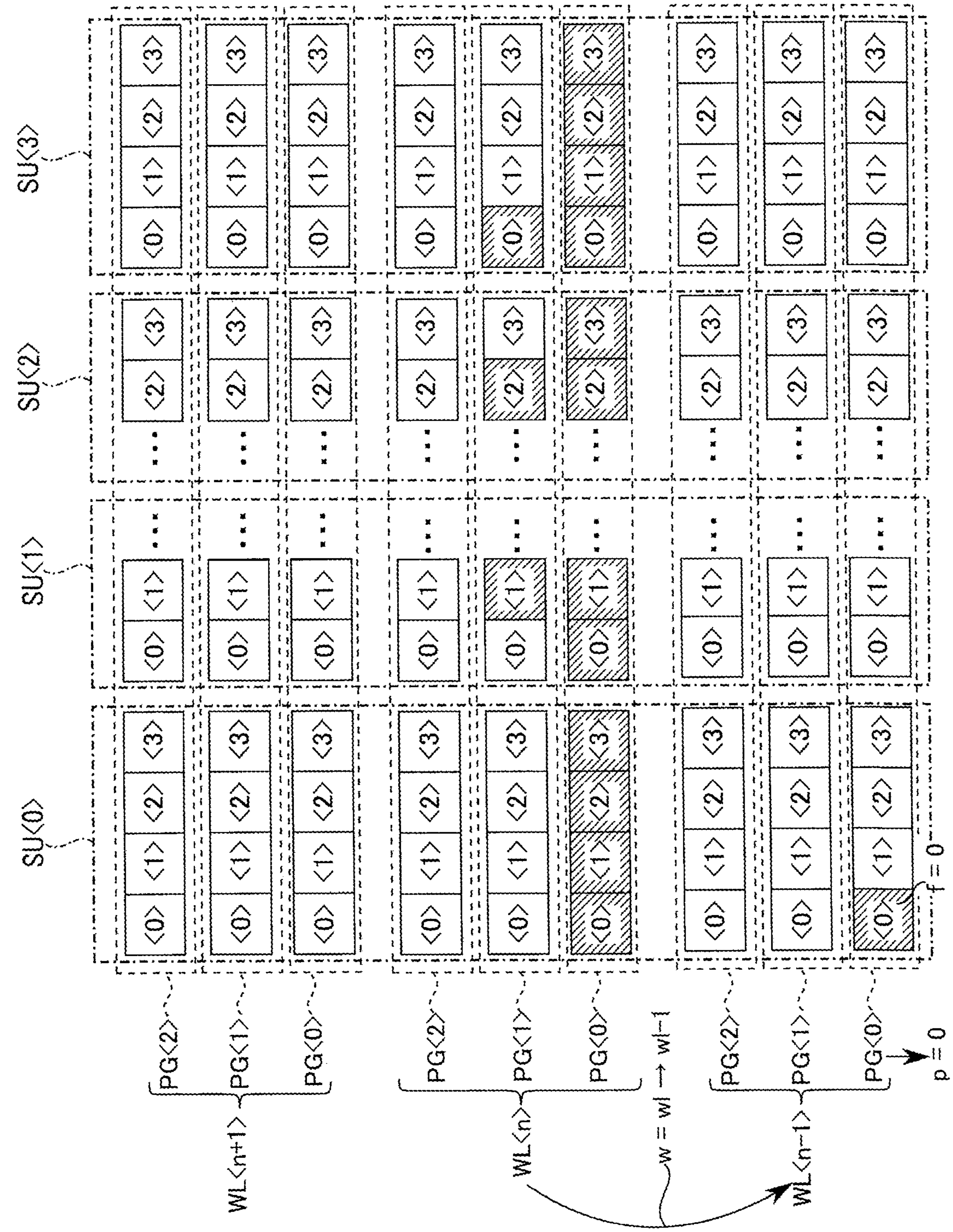

Accordingly, as illustrated in FIG. 19, one word line (word address value “wl−1”) of the two word lines WL<n−1> and WL<n+1> adjacent to the word line WL<n> (address value “wl”) at the initial selected address is selected as a new selected word line.

As a result, the plurality of frame units in the word lines adjacent to the selected address is set as the target of the read level detection.

After step S115, the processor 130 executes the processing of steps S101 to S106. When the correction of the frame data in the word line WL<n−1> having the address value “wl−1” has failed (No in S106), the processor 130 executes the processes of steps S110 to S111.

[S116]

When the word line address value “w” is different from the value “wl” (No in S114), the processor 130 determines whether the word line address value “w” is equal to the value “wl−1”.

[S117]

When the word line address value “w” is equal to “wl−1” (Yes in S116), the processor 130 sets the word line address value “w” to “wl+1”.

Figure 20:
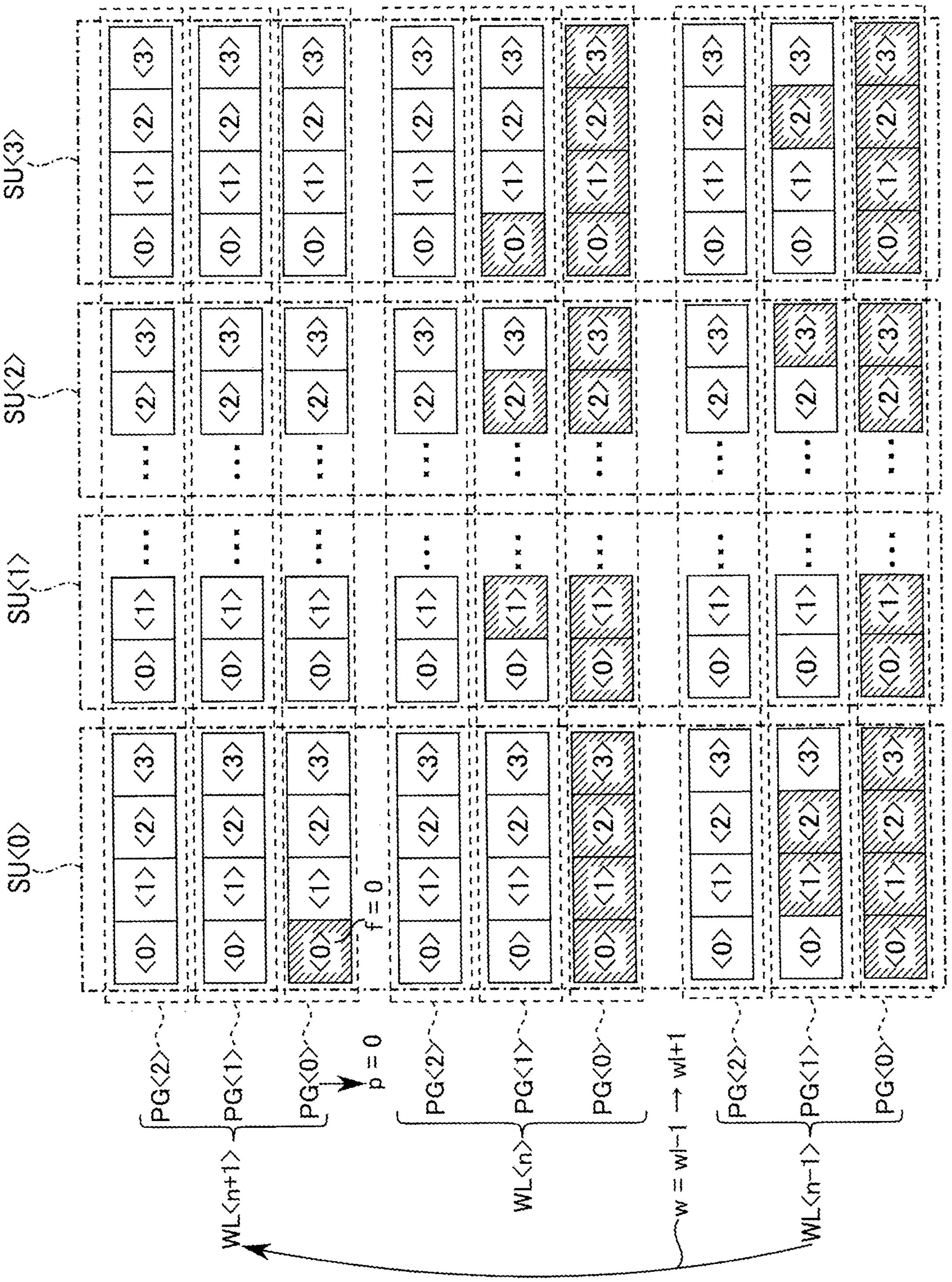

Accordingly, as illustrated in FIG. 20, the other word line (address value “wl+1”) of the two word lines WL<n−1> and WL<n+1> adjacent to the word line WL<n> (address value “wl”) at the initial selected address is selected as a new selected word line.

As a result, the plurality of frame units in the word lines adjacent to the selected address is set as the target of the read level detection.

After step S117, the processor 130 executes the processing of steps S101 to S106. When the correction of the frame data in the word line WL<n+1> having the address value “wl+1” has failed (No in S106), the processor 130 executes the processing in steps S110 to S116.

[S118]

When the word line address value “w” is different from “wl−1” (No in S116), the processor 130 determines that the detection of the read level has failed.

As described above, when the correction of the error in the data at the selected address has failed, the detection of the suitable read level at the selected address is executed by the calculation process on the frame units of the word lines adjacent to the selected word line.

[S120]

When the correction of the error in the frame data has succeeded (Yes in S106), the processor 130 determines in step S120 whether the page address value “p” has reached the maximum value (“pMAX”) of the page address value “p” allocated to one word line WL. For example, the processor 130 determines whether the page address value “p” is equal to the value “pMAX”.

The maximum value of the page address value “p” depends on the number of pages allocated to one word line. The number of pages allocated to one word line depends on the number of bits that can be stored in one memory cell. When one memory cell can store 3-bit data, the page address value “p” can take three values of “0”, “1”, and “2”. For example, when one word line includes three pages, the value of fMAX is “2”.

[S121]

When the page address value “p” has not reached the maximum value “pMAX”, the processor 130 changes the page address in step S121. For example, the processor 130 increments the value of the page address value “p”. When the current page address value “p” is “0”, the page address value “p” changes from “0” to “1”. After changing the page address value, the processor 130 executes the processing of S104 to S106.

The memory controller 100 orders the flash memory 10 to execute a read operation at the updated address.

Figure 21:
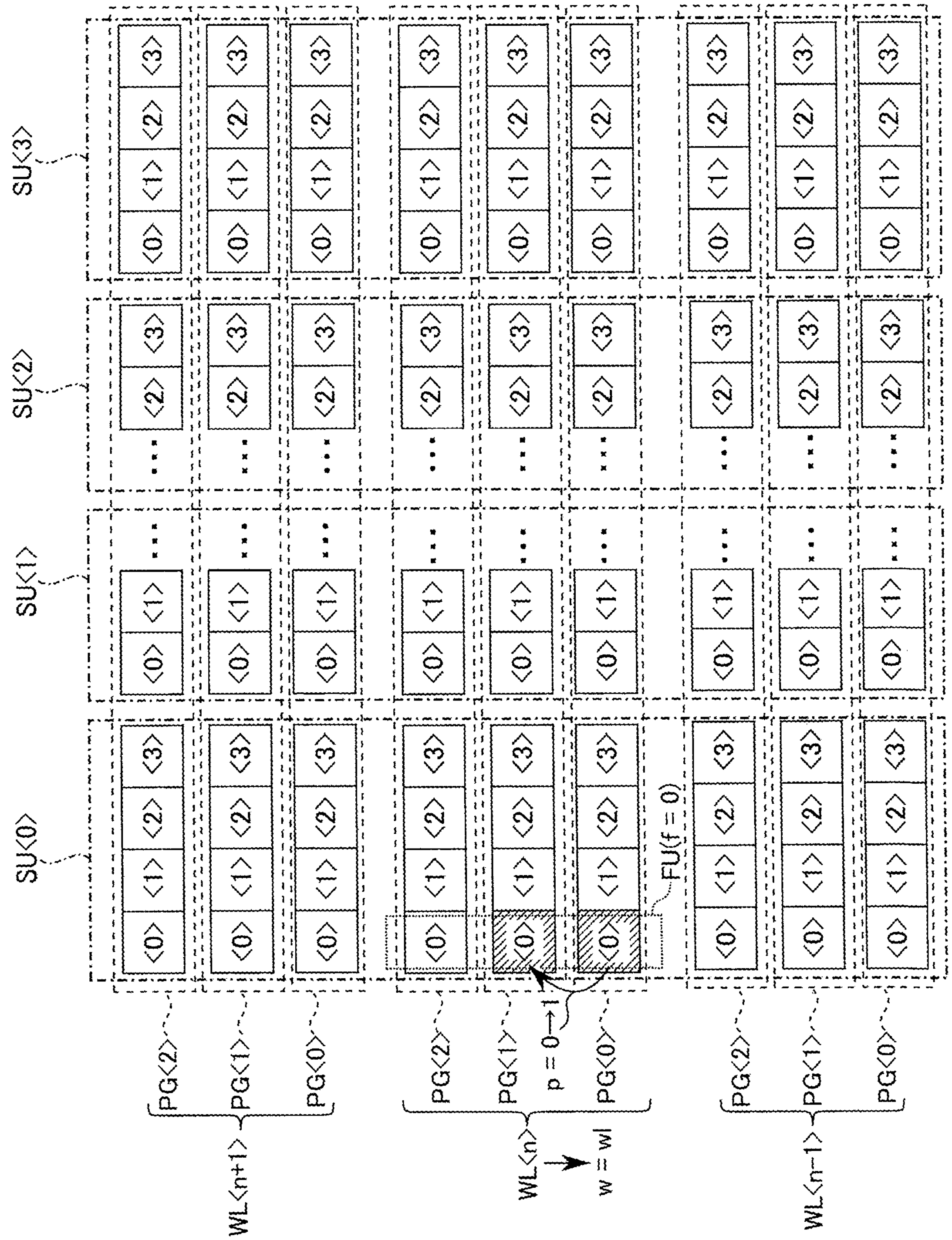

For example, as illustrated in FIG. 21, in the memory controller 100, the processor 130 orders the flash memory 10 to perform a read operation at an address (here, (w, s, p, f)=(wl, 0, 1, 0)) including the incremented page address value.

The processor 130 sends the read command and the updated address to the flash memory 10.

In the flash memory 10, the sequencer 17 executes a read operation at the updated address (S104). The flash memory 10 sends the read data (page data) at the updated address to the memory controller 100.

In the memory controller 100, the processor 130 executes the ECC process on the target frame data in the read data (S105).

For example, in the example of FIG. 21, the ECC process is executed on the frame FRM<0> of the page PG<1> in the word line WL<n> (=wl). The frame FRM<0> of the page PG<1> belongs to the same frame unit FU as the frame FRM<0> of the page PG<0> for which the error correction has succeeded.

The processor 130 determines whether the error correction to the frame data at the updated address has succeeded (S106).

When the error correction to the frame data has succeeded, the processor 130 updates the page address. The processor 130 increments the value of the page address “p”.

The memory controller 100 determines whether the page address value “p” has reached the maximum value “pMAX” of the page address value (S121).

The memory controller 100 repeatedly executes the processing of steps S104, S105, S106, S120, and S121 until the page address value “p” reaches the maximum value “pMAX” of the page address value.

[S122 and S123]

Figure 22:
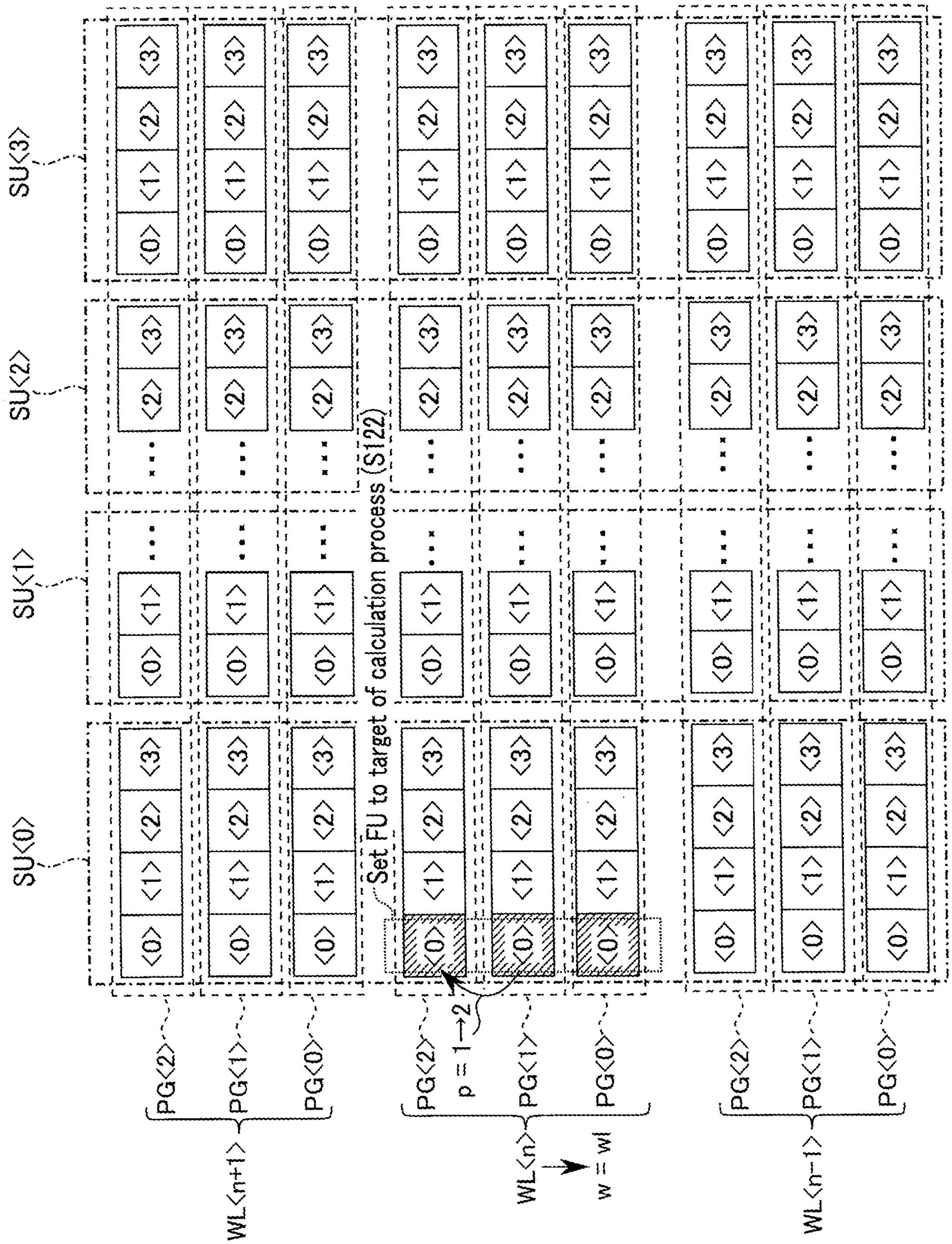

When the page address value “p” has reached the maximum value “pMAX” (where p=2), as illustrated in FIG. 22, this indicates that the pre-error correction frame data and the post-error correction frame data of the plurality of frames FRM (here, the frames FRM<0>) constituting the frame unit FU in a certain word line WL are available.

Accordingly, in the present embodiment, the memory controller 100 executes the calculation process of detecting the read level using the plurality of pieces of data of the frame unit.

The processor 130 instructs the voltage correction circuit 180 to execute the calculation process of the read level.

When the memory cell is an SLC, the process flow in FIG. 15 proceeds to step S122 after Yes in step S106, without incrementing the page address value and determining the page address value.

FIG. 23 is a flowchart illustrating the calculation process of the read level in the memory system of the present embodiment.

The calculation process of the read level is executed by the processing based on FIGS. 10 to 12 described above along the process flow of FIG. 23.

In the present embodiment, the calculation process of the read level is executed using a plurality of pieces of pre-error correction frame data SR and a plurality of pieces of post-error correction frame data EXP belonging to the frame unit.

As illustrated in FIG. 23, the count circuit 182 of the voltage correction circuit 180 counts the number of occurrences (the number of bits) of combinations of values that can be taken by the pre-error correction frame data and the post-error correction frame data for the plurality of pieces of frame data of the frame unit FU to which the error correction has succeeded, as described with reference to FIG. 10 (S90).

As described with reference to FIG. 11, the selection circuit 183 of the voltage correction circuit 180 selects a set of combinations of count values to be compared (S91).

As described with reference to FIG. 12, the evaluation index calculation circuit 184 of the voltage correction circuit 180 calculates the evaluation index "r" based on the set of selected combinations (S92).

The shift amount calculation circuit 185 of the voltage correction circuit 180 calculates the shift amount "Δ" of the read level based on the calculated evaluation index "r" (S93).

The read level is set based on the shift amount "Δ" obtained by this calculation process. In this manner, the read level more suitable for reading data at the address including the frame in which the error has occurred is obtained.

By this detection of the read level, the processor 130 determines that the calculation of the read level has succeeded (S123). The processor 130 determines the read level including the shift amount based on the detection of the read level.

By the above operation, the read level calculation process (read level detection process) in the memory system of the present embodiment ends. Thereby, the processor 130 determines a read level more suitable for reading data at the selected address in a read operation based on the read level calculation process.

As described above, if a read error occurs, a more suitable read level (read level including the shift amount) is acquired in order to read data at the address where the read error has occurred by the calculation of the read level in units of frame data in the memory system of the present embodiment.

In the read level detection process according to the host read, the calculation process of the shift amount of the read level may be executed using only the plurality of frames belonging to the selected page as a target of the host read, without using the plurality of frame data belonging to the non-selected page in the host read. In this case, one or more read levels (shift amounts of the read level) used for reading the selected page are detected.

(1d) Conclusion

The memory system of the present embodiment executes the ECC process and the read level detection process (for example, the calculation of the correction amount of the read level) in units of a plurality of frames included in the read data.

In a memory cell array having a three-dimensional structure of a NAND flash memory, a plurality of memory cells connected to one word line in a certain block have substantially the same characteristics.

Therefore, the plurality of memory cells connected to the same word line may have similar tendencies about the read level.

At the time of reading certain page data, if an error in data of a certain frame in the page data is uncorrectable, the read level used for reading the page data may not have a value suitable for reading the data at the address.

In this case, in view of the similarity of the characteristics of the memory cells, there is a high possibility that the values of the read levels for a plurality of frames belonging to the same frame unit as the frame including the uncorrectable error are inappropriate values.

Therefore, there is a possibility that the read level information related to all the pages associated with the frame unit is lost.

When an error in a certain frame of data (frame data) at a certain address is uncorrectable, the memory system of the present embodiment calculates the read level (for example, the shift amount of the read level) used for reading the certain data based on the correction result of an error in another frame in the data.

Accordingly, in the memory system of the present embodiment, the read level suitable for reading data at a certain address is detected.

As described above, since the plurality of memory cells connected to the same word line have similar characteristics, there is a possibility that correct data can be read from the frame in which error correction is impossible, by diverting the read level obtained based on the read result of the memory cell belonging to the frame in which error correction is possible to the read level for reading data from the memory cell belonging to the frame in which error correction is impossible, as in the present embodiment.

Accordingly, the memory system of the present embodiment can improve the possibility of acquiring correct data even when a read error occurs in a part of read data.

As a result, the memory system of the present embodiment ensures the reliability of data reading.

As described above, the memory system of the present embodiment can improve the characteristics of the memory system.

(2) Second Embodiment

A memory system according to a second embodiment will be described with reference to FIGS. 24 to 29.

Figure 24:
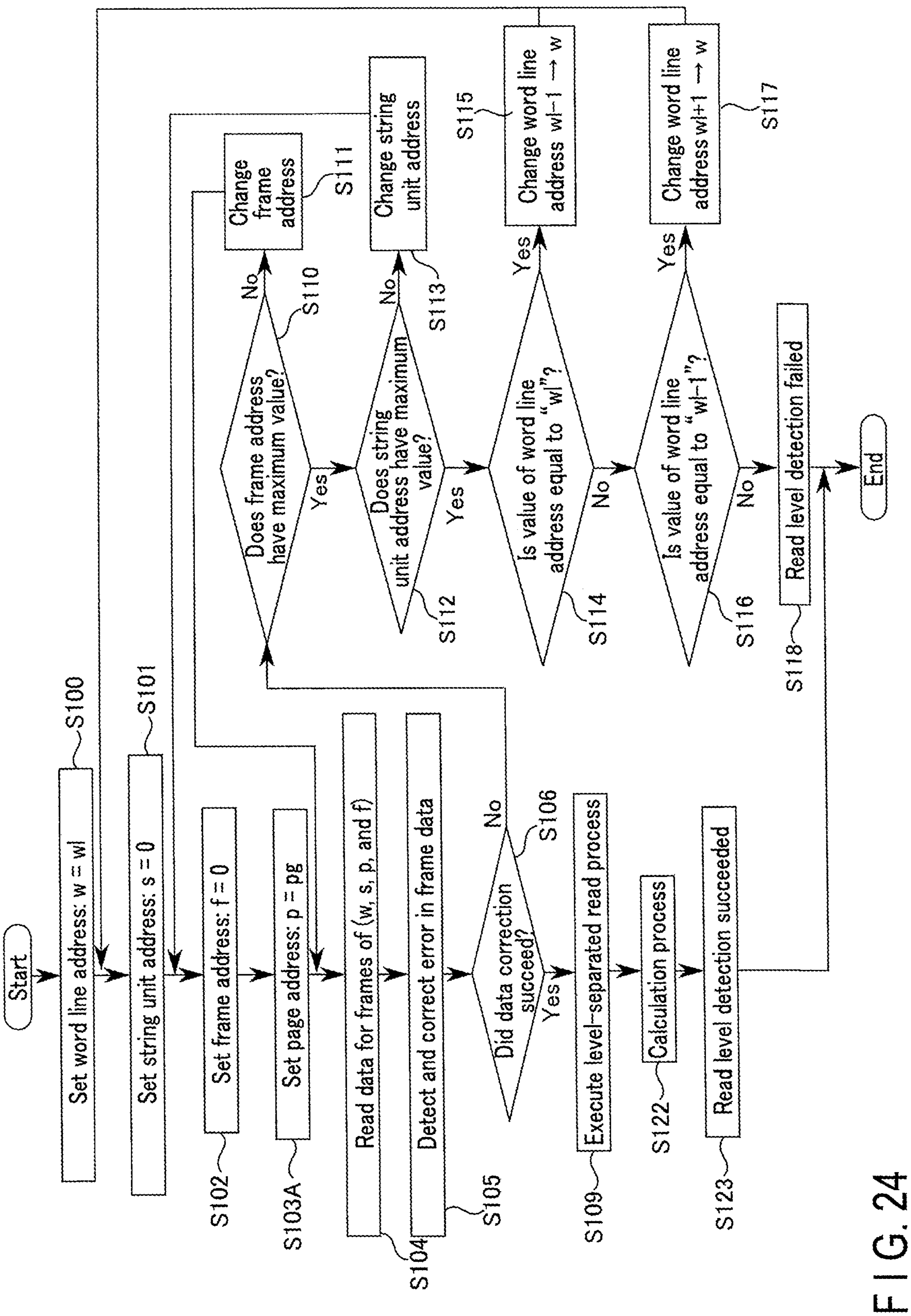
FIG. 24 is flowchart illustrating an operation example of the memory system according to a second embodiment.

FIG. 24 is a flowchart illustrating an operation example of the memory system of the present embodiment. FIG. 24 illustrates a process flow of read level detection process in the memory system of the present embodiment.

As illustrated in FIG. 24, when the correction of the error in the frame to be subjected to the ECC process has succeeded (Yes in S106), the memory system of the present embodiment executes a level separation process including a single-state read process in step S109 before the calculation of the shift amount of the read level.

The single-state read process is a process of, by applying one read level to the selected address (selected word line), determining the magnitude relationship among the threshold voltages of the memory cells with respect to the applied read level.

In the single-state read process, the number of frequencies with which the read level is applied to the selected address is smaller than that in the case of data reading in which the data at the selected address is determined using a plurality of read levels. As a result, the single-state read process can shorten a processing period in the memory system.

The memory system of the present embodiment can execute, by using the single-state read process, the detection of the read level (for example, the calculation of shift amount of the read level) using the frame unit FU from the data of one page read from the flash memory.

FIG. 25 is a block diagram for describing an internal configuration of a voltage correction circuit of a memory controller in the memory system of the present embodiment.

As illustrated in FIG. 25, in the present embodiment, the voltage correction circuit 180 further includes a separated data generation circuit 189.

The separated data generation circuit 189 can execute various arithmetic processes such as a negation (NOT) operation, a logical disjunction (OR) operation, and a logical conjunction (AND) operation. The separated data generation circuit 189 can execute various arithmetic processes on the data in a memory circuit 181.

The separated data generation circuit 189 can extract (separate) a part of the data having undergone the arithmetic process (or of the data in a buffer circuit) under a predetermined condition. Hereinafter, the extracted part of the data will be referred to as separated data.

The separated data generation circuit 189 sends the separated data to a count circuit 182.

The separated data will be specifically described later.

As described below, in the memory system of the present embodiment, at the time of execution of the read level detection process (S5) of FIG. 14, various processes are executed along the process flow of FIG. 24.

[S100, S101, and S102]

In the memory controller 100, a processor 130 sets a word line address value "w" to "wl" as in the first embodiment (S100). The processor 130 sets a string address value "s" to "0" (S101). The processor 130 sets a frame address value "f" to "0" (S102).

[S103A]

In the present embodiment, in step S103A, the processor 130 sets a page address value "p" to a value "pg" corresponding to the selected address (selected page address) at the time of host read. In the present embodiment, the page address value "p=pg" set at the time of the read level detection process is fixed without change (for example, increment).

After setting each address value, in the memory controller 100, the processor 130 sends the address and the read command to a flash memory 10.

[S104]

In the flash memory 10, the sequencer 17 controls operations of a plurality of circuits for a read operation. Accordingly, a sequencer 17 reads the page data including the frame FRM at the selected address (for example, (w, s, p, f)=(wl, 0, pg, 0)), from a memory cell array 11.

The flash memory 10 sends the read data to the memory controller 100. The memory controller 100 receives read data (pre-correction read data).

The data in a work memory 120 or an error check and correction circuit 160 may be used for the processing of steps S105 and S106 without reading data from the flash memory 10 in step S104.

[S105 and S106]

In the memory controller 100, the processor 130 causes the error check and correction circuit 160 to execute the ECC process on the frame data in the read data (S105).

The processor 130 determines whether the correction of the error in the frame data by the ECC process has succeeded (S106).

[S110 and S111]

When the correction of the ECC process on the frame data has failed (No in S106), the processor 130 determines whether the frame address value "f" has reached the maximum value ("fMAX") of the number of frame units included in one string unit SU as in the first embodiment (S110). When the frame address value "f" has not reached the maximum value ("fMAX") of the number of frame units included in one string unit SU, the processor 130 changes (for example, increments) the frame address value "f" as in the first embodiment (S111).

The processor 130 executes the processing of steps S104 to S106 so as to execute the read operation at the address including the changed frame address value (here, (w, s, p, f)=(wl, 0, pg, 1)).

[S112 and S113]

When the frame address value "f" has reached the maximum value "fMAX" (Yes in S110), the processor 130 determines whether the updated string unit address value "s" has reached the maximum value ("sMAX") of the number of string units included in one word line WL (S112).

When the string unit address value "s" has not reached the maximum value "sMAX" (No in S112), the processor 130 changes (for example, increments) the string unit address value "s" as in the first embodiment (S113). In this case, the processor 130 sets the frame address value "f" to "0" as in the first embodiment (S102). The page address value "p" is maintained at "pg" (S103).

Thereafter, the processor 130 executes the operations of steps S104 to S106. When the correction of the frame data in the word line WL<n−1> having the address value "wl" has failed (No in S106), the processor 130 executes the processing of steps S110 to S113.

[S114 and S115]

When the string unit address value "s" has reached the maximum value "sMAX" (Yes in S112), the processor 130 executes the processing of steps S114 and S115 for the change of the word line address value, as in the first embodiment.

The processor 130 determines whether the word line address value "w" is equal to the value "wl" (S114).

When the word line address value "w" is equal to "wl" (Yes in S114), the processor 130 sets the word line address value "w" to "wl−1" (S115).

After step S115, the processor 130 executes the processing of steps S101 to S106. When the correction of the frame data in the word line WL<n−1> having the address value "wl−1" has failed (No in S106), the processor 130 executes the processes of steps S110 to S114.

[S116, S117, and S118]

When the word line address value "w" is different from the value "wl" (No in S114), the processor 130 executes the processes of steps S116 and S117 for the change of the word line address value, as in the first embodiment.

The processor 130 determines whether the word line address value "w" is equal to the value "wl−1" (S116).

When the word line address value "w" is equal to "wl−1" (Yes in S116), the processor 130 sets the word line address value "w" to "wl+1" (S117).

After step S117, the processor 130 executes the processing of steps S101 to S106. When the correction of the frame data in the word line WL<n+1> having the address value "wl+1" has failed (No in S106), the processor 130 executes the processes of steps S110 to S116.

In step S116, when the word line address value "w" is different from "wl−1", the processor 130 determines that the detection of the read level has failed.

[S109]

When the correction of the error in the frame data has succeeded (Yes in S106), the memory system 1 of the present embodiment executes a level-separated read process in step S109. The level-separated read process includes the single-state read process.

FIG. 26 is a flowchart for describing the level-separated read process.

As illustrated in FIG. 26, in the present embodiment, during the level-separated read process, the memory system 1 executes the single-state read process on the flash memory 10 (S80).

The read level used for the single-state read process is set according to a page address where the read level is to be detected.

The flash memory 10 acquires results of on/off of the memory cell in the set read level as read data by the single-state read process (hereinafter, referred to as single-state read data) SSR, by the single-state read process. The flash memory 10 sends the single-state read data SSR to the memory controller 100.

In the memory controller 100, the processor 130 receives the single-state read data SSR. The processor 130 stores the single-state read data SSR in the work memory 120, the error check and correction circuit 160, or the voltage correction circuit 180 of the memory controller 100.

In the memory controller 100, the processor 130 generates the pre-error correction separated data from the single-state read data SSR (S81). The pre-error correction separated data will be described in detail later. The processor 130 stores the generated pre-error correction separated data in the work memory 120, the error check and correction circuit 160, or the voltage correction circuit 180.

In the memory controller 100, the processor 130 executes the ECC process on the pre-error correction separated data by the error check and correction circuit 160. Accordingly, the memory system 1 generates post-error correction separated data (S82). The processor 130 stores the generated post-error correction separated data in a memory area in the memory controller 100.

As described below, the memory system 1 of the present embodiment executes the level-separated read process according to the page address in the selected address.

<Level-Separated Read Process in Case where Selected Page is Lower Page>

Figure 27:
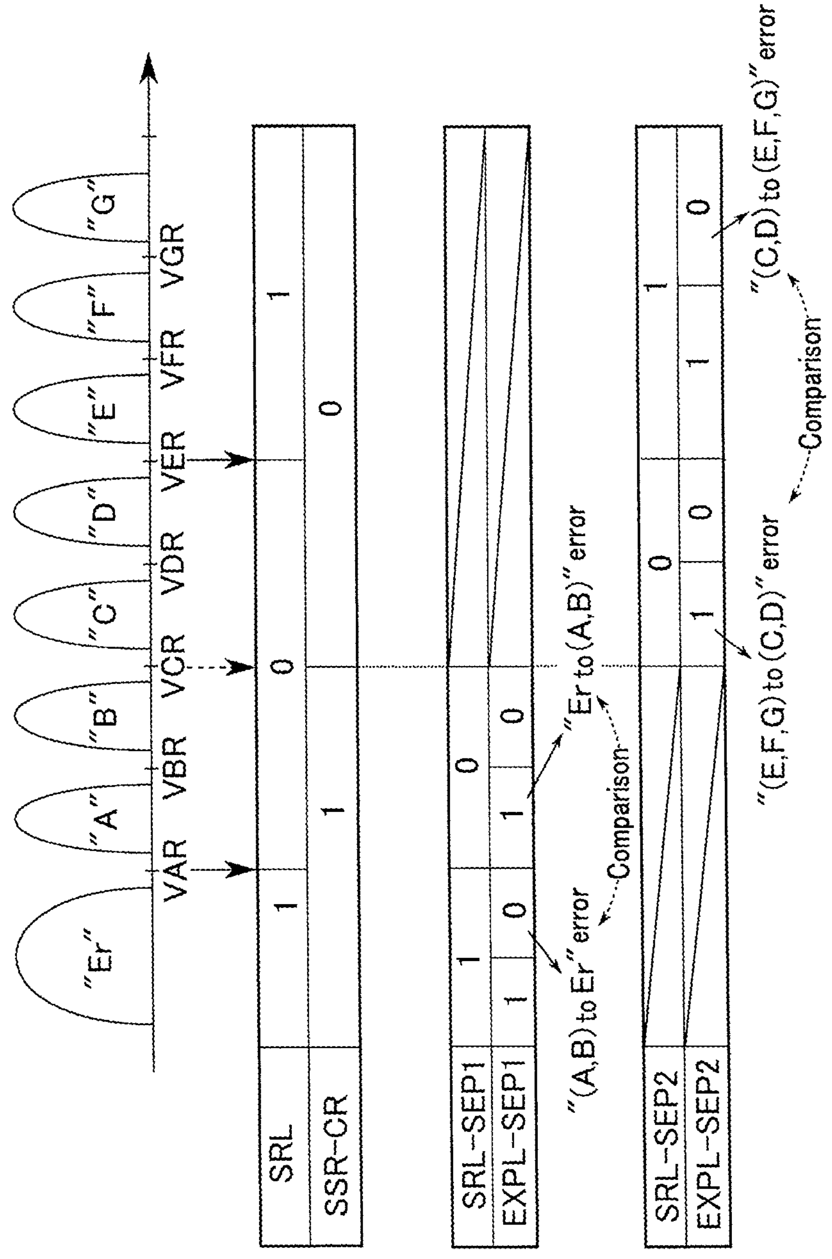
FIGS. 27, 28, and 29 are schematic diagrams illustrating an operation example of the memory system according to the second embodiment.

FIG. 27 is a schematic diagram for describing an operation example of the memory system of the present embodiment.

FIG. 27 illustrates a level separation process in a case where the selected page is a lower page ("pg"=0) in the present embodiment.

In step S104 of FIG. 24 (and step S2 of FIG. 14) described above, the flash memory 10 executes the read operation using the read level VAR and the read level VER at the selected address at the time of reading the data of the lower page. The flash memory 10 sends the read data to the memory controller 100.

Accordingly, the memory controller 100 acquires the pre-error correction frame data related to the lower page at the selected address (hereinafter, referred to as pre-error correction lower frame data.).

When the selected page is a lower page, the processor 130 in the memory controller 100 instructs the flash memory 10 to execute the single-state read process using the read level VCR (S80).

For example, the processor 130 sends the address and a command for executing the single-state read process to the flash memory 10.

The flash memory 10 executes the single-state read process using the read level VCR. The flash memory 10 sends single-state read data SSR-CR related to the read level VCR to the memory controller 100.

Accordingly, the memory controller 100 acquires the single-state read data related to the selected address. The single-state read data SSR-CR is held in the work memory 120, the error check and correction circuit 160, and/or the voltage correction circuit 180.

As illustrated in FIG. 27, the pre-error correction lower frame data SRL is "1" data when the threshold voltage of the memory cell MT is lower than the read level VAR or when the threshold voltage of the memory cell MT is equal to or higher than the read level VER. In this case, the memory cell MT holding the "1" data is considered to belong to any one of the threshold distributions in the "Er" state and the "E" state to the "G" state. The pre-error correction lower frame data SRL is "0" data when the threshold voltage of the memory cell MT is equal to or higher than the read level VAR and lower than the read level VER. In this case, the memory cell MT holding the "0" data is considered to belong to any one of the threshold distributions in the "A" state to the "D" state.

The single-state read data SSR-CR based on the read level VCR is "1" data when the threshold voltage of the memory cell MT is lower than the read level VCR. In this case, the memory cell MT holding the "1" data is considered to belong to any one of the threshold distributions in the "Er" state to the "B" state.

The single-state read data SSR-CR based on the read level VCR is "0" data when the threshold voltage of the memory cell MT is equal to or higher than the read level VCR. In this case, the memory cell MT holding the "0" data is considered to belong to any one of the threshold distributions in the "C" state to the "G" state.

The processor 130 generates pre-error correction separated data SRL-SEP (S81).

In the present embodiment, the processor 130 causes the separated data generation circuit 189 to generate the pre-error correction separated data SRL-SEP (SRL-SEP1 and SRL-SEP2) based on the pre-error correction lower frame data SRL and the single-state read data SSR-CR.

The separated data generation circuit 189 extracts bits corresponding to the single-state read data SSR-CR of "1" among a plurality of bits of the pre-error correction lower frame data SRL as pre-error correction separated data SRL-SEP1.

The separated data generation circuit 189 extracts bits corresponding to the single-state read data SSR-CR of "0" among a plurality of bits of the pre-error correction lower frame data SRL as pre-error correction separated data SRL-SEP2.

The processor 130 generates the post-error correction separated data EXPL-SEP (S82).

The processor 130 causes the separated data generation circuit 189 to generate the post-error correction separated data EXPL-SEP (EXPL-SEP1 and EXPL-SEP2) based on the post-error correction lower frame data EXPL and the single-state read data SSR-CR.

The separated data generation circuit 189 extracts bits corresponding to the single-state read data SSR-CR of "1" among a plurality of bits of the post-error correction lower frame data EXPL as the post-error correction separated data EXPL-SEP1.

The separated data generation circuit 189 extracts bits corresponding to single-state read data SSR-CR of "0" among a plurality of bits of the post-error correction lower frame data EXPL as post-error correction separated data EXPL-SEP2.

Regarding the level-separated reading related to the lower data, the pre-error correction separated data SRL-SEP (SRL-SEP1 and SRL-SEP2) classifies the memory cells MT at the selected address (in the frame unit) into a plurality of groups.

Based on the pre-error correction separated data SRL-SEP and the post-error correction separated data EXPL-SEP, the memory cells MT belonging to the frame (frame unit) as the target of detecting the read level are classified as follows.

The pre-error correction separated data SRL-SEP1 classifies the memory cells MT considered to belong to any one of the threshold distributions in the "Er" state to the "B" state, into two groups. The memory cells MT having threshold voltages smaller than the read level VAR are classified into pre-error correction separated data SRL-SEP1-1 of "1". The memory cells MT having threshold voltages equal to or higher than the read level VAR (and lower than the read level VCR) are classified into pre-error correction separated data SRL-SEP1-0 of "0".

The memory cells MT corresponding to the pre-error correction separated data SRL-SEP1-1 of "1" are considered to belong to the threshold distribution in the "Er" state. The memory cells MT corresponding to the pre-error correction separated data SRL-SEP1-0 of "0" are considered to belong to the threshold distribution in the "Δ" state or the "B" state.

The pre-error correction separated data SRL-SEP2 classifies the memory cells MT considered to belong to any of the threshold distributions in the "C" state to the "G" state, into two groups. The memory cells having threshold voltages lower than the read level VER (and equal to or higher than the read level VCR) are classified into pre-error correction separated data SRL-SEP2-0 of "0". The memory cells MT having threshold voltages equal to or higher than the read level VER are classified into pre-error correction separated data SRL-SEP2-1 of "1".

The memory cells MT corresponding to the pre-error correction separated data SRL-SEP2-0 of "0" are considered to belong to the threshold distribution in the "C" state or the "D" state. The memory cells MT corresponding to the pre-error correction separated data SRL-SEP2-1 of "1" are considered to belong to the threshold distributions in the "E" state to the "G" state.

As described above, in a certain frame of the lower page, the states of the threshold voltages of the memory cells before the error correction are classified by the pre-error correction separated data SRL-SEP.

Regarding the level-separated reading related to the lower data, each of the post-error correction separated data EXPL-SEP1 and EXPL-SEP2 classifies the states of the threshold voltages of the memory cells MT without depending on the classification of the threshold voltages of the memory cells MT by the pre-error correction separated data SRL-SEP.

The memory cells MT corresponding to the post-error correction separated data EXPL-SEP1-1 and EXPL-SEP2-1 of "1" are expected to belong to any one of the threshold distributions in the "Er" state and the "E" state to "G" state.

The memory cells MT corresponding to the post-error correction separated data EXPL-SEP1-0 and EXPL-SEP2-0 of "0" are expected to belong to one of the threshold distributions in the "Δ" state to the "D" state.

As described above, the group corresponding to the post-error correction separated data EXPL-SEP1 is a set of memory cells MT considered to belong to any one of the threshold distributions in the "Er" state to the "B" state. The group corresponding to the post-error correction separated data EXPL-SEP2 is a set of memory cells MT considered to belong to any one of the threshold distributions in the "C" state to the "G" state.

Therefore, for a certain frame unit FU, the memory cells MT corresponding to the post-error correction separated data EXPL-SEP1-1 of "1" are expected to belong to the threshold distribution in the "Er" state. The memory cells corresponding to the post-error correction separated data EXPL-SEP1-0 of "0" are expected to belong to the threshold distribution in the "Δ" state or the "B" state.

The memory cells MT corresponding to the post-error correction separated data EXPL-SEP2-1 of "1" are expected to belong to any one of the threshold distributions in the "E" state to the "G" state. The memory cells MT corresponding to the post-error correction separated data EXPL-SEP2-0 of "0" are expected to belong to the threshold distribution in the "C" state or the "D" state.

As described above, the classification results of the threshold distributions to which the memory cells MT belong in the plurality of memory cells MT that belong to the frame unit (frame) to be processed are obtained by the level-separated read process on the lower page in the memory controller 100.

[S122]

The memory system 1 of the present embodiment executes the calculation process of the shift amount of the read level after the level-separated read process.

In the memory system 1 of the present embodiment, the processor 130 of the memory controller 100 causes the voltage correction circuit 180 to calculate the shift amount of the read level using the pre-error correction separated data (here, the data SRL-SEP related to a certain frame on the lower page) and the post-error correction separated data (Here, data EXPL-SEP related to a certain frame on the lower page) in the frame to be calculated.

There are four (=2×2) combinations C1*a* that can be taken by the value of the pre-error correction separated data SRL-SEP1 and the value of the post-error correction separated data EXPL-SEP1.

There are four (=2×2) combinations C1*b* that can be taken by the value of the pre-error correction separated data SRL-SEP2 and the value of the post-error correction separated data EXPL-SEP2.

The count circuit 182 counts the number of combinations for every four combinations C1*a* and every four combinations C1*b*.

The selection circuit 183 focuses on one set including two combinations C1*a*=(1, 0) and (0, 1) among the four combinations C1*a* of the pre-error correction separated data SRL-SEP1 and the post-error correction separated data EXPL-SEP1.

The combination C1*a* of (1, 0) indicates error cases in which the data corresponding to the "Er" state is erroneously read from the memory cell MT in which the data corresponding to the "Δ" state or the "B" state is written.

The combination C1*a* of (0, 1) indicates error cases in which the data corresponding to the "Δ" state or the "B" state is erroneously read from the memory cell MT in which the data corresponding to the "Er" state is written. As described above, the combination C1*a* of (1, 0) includes the "(A, B) to Er" error cases, and the combination C1*a* of (0, 1) includes the "Er to (A, B)" error cases.

Here, among the "(A, B) to Er" error cases, the number of "A to Er" error cases is sufficiently larger than the number of the "B to Er" error cases. The count value corresponding to the combination C1*a* of (1, 0) may be considered to be substantially equal to the number of the error cases "A to Er". Among the "Er to (A, B)" error cases, the number of the "Er to A" error cases is sufficiently larger than the number of the "Er to B" error cases. Therefore, the count value corresponding to the combination C1*a* of (0, 1) may be considered to be substantially equal to the number of the error cases "Er to A".

The selection circuit 183 focuses on one set including two combinations C1*b*=(0, 1) and (1, 0) among the four combinations C1*b* of the pre-error correction separated data SRL-SEP2 and the post-error correction separated data EXPL-SEP2.

The combination C1*b* of (0, 1) indicates error cases in which data corresponding to the "C" state or the "D" state is erroneously read from the memory cell MT in which data corresponding to any one of the "E" state to the "G" state is written.

The combination C1*b* of (1, 0) indicates error cases in which data corresponding to any one of the "E" state to the "G" state is erroneously read from the memory cell MT in which the data corresponding to the "C" state or the "D" state is written.

As described above, the combination C1*b* of (0, 1) includes the "(E, F, G) to (C, D)" error cases, and the combination C1*b* of (1, 0) includes the "(C, D) to (E, F, G)" error cases.

Here, among the "(E, F, G) to (C, D)" error cases, the number of the "E to D" error cases is sufficiently larger than the number of the "(F, G) to (C, D)" error cases and the number of the "E to C" error cases. The count value corresponding to the combination C1*b* of (0, 1) may be considered to be substantially equal to the number of the "E to D" error cases.

Among the "(C, D) to (E, F, G)" error cases, the number of the "D to E" error cases is sufficiently larger than the number of the "C to (E, F, G)" error cases and the number of "D to (F, G)" error cases. Therefore, the count value corresponding to the combination C1*b* of (1, 0) may be considered to be substantially equal to the number of the "D to E" error cases.

Based on such approximation of the error cases, when calculating the shift amount of the read level VAR, for example, the selection circuit 183 selects the count number of the combination C1*a*=(1, 0) substantially corresponding to the "A to Er" error cases and the count number of the combination C1*a*=(0, 1) substantially corresponding to the "Er to A" error cases, as one set.

When calculating the shift amount of the read level VER, for example, the selection circuit 183 selects the count number of the combination C1*b*=(0, 1) substantially corresponding to the "E to D" error cases and the count number of the combination C1*b*=(1, 0) substantially corresponding to the "D to E" error cases, as one set.

In this manner, the selection circuit 183 can select *a* set including two count values used for calculating the shift amount of the read level on the lower page.

The evaluation index calculation circuit 184 calculates the evaluation index "r" based on the set of count values of the selected combination.

The shift amount calculation circuit 185 calculates the shift amounts of the two read levels VAR and VER based on the calculated evaluation index "r".

As described above, in the present embodiment, the read level of the lower page is detected using the level-separated reading including the single-state read process.

<Level Separated Process in Case where Selected Page is Middle Page>

Figure 28:
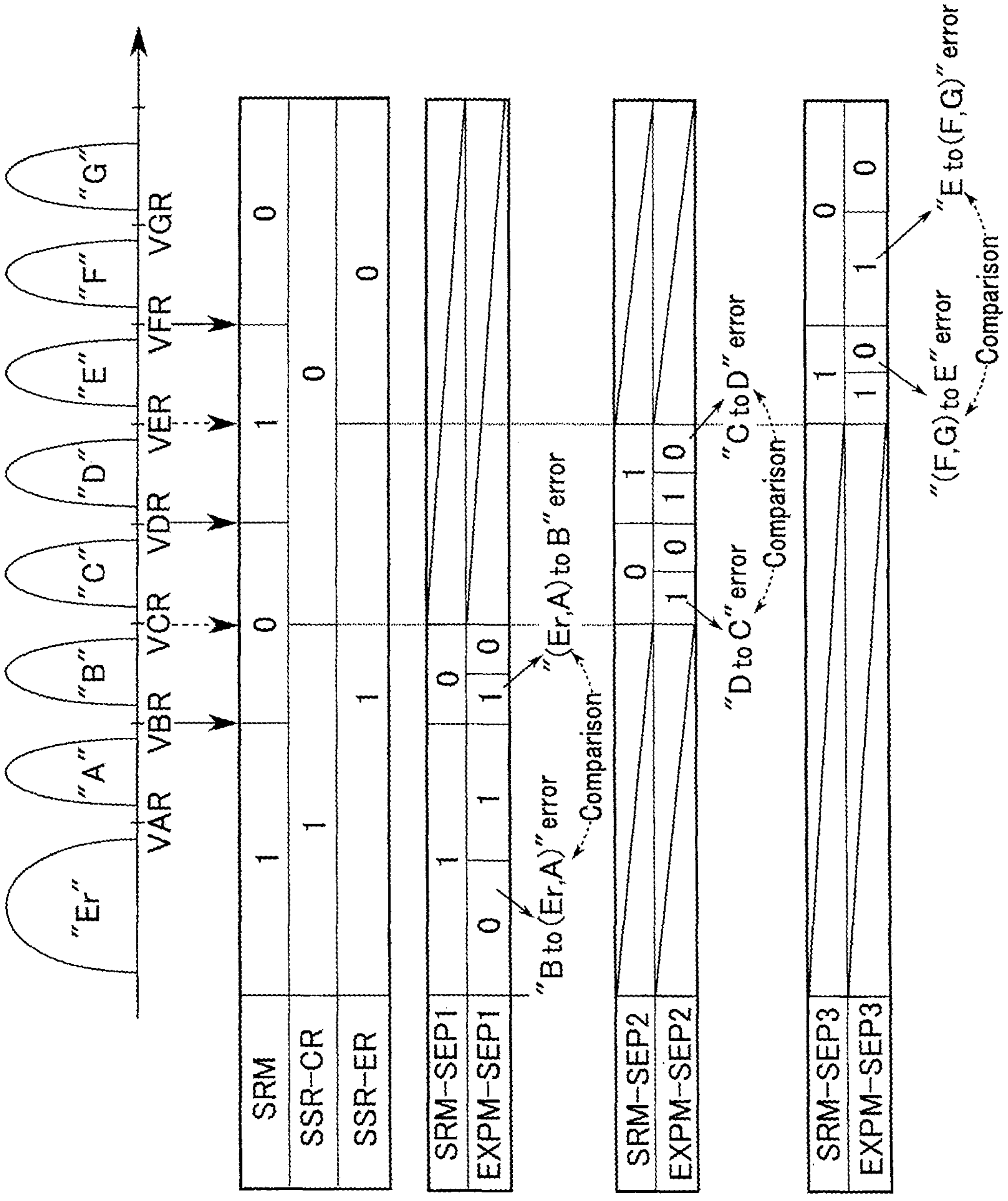

FIG. 28 is a schematic diagram for describing an operation example of the memory system of the present embodiment.

FIG. 28 illustrates the level-separated read process in a case where the selected page is a middle page ("pg"=1) in the present embodiment.

In step S104 of FIG. 24 (or step S2 of FIG. 12) described above, the flash memory 10 executes a read operation of the data on the middle page at the selected address, using the read level VBR, the read level VDR, and the read level VFR. The flash memory 10 sends the read data to the memory controller 100.

Accordingly, the memory controller 100 acquires the pre-error correction frame data SRM related to the middle page at the selected address (hereinafter, referred to as pre-error correction middle frame data).

When the selected page is a middle page, the processor 130 in the memory controller 100 instructs the flash memory 10 to execute the single-state read process using the read level VCR and the single-state read process using the read level VER.

The flash memory 10 executes the single-state read process using the read level VCR. The flash memory 10 executes the single-state read process using the read level VER.

The flash memory 10 transmits the single-state read data SSR-CR related to the read level VCR and the single-state read data SSR-ER related to the read level VER to the memory controller 100.

The memory controller 100 acquires the single-state read data SSR-CR and SSR-ER related to the selected address. The single-state read data SSR-CR and SSR-ER are held in the work memory 120 and/or the memory circuit 181 of the voltage correction circuit 180.

As illustrated in FIG. 28, the pre-error correction middle frame data SRM is "1" data when the threshold voltage of the memory cell MT is smaller than the read level VBR. The pre-error correction middle frame data is "1" data when the threshold voltage of the memory cell MT is equal to or higher than the read level VDR and lower than the read level VFR. In these cases, the memory cell MT holding the "1" data is considered to belong to any one of the threshold distributions in the "Er" state, the "Δ" state, the "D" state, and the "E" state.

The pre-error correction middle frame data SRM is "0" data when the threshold voltage of the memory cell MT is equal to or higher than the read level VBR and lower than the read level VDR. The pre-error correction middle frame data SRM is "0" data when the threshold voltage of the memory cell MT is equal to or higher than the read level VFR. In these cases, the memory cell MT holding the "0" data is considered to belong to any one of the threshold distributions in the "B" state, the "C" state, the "F" state, and the "G" state.

The single-state read data SSR-CR based on the read level VCR is "1" data when the threshold voltage of the memory cell MT is lower than the read level VCR. In this case, the memory cell MT holding the "1" data is considered to belong to any one of the threshold distributions in the "Er" state to the "B" state.

The single-state read data SSR-CR based on the read level VCR is "0" data when the threshold voltage of the memory cell MT is equal to or higher than the read level VCR. In this case, the memory cell MT holding the "0" data is considered to belong to any one of the threshold distributions in the "C" state to the "G" state.

The single-state read data SSR-ER based on the read level VER is "1" data when the threshold voltage of the memory cell MT is lower than the read level VER. In this case, the memory cell MT holding the "1" data is considered to belong to any one of the threshold distributions in the "Er" state to the "D" state.

The single-state read data based on the read level VER is "0" data when the threshold voltage of the memory cell MT is equal to or higher than the read level VER. In this case, the memory cell MT holding the "0" data is considered to belong to any one of the threshold distributions in the "E" state to the "G" state.

In the present embodiment, the processor 130 causes the separated data generation circuit 189 to generate the pre-error correction separated data SRM-SEP based on the pre-error correction middle frame data SRM and the single-state read data SSR-CR and SSR-ER (S81).

The separated data generation circuit 189 extracts bits corresponding to the single-state read data SSR-CR of "1" and the single-state read data SRM-ER of "1" among a plurality of bits of the pre-error correction middle frame data SRM as pre-error correction separated data SRM-SEP1.

The separated data generation circuit 189 extracts bits corresponding to the single-state read data SSR-CR of "0" and the single-state read data SSR-ER of "1" among a plurality of bits of the pre-error correction middle frame data as pre-error correction separated data SRM-SEP2.

The separated data generation circuit 189 extracts bits corresponding to the single-state read data SSR-CR of "0" and the single-state read data SSR-ER of "0" among a plurality of bits of the pre-error correction middle frame data SRM as pre-error correction separated data SRM-SEP3.

The processor 130 causes the separated data generation circuit 189 to generate the post-error correction separated data based on the post-error correction middle frame data EXPM and the single-state read data SSR-CR and SSR-ER (S82).

The separated data generation circuit 189 extracts bits corresponding to the single-state read data SSR-CR of "1" and the single-state read data SSR-ER of "1" among a plurality of bits of post-error correction middle frame data EXPM as post-error correction separated data EXPM-SEP1.

The separated data generation circuit 189 extracts bits corresponding to the single-state read data SSR-CR of "0" and the single-state read data SSR-ER of "1" among a plurality of bits of post-error correction middle frame data EXPM as post-error correction separated data EXPM-SEP2.

The separated data generation circuit 189 extracts bits corresponding to the single-state read data SSR-CR of "0" and the single-state read data SSR-ER of "0" among a plurality of bits of post-error correction middle frame data EXPM as post-error correction separated data EXPM-SEP3.

Regarding the level-separated reading related to the middle data, the pre-error correction separated data SRM-SEP (SRM-SEP1, SRM-SEP2, and SRM-SEP3) classifies the memory cells MT at the selected address (in the frame unit) into a plurality of groups.

The memory cells MT having threshold voltages lower than the read level VBR and the memory cells MT having threshold voltages equal to or higher than the read level VDR and lower than the read level VFR are classified into the pre-error correction separated data SRM-SEP1-1, SRM-SEP2-1, and SRM-SEP3-1 of "1".

The memory cells MT having threshold voltages equal to or higher than the read level VBR and lower than the read level VDR and the memory cells MT having threshold voltages equal to or higher than the read level VFR are classified into pre-error correction separated data SRM-SEP1-0, SRM-SEP2-0, and SRM-SEP3-0 of "0".

The memory cells MT corresponding to the pre-error correction separated data SRM-SEP1-1, SRM-SEP2-1, and SRM-SEP3-1 of "1" are considered to belong to any one of the threshold distributions in the "Er" state, the "Δ" state, the "D" state, and the "E" state.

The memory cells MT corresponding to the pre-error correction separated data SRM-SEP1-0, SRM-SEP2-0, and SRM-SEP3-0 of "0" are considered to belong to any one of the threshold distributions in the "B" state, the "C" state, the "F" state, and the "G" state.

As described above, in a certain frame of the middle page, the states of the threshold voltages of the memory cells before the error correction are classified by the pre-error correction separated data SRM-SEP.

Regarding the level-separated reading related to the middle data, the post-error correction separated data EXP-SEP (EXPM-SEP1, EXPM-SEP2, and EXPM-SEP3) classifies the states of the threshold voltages of the memory cells MT without depending on the classification of the threshold voltages of the memory cells MT by the pre-error correction separated data SRM-SEP.

The memory cells MT corresponding to the post-error correction separated data EXPM-SEP1-1, EXPM-SEP2-1, and EXPM-SEP3-1 of "1" are expected to belong to any one of the threshold distributions in the "Er" state, the "Δ" state, the "D" state, and the "E" state.

The memory cells MT corresponding to the post-error correction separated data EXPM-SEP1-0, EXPM-SEP2-0, and EXPM-SEP3-0 of "0" are expected to belong to any one of the threshold distributions in the "B" state, the "C" state, the "F" state, and the "G" state.

As described above, the group corresponding to the pre-error correction separated data SRM-SEP1 is a set of memory cells MT considered to belong to any one of the threshold distributions in the "Er" state, the "Δ" state, and the "B" state. The group corresponding to the pre-error correction separated data SRM-SEP2 is a set of memory cells MT considered to belong to any one of the threshold distributions in the "C" state and the "D" state. The group corresponding to the pre-error correction separated data SRM-SEP3 is a set of memory cells MT considered to belong to any one of the threshold distributions in the "E" state, the "F" state, and the "G" state.

Therefore, as described below, for a certain frame unit of the middle data, each of the memory cells corresponding to the post-error correction separated data EXPM-SEP is expected to belong to the corresponding threshold distribution.

The memory cells MT corresponding to the post-error correction separated data EXPM-SEP1-1 of "1" are expected to belong to the threshold distribution in the "Er" state or the "Δ" state. The memory cells corresponding to the post-error correction separated data EXPM-SEP1-0 of "0" are expected to belong to the threshold distribution in the "B" state.

The memory cells corresponding to the post-error correction separated data EXPM-SEP2-1 of "1" are expected to belong to the threshold distribution in the "D" state. The memory cells corresponding to the post-error correction separated data EXPM-SEP2-0 of "0" are expected to belong to the threshold distribution in the "C" state.

The memory cells corresponding to the post-error correction separated data EXPM-SEP3-1 of "1" are expected to belong to the threshold distribution in the "E" state. The memory cells corresponding to the post-error correction separated data EXPM-SEP3-0 of "0" are expected to belong to the threshold distribution in the "F" state or the "G" state.

As described above, the classification results of the threshold distributions to which the memory cells MT belong in the plurality of memory cells that belong to the frame unit (frame) to be processed are obtained by the level-separated read process on the middle page in the memory controller 100.

[S122]

In the present example, as in the example of FIG. 27 described above, after the level-separated read process, the processor 130 causes the voltage correction circuit 180 to execute the calculation process of shift amount of the read level.

In the memory controller 100 of the memory system 1 of the present embodiment, the voltage correction circuit 180 calculates the shift amount of the read level using the pre-error correction separated data SRM-SEP and the post-error correction separated data EXPM-SEP in the frame to be processed on the middle page.

There are four (=2×2) combinations C2*a* that can be taken by the value of the pre-error correction separated data SRM-SEP1 and the value of the post-error correction separated data EXPM-SEP1. Similarly, there are four (=2×2) combinations C2*b* that can be taken by the value of the pre-error correction separated data SRM-SEP2 and the value of the post-error correction separated data EXPM-SEP2. There are four (=2×2) combinations C2*c* that can be taken by the value of the pre-error correction separated data SRM-SEP3 and the value of the post-error correction separated data EXPM-SEP3.

The count circuit 182 counts the number of combinations for every four combinations C2*a*, every four combinations C2*b*, and every four combinations C2*c*.

The selection circuit 183 focuses on one set including two combinations C2*a*=(1, 0) and (0, 1) among the four combinations C2*a* of the pre-error correction separated data SRM-SEP1 and the post-error correction separated data EXPM-SEP1.

The combination C2*a* of (1, 0) indicates error cases in which the data corresponding to the "Er" state or the "Δ" state is erroneously read from the memory cell MT in which the data corresponding to the "B" state is written.

The combination C2*a* of (0, 1) indicates error cases in which the data corresponding to the "B" state is erroneously read from the memory cell MT in which the data corresponding to the "Er" state or the "Δ" state is written.

As described above, the combination C2*a* of (1, 0) includes the "B to (Er, A)" error cases, and the combination C2*a* of (0, 1) includes the "(Er, A) to B" error cases.

Among the "B to (Er, A)" error cases, the number of the "B to A" error cases is sufficiently larger than the number of the "B to Er" error cases. The count value corresponding to the combination C2*a* of (1, 0) may be considered to be substantially equal to the number of the error cases "B to A".

Among the "(Er, A) to (B)" error cases, the number of the "A to B" error cases is sufficiently larger than the number of the "Er to B" error cases. Therefore, the count value corresponding to the combination C2*a* of (0, 1) may be considered to be substantially equal to the number of "A to B" error cases.

The selection circuit 183 focuses on one set including two combinations C2*b*=(0, 1) and (1, 0) among the four combinations C2*b* of the pre-error correction separated data SRM-SEP2 and the post-error correction separated data EXPM-SEP2.

The combination C2*b* of (0, 1) indicates error cases in which the data corresponding to the "C" state is erroneously read from the memory cell MT in which the data corresponding to the "D" state is written.

The combination C2*b* of (1, 0) indicates error cases in which the data corresponding to the "D" state is erroneously read from the memory cell MT in which the data corresponding to the "C" state is written.

As described above, the combination C2*b* of (0, 1) includes the "D to C" error cases, and the combination C2*b* of (1, 0) includes the "C to D" error cases.

The selection circuit 183 focuses on one set including two combinations C2*c*=(1, 0) and (0, 1) among the four combinations C2*c* of the pre-error correction separated data SRM-SEP3 and the post-error correction separated data EXPM-SEP3.

The combination C2*c* of (1, 0) indicates error cases in which the data corresponding to the "E" state is erroneously read from the memory cell MT in which the data corresponding to the "F" state or the "G" state is written.

The combination C2*c* of (0, 1) indicates error cases in which the data corresponding to the "F" state or the "G" state is erroneously read from the memory cell MT in which the data corresponding to the "E" state is written.

As described above, the combination C2*c* of (1, 0) includes the "(F, G) to E" error cases, and the combination C2*c* of (0, 1) includes the "E to (F, G)" error cases.

Among the "(F, G) to E" error cases, the number of the "F to E" error cases is sufficiently larger than the number of the "G to E" error cases. The count value corresponding to the combination C2*c* of (1, 0) may be considered to be substantially equal to the number of the error cases "F to E".

Among the "E to (F, G)" error cases, the number of the "E to F" error cases is sufficiently larger than the number of the "E to G" error cases. Therefore, the count value corresponding to the combination C2*c* of (0, 1) may be considered to be substantially equal to the number of the error cases "E to F".

Based on such approximation of the count values of the error cases, when calculating the shift amount of the read level VBR, for example, the selection circuit 183 selects the count number of the combination C2*a*=(1, 0) substantially corresponding to the "B to A" error cases and the count number of the combination C2*a*=(0, 1) substantially corresponding to the "A to B" error cases, as one set.

When calculating the shift amount of the read level VDR, for example, the selection circuit 183 selects the count number of the combination C2*b*=(0, 1) substantially corresponding to the "D to C" error cases and the count number of the combination C2*b*=(1, 0) substantially corresponding to the "C to D" error cases, as one set.

When calculating the shift amount of the read level VFR, for example, the selection circuit 183 selects the count number of the combination C2*c*=(1, 0) substantially corresponding to the "F to E" error cases and the count number of the combination C2*c*=(0, 1) substantially corresponding to the "E to F" error cases, as one set.

In this manner, the selection circuit 183 can select a set including two count values used for calculating the shift amounts of the read levels.

Thereafter, the evaluation index calculation circuit 184 calculates the evaluation indexes "r" of the read levels VBR, VDR, and VFR using the selected set of count values.

The shift amount calculation circuit 185 calculates the shift amounts of the three read levels VBR, VDR, and VFR used for reading the middle page based on the calculated evaluation indexes "r".

As described above, in the present embodiment, the read level of the middle page is detected using the level-separated reading including the single-state read process.

<Level Separated Process in Case where Selected Page is Upper Page>

Figure 29:
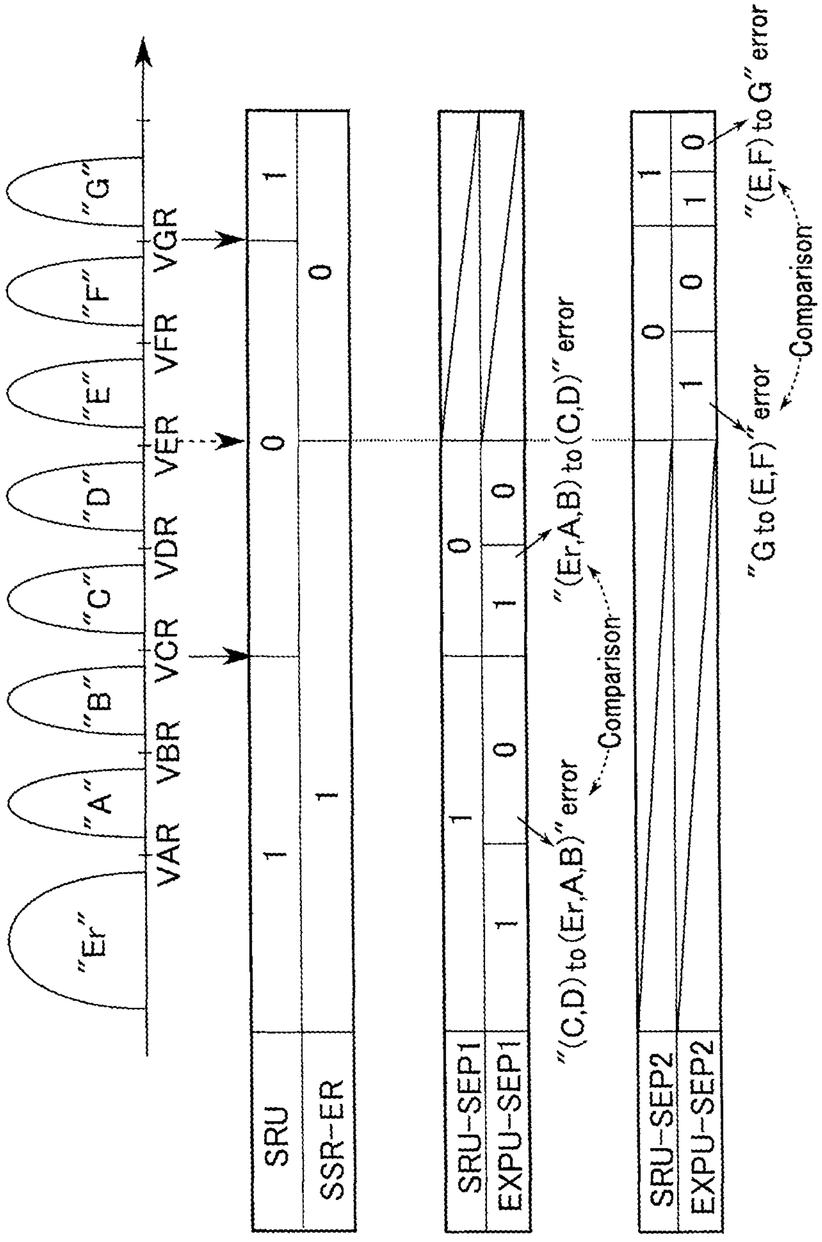

FIG. 29 is a schematic diagram for describing an operation example of the memory system of the present embodiment.

FIG. 29 illustrates the level-separated read process in a case where the selected page is an upper page ("pg"=2) in the present embodiment.

In step S104 of FIG. 24 (or step S2 of FIG. 12) described above, if the read operation on the upper page has been executed, the flash memory 10 executes the read operation at the selected address using the read level VCR and the read level VGR. The flash memory 10 sends the read data to the memory controller 100.

Accordingly, the memory controller 100 acquires the pre-error correction frame data related to the upper page at the selected address (hereinafter, referred to as pre-error correction upper frame data) SRU.

When the selected page is the upper page, the processor 130 instructs the flash memory 10 to execute the single-state read process using the read level VER (S80).

The flash memory 10 executes the single-state read process using the read level VER under the instruction from the processor 130. The flash memory 10 sends the single-state read data SSR-ER to the memory controller 100.

Accordingly, the memory controller 100 acquires the single-state read data SSR-ER related to the selected address. The single-state read data SSR-ER is held in the work memory 120 and/or the voltage correction circuit 180.

The pre-error correction upper frame data is "1" data when the threshold voltage of the memory cell MT is lower than the read level VCR or when the threshold voltage of the memory cell MT is equal to or higher than the read level VGR. In this case, the memory cell MT holding the "1" data is considered to belong to any one of the threshold distributions in the "Er" state to the "B" state and the "G" state.

The pre-error correction upper frame data is "0" data when the threshold voltage of the memory cell MT is equal to or higher than the read level VCR and lower than the read level VGR. In this case, the memory cell MT holding the "0" data is considered to belong to any one of the threshold distributions in the "C" state to the "F" state.

The single-state read data SSR-ER based on the read level VER is "1" data when the threshold voltage of the memory cell MT is lower than the read level VER. In this case, the memory cell MT holding the "1" data is considered to belong to any one of the threshold distributions in the "Er" state to the "D" state.

The single-state read data SSR-ER based on the read level VER is "0" data when the threshold voltage of the memory cell MT is equal to or higher than the read level VER. In this case, the memory cell MT holding the "0" data is considered to belong to any one of the threshold distributions in the "E" state to the "G" state.

The processor 130 causes the separated data generation circuit 189 to generate the pre-error correction separated data SRU-SEP (SRU-SEP1 and SRU-SEP2) based on the pre-error correction upper frame data SRU and the single-state read data SSR-ER for the frame unit to be processed (S81).

The separated data generation circuit 189 extracts bits corresponding to the single-state read data SSR-ER of "1" among a plurality of bits of the pre-error correction upper frame data SRU as pre-error correction separated data SRU-SEP1.

The separated data generation circuit 189 extracts bits corresponding to the single-state read data SSR-ER of "0" among a plurality of bits of the pre-error correction upper frame data SRU as pre-error correction separated data SRU-SEP2.

The processor 130 causes the separated data generation circuit 189 to generate the post-error correction separated data EXPU-SEP (EXPU-SEP1 and EXPU-SEP2) based on the post-error correction upper frame data EXPU and the single-state read data SSR-ER for the frame unit to be processed (S82).

The separated data generation circuit 189 extracts bits corresponding to the single-state read data SSR-ER of "1" among a plurality of bits of the post-error correction upper frame data EXPU as the post-error correction separated data EXPU-SEP1.

The separated data generation circuit 189 extracts bits corresponding to the single-state read data of "0" among a plurality of bits of the post-error correction upper frame data EXPU as the post-error correction separated data EXPU-SEP2.

Regarding the level-separated reading related to the upper data, the pre-error correction separated data SRU-SEP (SRU-SEP1 and SRU-SEP2) classifies the memory cells MT at the selected address (in the frame unit) into a plurality of groups.

The pre-error correction separated data SRU-SEP1 classifies the memory cells MT considered to belong to any one of the threshold distributions in the "Er" state to the "D" state, into two groups. The memory cells MT having threshold voltages smaller than the read level VCR are classified into pre-error correction separated data SRU-SEP1-1 of "1". The memory cells MT having threshold voltages equal to or higher than the read level VCR (and lower than the read level VER) are classified into pre-error correction separated data SRU-SEP1-0 of "0".

The memory cell MT corresponding to the pre-error correction separated data SRU-SEP1-1 of "1" is considered to belong to any one of the threshold distributions in the "Er" state, the "Δ" state, and the "B" state. The memory cells MT corresponding to the pre-error correction separated data SRU-SEP1-0 of "0" are considered to belong to the threshold distribution in the "C" state or the "D" state.

The pre-error correction separated data SRU-SEP2 classifies the memory cells MT considered to belong to any one of the threshold distributions in the "E" state, the "F" state, and the "G" state, into two groups. The memory cells MT having threshold voltages lower than the read level VGR (and equal to or higher than the read level VER) are classified into a group of pre-error correction separated data SRU-SEP2-0 of "0". The memory cells MT having threshold voltages equal to or higher than the read level VGR are classified into a group of pre-error correction separated data SRU-SEP2-1 of "1".

The memory cells MT corresponding to the pre-error correction separated data SRU-SEP2-0 of "0" are considered to belong to the threshold distribution in the "E" state or the "F" state. The memory cells MT corresponding to the pre-error correction separated data SRU-SEP2-1 of "1" are considered to belong to the threshold distribution in the "G" state.

As described above, in a certain frame of the upper page, the states of the threshold voltages of the memory cells MT before the error correction are classified by the pre-error correction separated data SRU-SEP.

Regarding the level-separated reading related to the upper data, the post-error correction separated data EXPM-SEP (EXPU-SEP1 and EXPU-SEP2) classifies the states of the threshold voltages of the memory cells MT without depending on the classification of the threshold voltages of the memory cells MT by the pre-error correction separated data SRU-SEP.

The memory cells MT corresponding to the post-error correction separated data EXPU-SEP1-1 and EXPU-SEP2-1 of "1" are expected to belong to any one of the threshold distributions in the "Er" state, the "Δ" state, the "B" state, and the "G" state.

The memory cells MT corresponding to the post-error correction separated data EXPU-SEP1-0 and EXPU-SEP2-0 of "0" are expected to belong to any one of the threshold distributions in the "C" state, the "D" state, the "E" state, and the "F" state.

As described above, the group corresponding to the post-error correction separated data EXPU-SEP1 is a set of memory cells MT considered to belong to any one of the threshold distributions in the "Er" state to the "D" state. The group corresponding to the post-error correction separated data EXPU-SEP2 is a set of memory cells MT considered to belong to any one of the threshold distributions in the "E" state to the "G" state.

Therefore, the memory cells MT corresponding to the post-error correction separated data EXPU-SEP1-1 of "1" are expected to belong to any one of the threshold distributions in the "Er" state, the "Δ" state, and the "B" state. The memory cells MT corresponding to the post-error correction separated data EXPU-SEP1-0 of "0" are expected to belong to the threshold distribution in the "C" state.

The memory cells corresponding to the post-error correction separated data EXPU-SEP2-1 of "1" are expected to belong to the threshold distribution in the "G" state. The memory cells MT corresponding to the post-error correction separated data EXPU-SEP2-0 of "0" are expected to belong to any one of the threshold distributions in the "D" state, the "E" state, and the "F" state.

As described above, the classification results of the threshold distributions to which the memory cells MT belong in the plurality of memory cells MT that belong to the frame unit (frame) to be processed are obtained by the level-separated read process on the upper page in the memory controller 100.

[S122]

In the present example, as in the examples of FIGS. 27 and 28 described above, after the level-separated read process, the processor 130 causes the voltage correction circuit 180 to execute the calculation process of shift amount of the read level.

In the memory controller 100 of the memory system 1 of the present embodiment, the processor 130 causes the voltage correction circuit 180 to calculate the shift amount of the read level using the pre-error correction separated data SRU-SEP and the post-error correction separated data EXPU-SEP in the frame to be processed on the upper page.

There are four (=2×2) combinations C3*a* that can be taken by the value of the pre-error correction separated data SRU-SEP1 and the value of the post-error correction separated data EXPU-SEP1.

There are four (=2×2) combinations C3*b* that can be taken by the value of the pre-error correction separated data SRU-SEP2 and the value of the post-error correction separated data EXPU-SEP2.

The counting circuit 182 counts the number of combinations C3*a* and C3*b* for every four combinations C3*a* and every four combinations C3*b*.

The selection circuit 183 focuses on one set including two combinations C3*a*=(1, 0) and (0, 1) among the four combinations C3*a* of the pre-error correction separated data SRU-SEP1 and the post-error correction separated data EXPU-SEP1.

The combination C3*a* of (1, 0) indicates error cases in which data corresponding to any one of the "Er" state, the "Δ" state, and the "B" state is erroneously read from the memory cell MT in which the data corresponding to the "C" state or the "D" state is written.

The combination C3*a* of (0, 1) indicates error cases in which data corresponding to the "C" state or the "D" state is erroneously read from the memory cell MT in which data corresponding to any one of the "Er" state, the "Δ" state, and the "B" state is written.

The combination C3*a* of (1,0) includes "(C, D) to (Er, A, B)" error cases. The combination C3*a* of (0, 1) includes "(Er, A, B) to (C, D)" error cases.

Among the "(C, D) to (Er, A, B)" error cases, the number of the "C to B" error cases is sufficiently larger than the number of the "D to (Er, A, B)" error cases and the number of the "C to (Er, A)" error cases. Therefore, the count value corresponding to the combination C3*a* of (1, 0) may be considered to be substantially equal to the number of "C to B" error cases.

Among the "(Er, A, B) to (C, D)" error cases, the number of the "B to C" error cases is sufficiently larger than the number of the "(Er, A) to (C, D)" error cases and the "B to D" error cases. Therefore, the count value corresponding to the combination C3*a* of (0, 1) may be considered to be substantially equal to the number of "B to C" error cases.

The selection circuit 183 focuses on one set including two combinations C3*b*=(0, 1) and (1, 0) among the four combinations C3*b* of the pre-error correction separated data SRU-SEP2 and the post-error correction separated data EXPU-SEP2.

The combination C3*b* of (0, 1) indicates error cases in which the data corresponding to the "E" state or the "F" state is erroneously read from the memory cell MT in which the data corresponding to the "G" state is written.

The combination C3*b* of (1, 0) indicates cases in which the data corresponding to the "G" state is erroneously read from the memory cell MT in which the data corresponding to the "E" state or the "F" state is written.

The combination C3*b* of (0, 1) includes "G to (E, F)" error cases. The combination C3*b* of (1, 0) includes "(E, F) to G" error cases.

Among the "G to (E, F)" error cases, the number of the "G to F" error cases is sufficiently larger than the number of the "G to E" error cases. The count value corresponding to the combination C3*b* of (0, 1) may be considered to be substantially equal to the number of the "G to F" error cases.

Among the "(E, F) to G" error cases, the number of the "F to G" error cases is sufficiently larger than the number of the "E to G" error cases. Therefore, the count value corresponding to the combination C3*b* of (1, 0) may be considered to be substantially equal to the number of the "F to G" error cases.

Based on such approximation of the count values of the error cases, when calculating the shift amount of the read level VCR, for example, the selection circuit 183 selects the count number of the combination C3*a*=(1, 0) substantially corresponding to the "C to B" error cases and the count number of the combination C3*a*=(0, 1) substantially corresponding to the "B to C" error cases, as one set.

For example, when calculating the shift amount of the read level VGR, the selection circuit 183 selects the count number of the combination C3*b*=(0, 1) substantially corresponding to the "G to F" error cases and the count number of the combination C3*b*=(1, 0) substantially corresponding to the "F to G" error cases, as one set.

In this manner, the selection circuit 183 can select a set including two count values used for calculating the shift amounts of the read levels.

Thereafter, the evaluation index calculation circuit 184 calculates the evaluation indexes "r" of the read levels VCR and VGR using the selected set of count values.

The shift amount calculation circuit 185 calculates the shift amounts of the two read levels VCR and VGR used for reading the upper page based on the calculated evaluation indexes "r".

In this manner, in the present embodiment, the read level of the upper page is detected using the level-separated reading including the single-state read process.

As described above, the detection process of the read level is executed in units of frame data by using the level-separated read process including the single-state read process according to each page.

The memory system of the present embodiment can calculate the shift amount of the read level using the data of one page among the plurality of pages included with the selected address and the result of the single-state read process.

The memory system of the present embodiment can reduce the number of frequencies with which the read level is applied to the selected word line in the flash memory 10 by using the single-state read process.

As a result, the memory system of the present embodiment can shorten the period for reading data from the flash memory 10.

As described above, the memory system of the second embodiment can improve the characteristics of the memory system.

(3) Third Embodiment

A memory system and a control method thereof according to a third embodiment will be described with reference to FIGS. 30 to 32.

Figure 30:
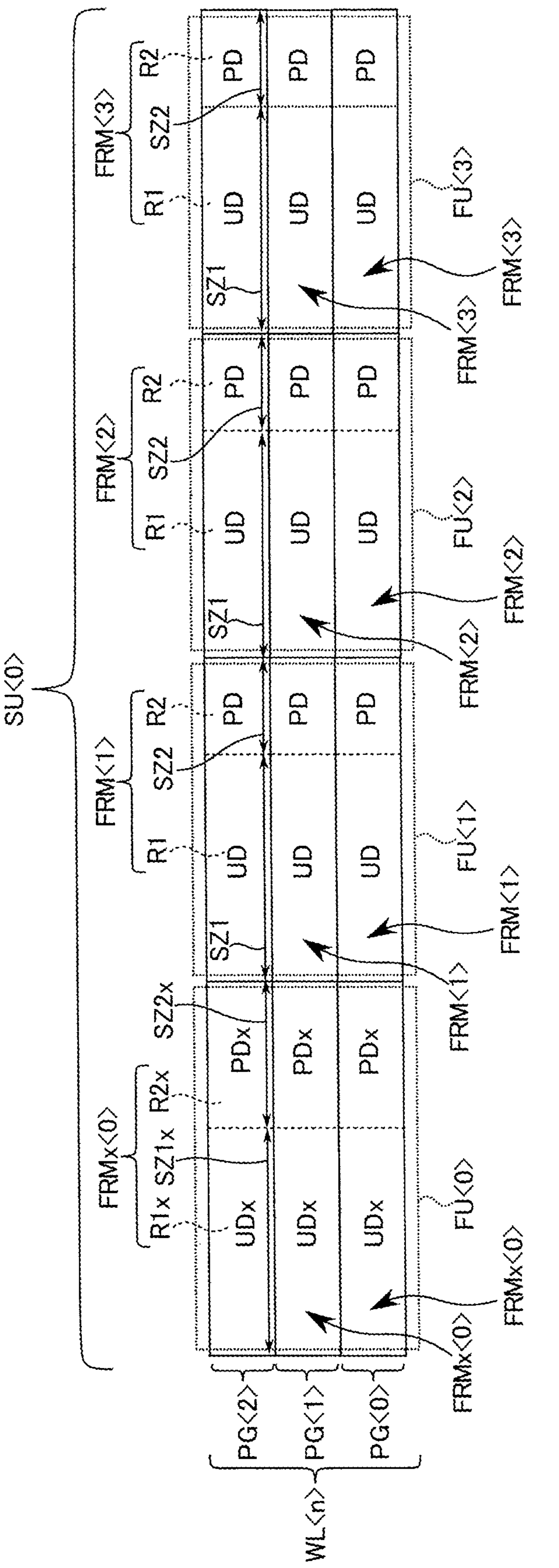
FIG. 30 is a schematic diagram illustrating a configuration example of a memory system according to a third embodiment.

FIG. 30 is a schematic diagram for describing a configuration example of the memory system of the present embodiment.

FIG. 30 illustrates a configuration of frames in a memory space in the memory system of the present embodiment.

The memory system of the present embodiment focuses on a certain specific frame (frame unit) in the memory space and executes a read level detection process (for example, a calculation process of shift amount of a read level).

As illustrated in FIG. 30, in the present embodiment, a configuration of a certain frame FRMx among a plurality of frames in the memory space is different from the configuration of the frame described in relation to the first embodiment.

In the memory system of the present embodiment, among a plurality of frames FRMx and FRM of each string unit SU, the size (storage capacity and data size) of a parity data area SZ2*x* of a certain frame FRMx belonging to a certain frame unit FUx is larger than the size of a parity data area SZ2 of a certain frame FRM belonging to another frame unit FU.

In the present embodiment, regarding the plurality of frames FRMx and FRM belonging to each page PG of each frame unit FU of each string unit SU, a first frame FRMx<0> has a parity data area R2*x* of the first size SZ2*x*, and each of the other frames FRM<1>, FRM<2>, and FRM<3> has a parity data area R2 of the second data size SZ2.

The data size (the number of parity bits) SZ2*x* of parity data PDx in a parity data area R2*x* is larger than the data size SZ2 of parity data PD in a parity data area R2. For example, the data size SZ2*x* of the parity data PDx is set to about 1.2 to 2.0 times the data size SZ2 of the parity data PD.

The data correction capability of the parity data PDx is higher than the data correction capability of the parity data PD.

For example, the frame FRMx is allocated to first frame units FU0 (for example, frame units FU<0>, FU<4>, FU<8>, and FU<12>) of the string units SU.

For example, when the sizes of the plurality of frames FRM are set to the same size (for example, 1 KB), the size of a user data area A1*x*<0> of a frame FRM<0> is smaller than the size of a user data area R1 of each of other frames FRM<1>, FRM<2>, and FRM<3>. In this case, the data size of user data UDx in the user data area Alx is smaller than the data size of user data UD in the user data area A1.

Hereinafter, the parity data PDx having the data size SZ2*x* larger than the data size SZ2 of the other parity data PD is referred to as large parity data PDx.

The memory system 1 of the present embodiment uses the large parity data PDx of the frame FRMx to calculate the read level for reading data of the frame FRM in which a read error has occurred.

Accordingly, the memory system 1 of the present embodiment maintains a state in which an error in data can be corrected by hard bit decoding.

(2b) Operation Example

An operation example of the memory system of the present embodiment will be described with reference to FIGS. 31 and 32.

In the memory system 1 of the present embodiment, as in the above-described embodiments, a memory controller 100 determines whether the correction of a detected error in frame data of read data from a flash memory 10 has succeeded, in steps S1 to S4 in FIG. 14.

When the error correction has failed (No in S4 in FIG. 14), the memory controller 100 executes a detection process of the read level used for the selected address where the read error has occurred.

Figure 31:
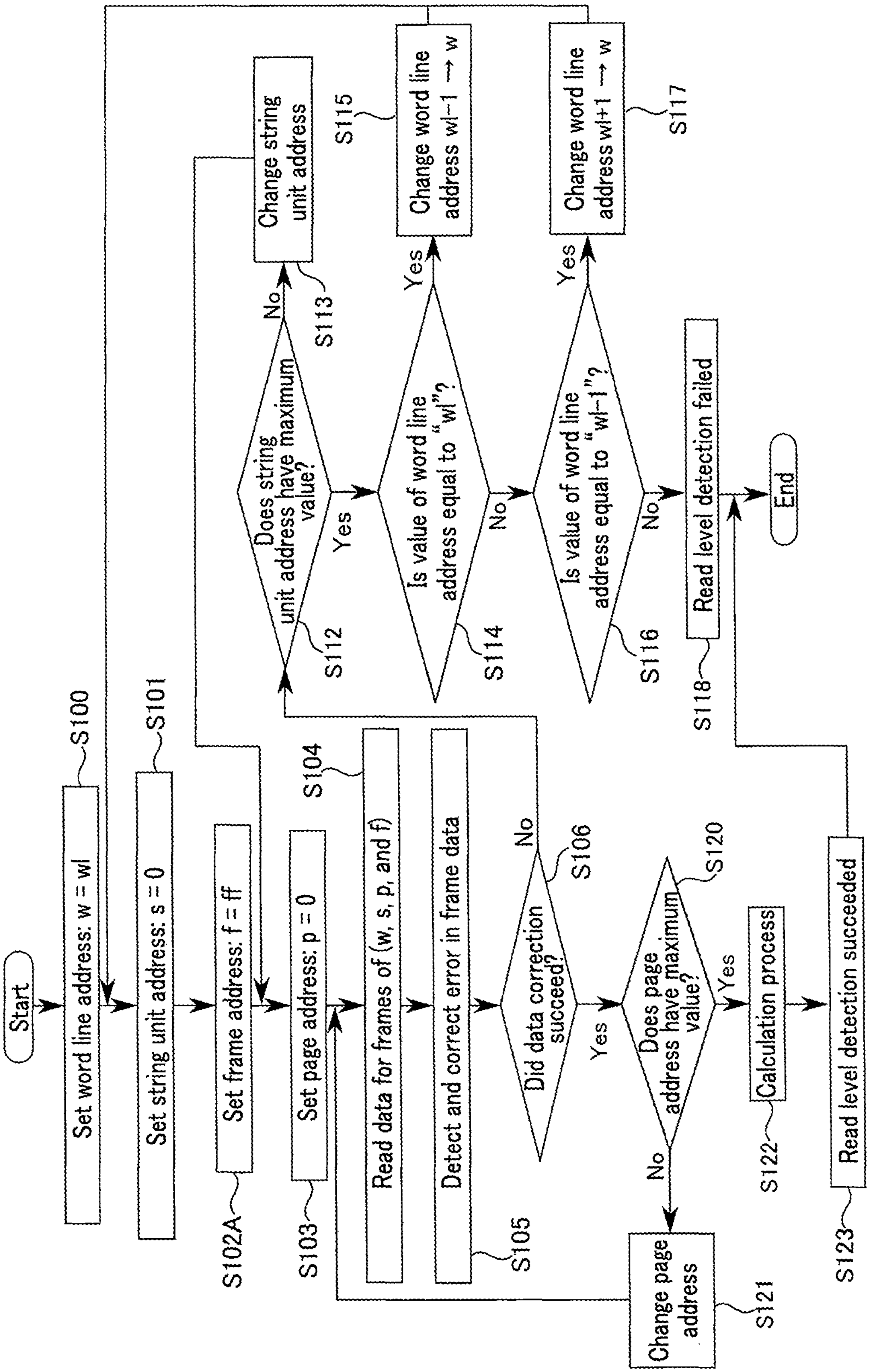
FIG. 31 is a flowchart illustrating an operation example of the memory system according to the third embodiment.

FIG. 31 is a flowchart for describing the read level detection process in the operation example of the memory system of the present embodiment. FIG. 32 is a schematic diagram for describing the operation example of the memory system of the present embodiment.

As illustrated in FIG. 31, a processor 130 sets a word line address value "w" and a string unit address value "s" as in the process flow of FIG. 15 (S100 and S101).

In step S102A, in the memory controller 100, the processor 130 sets a frame address value "f" to an address value "ff" (for example, "0") of the frame unit FU holding the large parity data PDx.

After setting the frame address value "f", the processor 130 sets a page address value "p" as in the example of FIG. 15 (S103).

The processor 130 causes the flash memory 10 to execute a read operation at an address where frames of (wl, 0, 0, ff) are included (S104).

The flash memory 10 sends the read data to the memory controller 100. Accordingly, the memory controller 100 acquires read data (pre-error correction read data) including the large parity data PDx.

Thereafter, in the memory controller 100, the processor 130 executes an ECC process on the frame data to be processed in the read data (S105). In the present embodiment, the error detection process and error correction process by hard bit decoding are performed on the frame data including the large parity data PDx.

The processor 130 determines whether error correction to the frame data to be subjected to the ECC process has succeeded (S106).

[S112 to S118]

Figure 32:
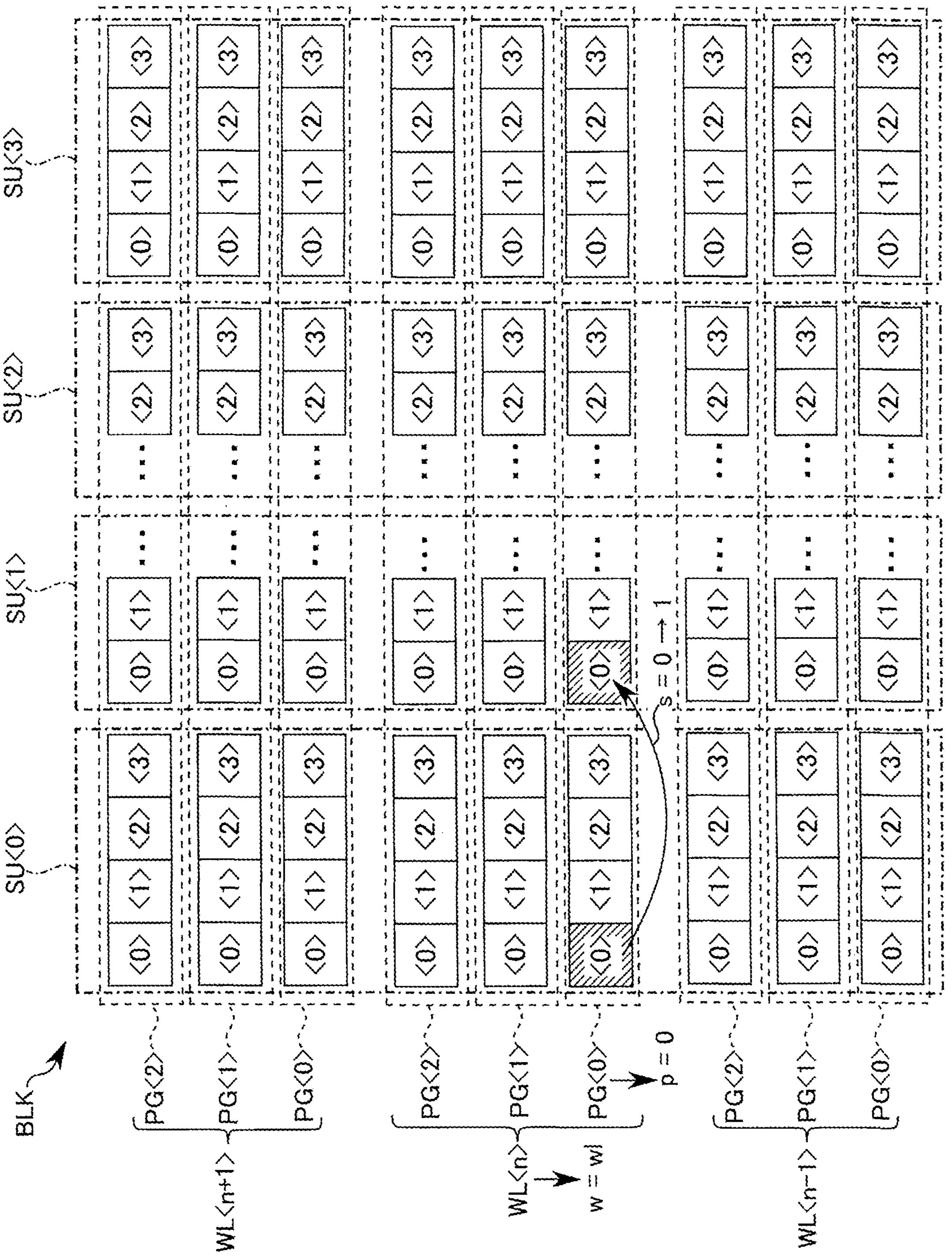
FIG. 32 is a schematic diagram illustrating an operation example of the memory system according to the third embodiment.

As illustrated in FIG. 32, in the present embodiment, when the error correction to the frame (the frame holding the large parity data) with the frame address value "f=ff" belonging to the string unit address value "s=0" has failed (No in S106), the processor 130 determines whether the string unit address value has reached a maximum value "sMAX" of the string unit address value "s" without changing the frame address value "f" (S112).

When the string unit address value "s" has not reached the maximum value "sMAX" (No in S112), the processor 130 changes the string unit address value "s" (S113). For example, the processor 130 increments the value of the string unit address value "s". Accordingly, the string unit SU to be processed for calculation of the read level is changed.

As described above, in the present embodiment, the frame data including the normal parity data is excluded from the processing target. Only the frame data of the frame (FRM0) including the large parity data is selected as the processing target.

After changing the string unit address value "s", the processor 130 sets the page address value to "0" (S103). The processor 130 causes the flash memory 10 to execute a read operation at an address where frames of (wl, 1, 0, ff) are included (S104).

When the string unit address value "s" is the maximum value "sMAX" (Yes in S112), the processor 130 determines whether the word line address value "w" is equal to "wl" (S114).

When the word line address value "w" is equal to "wl" (Yes in S114), the processor 130 sets the word line address value to "wl−1" (S115). Accordingly, the processor 130 sets the data having the word line address value of "wl−1" as the target data of the read level calculation.

Thereafter, the processor 130 executes processing of steps S101, S102A, S103, and S104. When the error correction to the data has failed, the processor 130 executes the processing of steps S112 to S114.

When the word line address value "w" is different from "wl" (No in S114), the processor 130 determines whether the word line address value "w" is equal to the value "w−1" (S116).

When the word line address value "w" is equal to "wl−1" (Yes in S116), the processor 130 sets the word line address value to "wl+1". Accordingly, the processor 130 sets the data having the word line address value of "wl+1" as the target data of the read level calculation.

Thereafter, the processor 130 executes processing of steps S101, S102A, S103, and S104. When the error correction to the data has failed, the processor 130 executes the processing of steps S112 to S114.

When the word line address value "w" is different from "w−1" (No in S116), the processor 130 determines that the detection of the read level has failed (S118).

[S120 to S122]

When the error correction by the ECC process has succeeded, the processor 130 determines whether the page address value "p" has reached the maximum value "pMAX" of the page address, as in the processing of step S120 in FIG. 15 described above.

When the page address value "p" has not reached the maximum value "pMAX" (No in S120), the processor 130 changes the page address value "p". For example, the processor 130 increments the page address value "p". By changing the page address (S121), the processor 130 reads frame data on another page in the same frame unit FU (S104). The processor 130 causes the error check and correction circuit 160 to execute the ECC process using the large parity data for the read frame data on another page.

When the page address value "p" has reached the maximum value "pMAX" (Yes in S120), the processor 130 determines (recognizes) that all the data belonging to the frame unit FU have been prepared.

The processor 130 executes the calculation process in the process flow in FIG. 23 including the above-described processing in FIGS. 10 to 12 on the data of the frame unit FU (S122). Accordingly, the processor 130 acquires the read level to be used to read the data at the selected address.

The processor 130 determines that the detection of the read level has succeeded (S123).

Accordingly, the read level detection process in the present embodiment is completed.

As described above, the memory system of the present embodiment executes the read level detection process using the large parity data.

Accordingly, the memory system of the present embodiment can improve the success rate of the read level detection process.

(4) Fourth Embodiment

A memory system and a control method thereof according to a fourth embodiment will be described with reference to FIG. 33.

Figure 33:
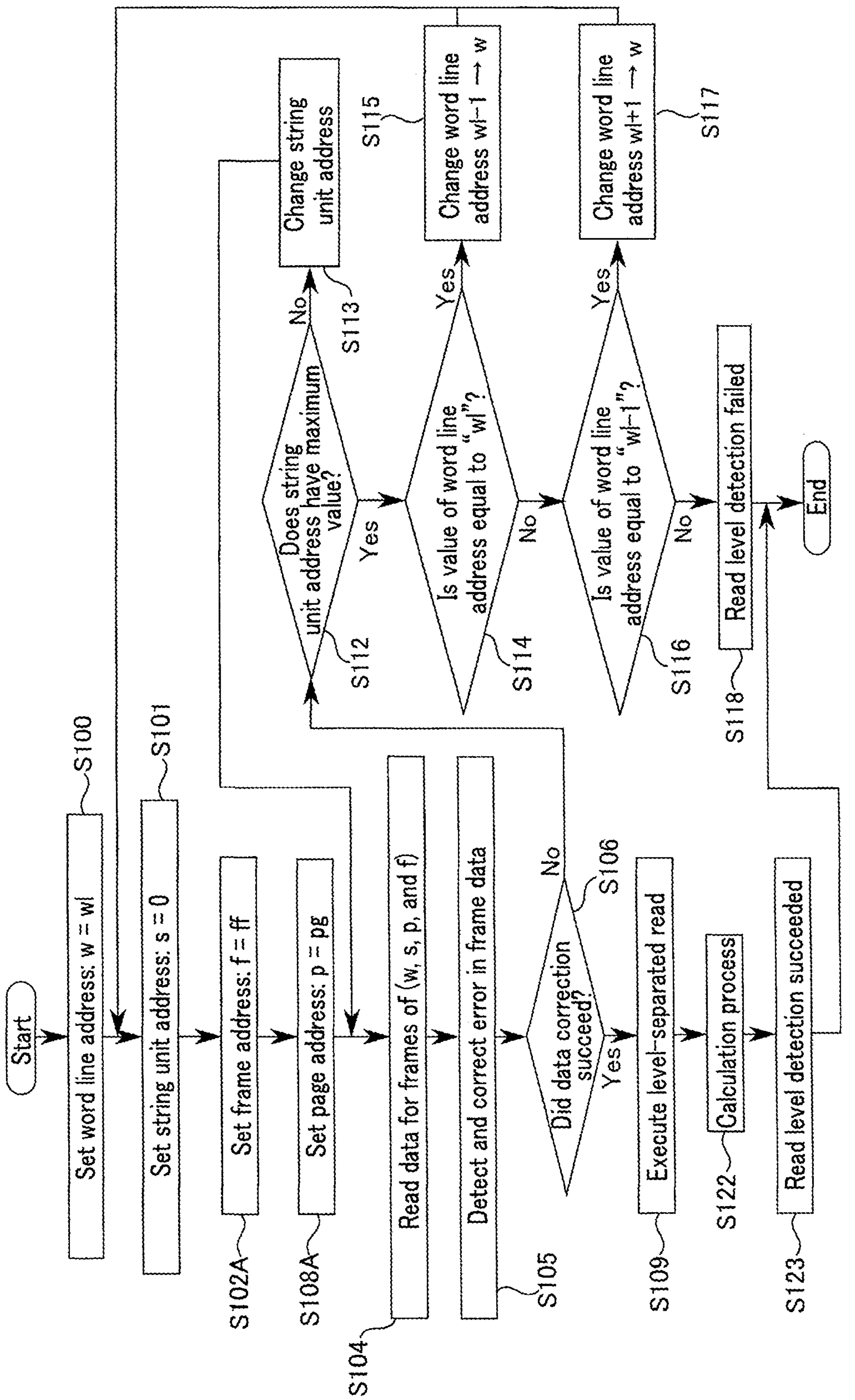
FIG. 33 is a flowchart illustrating an operation example of the memory system according to a fourth embodiment.

FIG. 33 is a flowchart for describing one specific example of the operation of the memory system of the present embodiment.

In the memory system of the present embodiment, as in the third embodiment, data in a frame FRM includes large parity data PDx.

As illustrated in FIG. 33, the memory system of the present embodiment executes a read level detection process on the frame FRM (frame unit FU) including the large parity data PDx based on the processing result of the level division read process (S109) as in the second embodiment.

(Operation Example)

[S100 to S106]

As illustrated in FIG. 33, in a memory controller 100 of the memory system of the present embodiment, a processor 130 sets a word line address value "w" and a string unit address value "s" as in the above-described embodiments (S100 and S101).

The processor 130 sets a frame address value "f" to a value "ff" to which a frame FRMx holding the large parity data PDx belongs (S102A).

The processor 130 sets a page address value "p" to a value "pg" based on the selected address (S103A).

The processor 130 instructs a flash memory 10 to read data including frames with address values of (wl, 0, pg, ff) (S104). The flash memory 10 sends the read data to the memory controller.

The processor 130 causes the error check and correction circuit 160 to detect an error in the read data and correct the error (S105).

The processor 130 determines whether the error correction to the frame FRMx including the large parity data PDx has succeeded (S106).

[S112 to S118]

When the error correction to the frame FRMx has failed (No in S106), the processor 130 determines whether the string unit address value is equal to a maximum value sMAX without changing the frame address value "f" (="ff") as in step S112 in FIG. 31 described above (S112).

When the string unit address value "s" is not equal to the maximum value "sMAX" (No in S113), the processor 130 changes (for example, increments) the string unit address value "s" (S113).

Thereby, the processor 130 executes the processing of steps S104 to S106 on the data corresponding to the frame address value "ff" belonging to the changed string unit value "s".

When No in step S106, the processor 130 executes the processing of steps S112 and S113.

When the changed string unit address value "s" is equal to the maximum value "sMAX" (Yes in S112), the processor 130 determines whether the word line address value "w" is equal to the value "wl" (S114).

When the word line address value "w" is equal to the value "wl" (Yes in S114), the processor 130 changes the word line address value "w" to the value "wl−1" (S115).

Thereafter, the processor 130 executes the processing of steps S101 to S106 as in the example of FIG. 31. When No in step S106, the processor 130 executes the processing of steps S112 to S114.

When the word line address value "w" is different from "wl", the processor 130 determines whether the word line address value "w" is equal to the value "wl−1" (S116).

When the word line address value "w" is equal to the value "wl−1" (Yes in S116), the processor 130 changes the word line address value "w" to the value "wl+1" (S117).

Thereafter, the processor 130 executes the processing of steps S101 to S106 as in the example of FIG. 31. When No in step S106, the processor 130 executes the processing of steps S112 to S116.

When the word line address value "w" is not equal to "wl−1", the processor 130 determines that the read level detection process has failed.

[S109 to S122]

When the error correction to the frame FRMx including the large parity data PDx has succeeded, the processor 130 instructs the flash memory 10 to execute the level-separated reading including the single-state read process (S109).

Accordingly, the flash memory 10 executes the single-state read process using the read level corresponding to the page address value "pg". The flash memory 10 sends single-state read data SSR corresponding to the page address value "pg" to the memory controller 100. The memory controller 100 acquires the single-state read data SSR.

In the memory controller 100, the processor 130 causes the separated data generation circuit 189 of the voltage correction circuit 180 to generate the pre-error correction separated data and the post-error correction separated data. The separated data generation circuit 189 executes the processing based on any of FIGS. 27 to 29 along the process flow of FIG. 26 according to the page address value "pg".

The processor 130 executes a calculation process (calculation of shift amount of read level) for detection of the read level, using the generated pre-error correction separated data and post-error correction separated data (S122).

In this case, the processor 130 determines that the detection process of the read level has succeeded (S123).

As described above, the memory system of the present embodiment can shorten the period of the read operation for the read level detection process by the level-separated read process including the single-state read process.

The memory system of the present embodiment can improve the success probability of error correction by detecting and correcting an error using a frame including large parity data.

Therefore, the memory system of the present embodiment can improve the characteristics of the memory system.

(5) Fifth Embodiment

A memory system and a control method thereof according to a fifth embodiment will be described with reference to FIGS. 34 and 35.

(5a) Configuration Example

Figure 34:
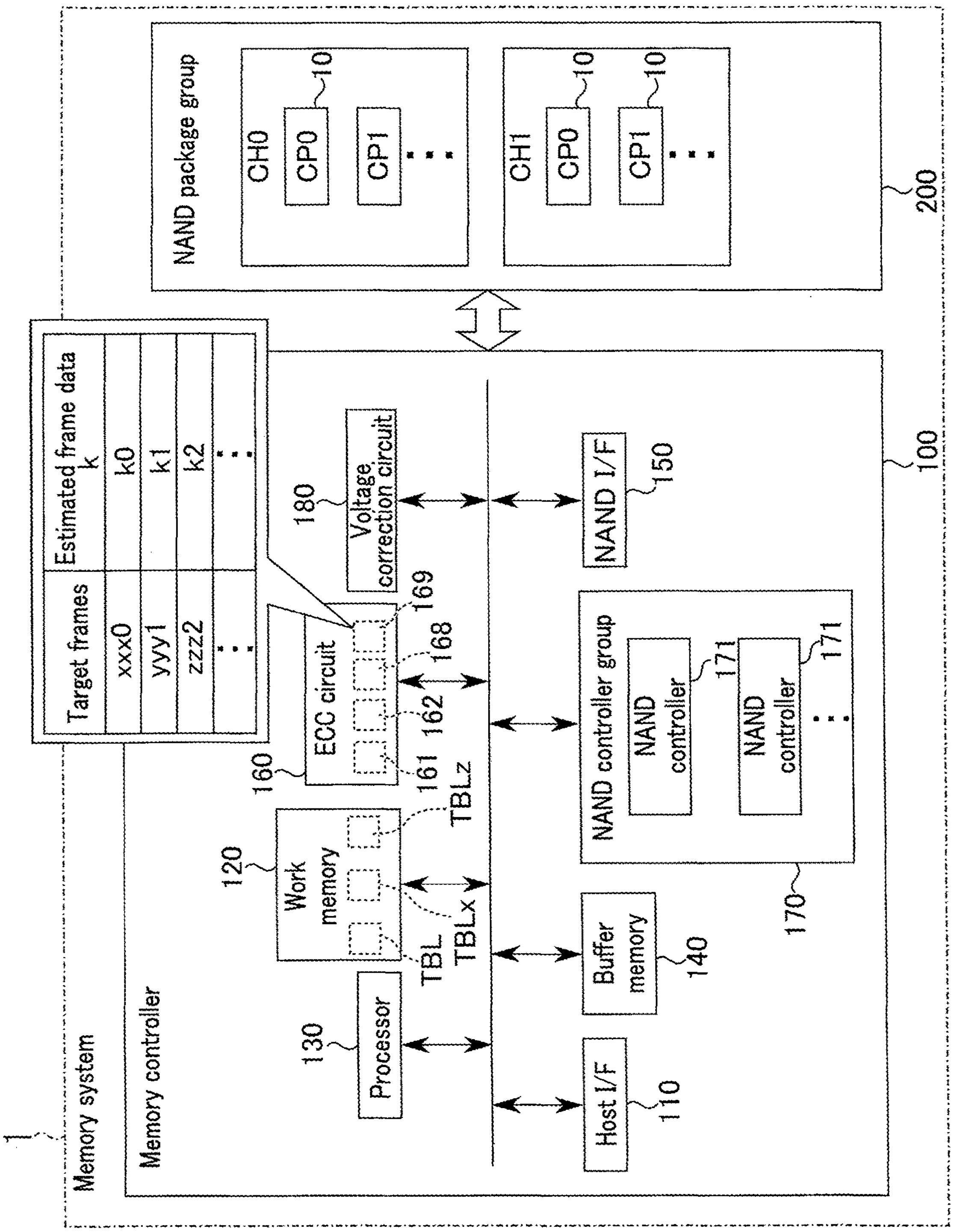
FIG. 34 is a schematic diagram illustrating a configuration example of a memory system according to a fifth embodiment.

FIG. 34 is a schematic diagram for describing the memory system of the present embodiment.

As illustrated in FIG. 34, in the memory system 1 of the present embodiment, an error check and correction circuit 160 may hold data generated in the process of an ECC process on read data to be subjected to the ECC process as a history of the executed read operation and ECC process.

As described above, at the time of data writing, the data (for example, user data) is encoded by an encoding circuit 161. Accordingly, parity data PD corresponding to the user data UD is generated.

At the time of data reading, a processor 130 sends read data (pre-error correction read data) from a flash memory to a decoding circuit 162 via an internal bus in the memory controller 100. As described in the above embodiments, the decoding circuit 162 decodes the pre-error correction frame data FD in the read data by soft bit decoding based on the parity data PD of each frame data FD. When the soft bit decoding has succeeded, the post-error correction frame data as the user data UD is obtained.

A voltage correction circuit 180 executes a calculation process using a combination of a certain bit of the pre-error correction frame data and a corresponding bit of the post-error correction frame data.

For example, in the encoding and decoding process, the result of the decoding process on data to be decoded (for example, data of a certain frame on a certain page) and data generated in the process of the ECC process related to the data to be decoded are held in a memory area (memory circuit) 169 in an error check and correction circuit 160.

When the soft bit decoding by the above process has failed, data including a soft bit error is generated. The data including a soft bit error is held in the memory area 169. In this case, the memory system 1 of the present embodiment detects a read level used for data reading at an address at which the read error (here, the soft bit error) has occurred, based on data that may include a read error in the error check and correction circuit 160.

For example, when the soft bit decoding has failed, the error check and correction circuit 160 executes soft bit decoding on frame data (xxx0, yyy1, zzz2, . . . in FIG. 34) of a certain frame. The error check and correction circuit 160 acquires estimated frame data (estimated data) k (k0, k1, k2, . . . in FIG. 34) obtained during the decoding process of the soft bit decoding separately from the final decoding result of the soft bit decoding. The estimated frame data can be data in which an error remains or data in which there is a possibility that erroneous correction has been performed. When the memory cell is a TLC, estimated frame data k (kU, kM, kL) related to upper, middle, and lower pages is generated.

For example, the error check and correction circuit 160 includes an estimated data generation circuit 168 for generating estimated frame data.

An error that cannot be corrected and/or an error due to erroneous correction in the estimated frame data is referred to as a residual error. In a plurality of bits included in the estimated frame data, a bit in which a residual error has occurred is referred to as a residual error bit.

The voltage correction circuit 180 executes a calculation process for detecting a read level based on a combination of values that can be taken by pre-error correction frame data SR (SRU, SRM, SRL) and the estimated frame data k (kU, kM, kL).

In the memory system of the present embodiment, the voltage correction circuit 180 counts the number of occurrences of combinations ((1,1), (1,0), (0, 1), and (0,0)) that can be taken by a certain bit of the pre-error correction frame data and a certain bit of the estimated frame data.

The voltage correction circuit 180 calculates an evaluation index based on a comparison between the count numbers of a combination to be processed (for example, (1, 0) and (0, 1)) among a plurality of combinations in the pre-error correction frame data SR and the estimated frame data k.

The voltage correction circuit 180 calculates a shift amount of the read level based on the calculated evaluation index.

For example, when a certain bit of the pre-error correction frame data and a certain bit of the estimated frame data make a matching combination (for example, when the combination is (1, 1) or (0, 0)), the processor 130 can treat the estimated frame data in the matching combination as data written in the memory cell, in the same manner as the post-error correction frame data.

As described above, in the memory system of the present embodiment, the memory controller 100 detects the read level (calculates the shift amount of the read level) based on the data (estimated frame data) including the residual error.

In the memory system of the present embodiment, the memory controller 100 may hold, in a work memory 120, a table TBLx that is generated based on the number of residual error bits in the estimated frame data (hereinafter, referred to as the number of residual error bits) and indicates the relationship between the evaluation index for calculation of a shift amount Δ and the shift amount Δ of the read level. The table TBLx may be stored in a flash memory 10 (NAND package group 200).

In the present embodiment, a table indicating the relationship between the number of residual error bits and the shift amount Δ of the read level may be held in the work memory 120 or the flash memory 10.

(5b) Operation Example

An operation example of the memory system of the present embodiment will be described with reference to FIG. 35.

FIG. 35 is a flowchart for describing the operation example of the memory system of the present embodiment.

[S70]

For example, when soft bit decoding on certain frame data has failed, as shown in FIG. 35, in the present embodiment, in the memory controller 100, the processor 130 instructs the flash memory 10 to read data of all pages (for example, data of three pages) belonging to the selected string unit SU in the selected word line WL.

The flash memory 10 sends the data of all pages belonging to the selected string unit SU in the selected word line WL to the memory controller 100.

The memory controller 100 receives the read data from the flash memory 10. In the memory controller 100, the processor 130 causes the work memory 120, the error check and correction circuit 160, and/or the voltage correction circuit 180 to hold the received read data as pre-error correction read data.

[S71]

In the memory controller 100, the processor 130 causes the error check and correction circuit 160 to execute the ECC process on the pre-error correction read data SR in units of frame data.

The error check and correction circuit 160 executes the ECC process (for example, soft bit decoding and/or hard bit decoding) on a plurality of pieces of page data belonging to a certain frame unit of the pre-error correction read data.

[S72]

The processor 130 determines whether page data of a soft bit error exists in the plurality of pieces of page data of the selected frame unit FU.

[S73]

When the page data of a soft bit error does not exist in the frame unit FU (No in S302), the processor 130 causes the voltage correction circuit 180 to execute the above-described read level detection process (for example, the process flows of FIGS. 15 and 23) on a certain frame unit of a certain string unit in units of frame data.

[S74]

When the page data of a soft bit error exists in the frame unit FU (Yes in S302), the processor 130 causes the error check and correction circuit 160 to generate estimated frame data k (kU, kM, and kL) based on the data in the error check and correction circuit 160.

For example, when a combination of a certain bit of the pre-error correction frame data and a certain bit of the estimated frame data is (1, 1) or (0, 0), the processor 130 can treat a value of the combination in which the bits match, as data written to the memory cell.

The processor 130 causes the voltage correction circuit 180 to execute a calculation process using the estimated frame data k.

The voltage correction circuit 180 calculates the evaluation index based on a comparison between the count numbers of the combinations of (1, 0) and (0, 1) in the pre-error correction frame data SR and the estimated frame data k. The voltage correction circuit 180 calculates a more suitable read level for reading data at the selected address based on the calculated evaluation index.

Accordingly, in the memory system of the present embodiment, the read level is detected.

When the detection of the read level in FIG. 14 has failed (No in S6 or No in S9), the detection of the read level using the estimated frame data k of the present embodiment may be executed before execution of the retry sequence (S19).

The detection of the read level using the estimated frame data of the present embodiment may be executed when the detection of the read level in FIG. 15 has failed (S118).

When the calculation process of the read level is executed using the estimated frame data as in the present embodiment, the memory system of the present embodiment can reduce the operations of reading additional data from the flash memory and correcting an error in the additional read data.

Therefore, the memory system of the present embodiment can shorten the period for data reading.

As described above, the memory system of the present embodiment can improve the characteristics of the memory system as with the memory systems of the above-described embodiments.

(6) Sixth Embodiment

A memory system according to a sixth embodiment will be described with reference to FIG. 36.

The memory system of the present embodiment executes a read level detection process (a calculation process of a shift amount of a read level) at the time of executing various processes involving data reading different from host read, such as a patrol operation.

Figure 36:
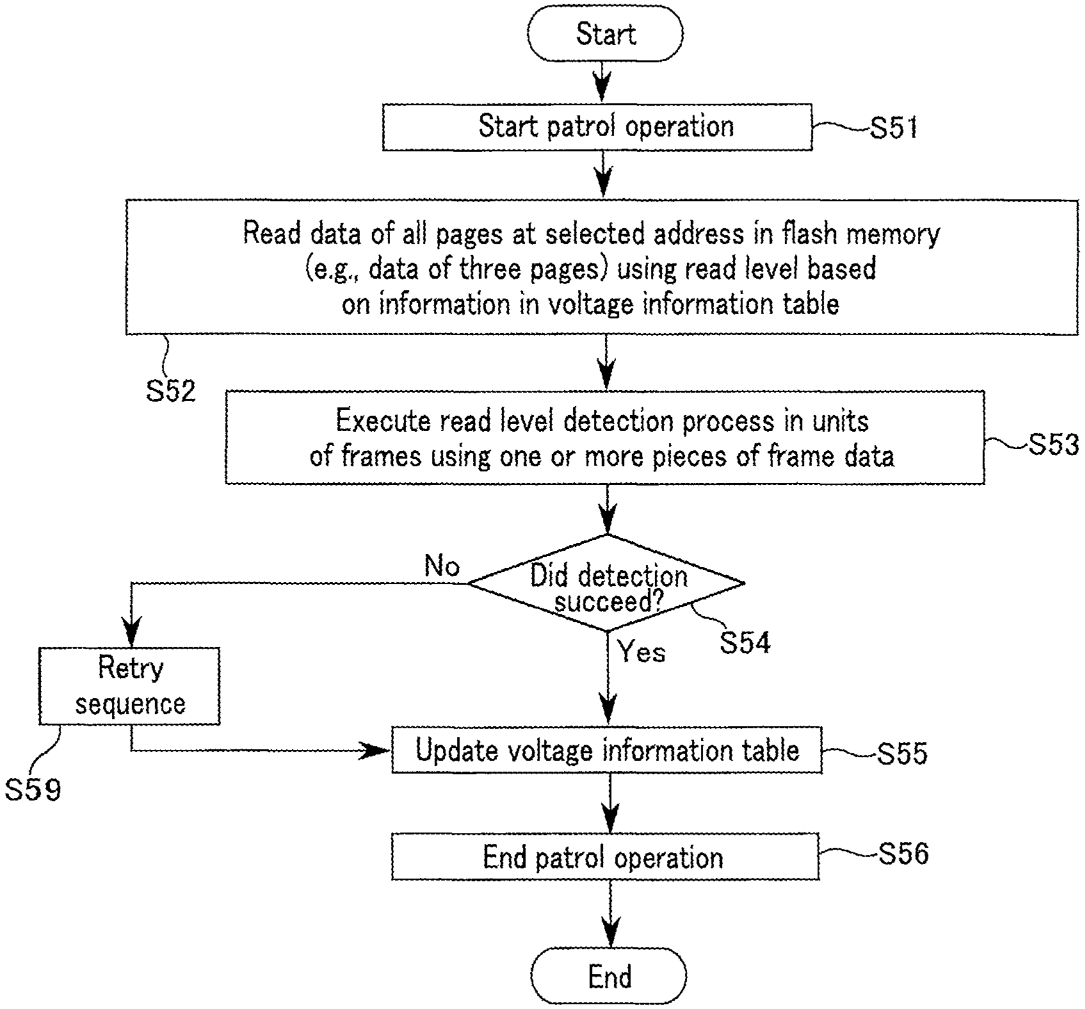
FIG. 36 is a flowchart illustrating an operation example of the memory system according to a sixth embodiment.

FIG. 36 is a flowchart for describing the operation example of the memory system of the present embodiment.

FIG. 36 illustrates a read level detection process in data reading during a patrol operation (hereinafter, referred to as patrol read process).

The patrol read process is, for example, an internal process of a memory system 1 in which a memory controller 100 periodically patrols each cell unit CU in a NAND package group 200 to perform a data read process in order to grasp the fluctuation state of a threshold distribution of the written data.

As illustrated in FIG. 36, the memory system 1 of the present embodiment executes the patrol operation at a certain timing.

[S51]

The memory controller 100 starts the patrol operation without an instruction (host command) from the host device.

[S52]

The memory controller 100 orders a flash memory 10 to perform the patrol read process. The memory controller 100 sends a patrol read command and a selected address of a patrol target to the flash memory 10.

In the patrol read process, the memory system of the present embodiment executes a read operation on all pages allocated to one word line WL.

For example, when the flash memory 10 includes a memory cell that stores 3-bit data, in the memory controller 100, a processor 130 instructs the flash memory 10 to read data of a lower page, a middle page, and an upper page belonging to the selected word line to be patrolled.

The flash memory 10 reads the data of the lower page, the middle page, and the upper page belonging to the selected word line. The flash memory 10 sends the read data of all the pages to the memory controller 100. Accordingly, in the memory controller 100, the processor 130 acquires read data on all the pages belonging to the selected address of the patrol target (here, pre-error correction read data of the three pages).

[S53]

The memory system of the present embodiment executes a read level detection process after the patrol read process.

The processor 130 causes a voltage correction circuit 18 to execute the read level detection process in a process flow similar to those of the above-described embodiments (for example, the process flow of FIG. 15).

In the present embodiment, the processor 130 extracts frame data to be processed for read level detection from each of the three pages read by the patrol read.

An error check and correction circuit 160 executes an ECC process on the extracted frame data. Accordingly, the error check and correction circuit 160 generates post-error correction lower frame data EXPL, post-error correction middle frame data EXPM, and post-error correction upper frame data EXPU.

A voltage correction circuit 180 calculates the shift amount of the read level using the pre-error correction frame data SR and the post-error correction frame data EXP on each page in the frame unit to be processed, based on any one of the read level detection processes of the above-described embodiments.

For example, the voltage correction circuit 180 calculates the shift amounts of read levels VAR and VER based on processes using pre-error correction lower frame data SRL and post-error correction lower frame data EXPL in the frame unit to be processed.

The voltage correction circuit 180 calculates the shift amounts of read levels VBR, VDR, and VFR based on processes using pre-error correction middle frame data SRM and post-error correction middle frame data EXPM in the frame unit to be processed.

The voltage correction circuit 180 calculates the shift amounts of read levels VCR and VGR based on processes using pre-error correction upper frame data SRU and post-error correction upper frame data EXPU in the frame unit FU to be processed.

Accordingly, the shift amount of each read level can be obtained at the selected address of the patrol operation target.

[S54]

The processor 130 determines whether a more suitable read level has been detected by the read level detection process.

[S55]

When the detection of the read level has succeeded (Yes in S54), the processor 130 updates the value indicating the shift amount of the read level in a voltage information table TBL to a value obtained by the read level calculation process by the calculation process in units of frames.

[S56]

After updating the voltage information table TBL, the processor 130 ends the patrol operation.

[S59]

When the detection of the read level has failed (No in S54), the processor 130 executes a retry sequence.

After the retry sequence, the processor 130 updates the information in the voltage information table TBL based on the calculation result of the read level by the retry sequence.

Accordingly, the processor 130 ends the patrol operation (S56).

As described above, the memory system of the present embodiment executes the calculation process of the read level in units of frame units during the patrol operation.

Also in this case, the memory system of the present embodiment can improve the characteristics of the memory system as in the above-described embodiments.

(7) Modification

A modification of a memory system of an embodiment will be described with reference to FIG. 37.

FIG. 37 is a schematic diagram illustrating a modification of memory space in the memory system of the present embodiment.

As in the above-described example (for example, FIG. 8), when a certain size of unused area is included in the memory space, the unused area may be added to a parity data area R2*x* of a frame FRMx<0> that holds large parity data in order to extend the size of the parity data area.

In this case, as illustrated in FIG. 37, the size of a user data area A1 of a frame FRMx holding large parity data PDx can be set to the same size as the size of the user data areas A1 of the other frames FRM.

In the present modification, the sizes of the frames FRM including the large parity data PDx are larger than the sizes of the other frames.

The memory system of the present modification can improve the characteristics of the memory system as with the memory systems of the above-described embodiments.

(8) Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory device; and
a controller configured to execute an error correction process on first data read from a first area at a first address of the non-volatile memory device and determine a read level used for reading data at the first address according to a result of the correction process, wherein
the controller is configured to
execute the correction process on first frame data of the first data using an error correction circuit, and
when the correction process on the first frame data has failed, determine the read level based on estimated data in the error correction circuit.

2. The memory system according to claim 1, wherein
the controller is configured to
generate second data based on the estimated data, and
determine the read level based on a result of comparison between the first frame data and the second data.

3. The memory system according to claim 1, wherein
the non-volatile memory device is a NAND flash memory.

4. The memory system according to claim 1, wherein
the estimated data includes error bits.

5. The memory system according to claim 4, wherein the controller stores information indicating a relationship between a shift amount of the read level and an index for calculation of the shift amount based on a number of the error bits.

6. The memory system according to claim 1, wherein
the first frame data includes first parity data and first storage data.

7. The memory system according to claim 1, wherein
the controller is configured to, when the correction process on the first frame data has passed, determine the read level based on the first frame data.

8. The memory system according to claim 7, wherein
the controller is configured to
among a plurality of memory cells in a storage area of the first frame data, count a first number of memory cells that have changed from a first threshold voltage lower than the read level to a second threshold voltage equal to or higher than the read level and a second number of memory cells that have changed from the second threshold voltage to the first threshold voltage,
calculate a ratio between the first number and the second number, and
calculate a shift amount of the read level based on the ratio.

9. The memory system according to claim 7, wherein
the non-volatile memory device includes a plurality of word lines to which a plurality of memory cells is connected,
a plurality of pages are allocated to each of the word lines, and
the controller is configured to
read the first data from a selected page among the pages using a first level and a second level more than the first level,
read a third data from the selected page using a third level more than the first level and less than the second level,
generate a fourth data by the correction process on the first data, and
determine the read level based on frame data of the first data, frame data of the third data, and frame data of the fourth data.

10. The memory system according to claim 7, wherein
the non-volatile memory device includes a plurality of word lines to which a plurality of memory cells is connected,
a first page, a second page, and a third page are allocated to each of the word lines,
each of the memory cells has any one threshold voltage state of a first threshold voltage state, a second threshold voltage state, a third threshold voltage state, a fourth threshold voltage state, a fifth threshold voltage state, a sixth threshold voltage state, a seventh threshold voltage state, and an eighth threshold voltage state in ascending order of voltages,
when the first data belongs to the first page, the controller is configured to
read the first data using a fourth level between the first threshold voltage state and the second threshold voltage state and a fifth level between the fifth threshold voltage state and the sixth threshold voltage state,
read fifth data using a sixth level between the third threshold voltage state and the fourth threshold voltage state, and
determine the read level using the first frame data before the correction process, the first frame data after the correction process, and the fifth data.

11. The memory system according to claim 10, wherein
when the first data belongs to the second page, the controller reads the first data using a seventh level between the second threshold voltage state and the third threshold voltage state, an eighth level between the fourth threshold voltage state and the fifth threshold voltage state, and a ninth level between the sixth threshold voltage state and the seventh threshold voltage state, and
the controller is configured to
read sixth data using the fifth level,
read seventh data using the sixth level, and
determine the read level using the first frame data before the correction process, the first frame data after the correction process, the sixth data, and the seventh data.

12. The memory system according to claim 11, wherein when the first data belongs to the third page, the controller reads the first data using the sixth level and a tenth level between the seventh threshold voltage state and the eighth threshold voltage state, and the controller is configured to read eighth data using the fifth level, and determine the read level using the first frame data before the correction process, the first frame data after the correction process, and the eighth data.

* * * * *